(12) United States Patent
Kono et al.

(10) Patent No.: US 9,222,813 B2
(45) Date of Patent: Dec. 29, 2015

(54) FLOW SENSOR AND MANUFACTURING METHOD OF THE SAME AND FLOW SENSOR MODULE AND MANUFACTURING METHOD OF THE SAME

(71) Applicant: Hitachi Automotive Systems, Ltd., Hitachinaka-shi, Ibaraki (JP)

(72) Inventors: Tsutomu Kono, Kawasaki (JP); Keiji Hanzawa, Mito (JP); Takeshi Morino, Hitachinaka (JP); Yuki Okamoto, Hitachinaka (JP); Noboru Tokuyasu, Hitachinaka (JP); Shinobu Tashiro, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/143,553

(22) Filed: Dec. 30, 2013

(65) Prior Publication Data
US 2014/0109691 A1    Apr. 24, 2014

Related U.S. Application Data

(63) Continuation of application No. 13/393,155, filed as application No. PCT/JP2011/070900 on Sep. 13, 2011, now Pat. No. 8,640,538.

(30) Foreign Application Priority Data

Oct. 13, 2010    (WO) .................. PCT/JP2010/067946

(51) Int. Cl.
*G01F 1/38*    (2006.01)
*G01F 1/684*    (2006.01)
(Continued)

(52) U.S. Cl.
CPC ......... *G01F 1/383* (2013.01); *G01F 1/34* (2013.01); *G01F 1/6845* (2013.01); *G01F 1/692* (2013.01); *G01F 1/698* (2013.01); *G01F 5/00* (2013.01)

(58) Field of Classification Search
CPC ........................................................ G01F 1/38
USPC ...................................................... 73/861.47
See application file for complete search history.

(56) References Cited

U.S. PATENT DOCUMENTS

| 5,207,102 A | 5/1993 | Takahashi et al. |
| 5,396,795 A | 3/1995 | Araki |

(Continued)

FOREIGN PATENT DOCUMENTS

| CN | 1444018 A | 9/2003 |
| JP | 1-301120 A | 12/1989 |

(Continued)

OTHER PUBLICATIONS

PCT/ISA/237 Form (Five (5) pages).

(Continued)

*Primary Examiner* — Jewel V Thompson
(74) *Attorney, Agent, or Firm* — Crowell & Moring LLP

(57) ABSTRACT

Technique of suppressing performance variations for each flow sensor is provided. In a flow sensor FS1 of the present invention, a part of a semiconductor chip CHP1 is configured to be covered with resin (MR) in a state in which a flow sensing unit (FDU) formed on a semiconductor chip CHP1 is exposed. Since an upper surface SUR(MR) of the resin (MR) is higher than an upper surface SUR(CHP) of the semiconductor chip (CHP1) by sealing the resin (MR) on a part of the upper surface SUR(CHP) of the semiconductor chip CHP1 in a direction parallel to an air flow direction, the air flow around the flow sensing unit (FDU) can be stabilized. Further, interface peeling between the semiconductor chip (CHP1) and the resin (MR) can be prevented by an increase of contact area between the semiconductor chip (CHP1) and the resin (MR).

8 Claims, 51 Drawing Sheets

(51) Int. Cl.
  *G01F 1/692* (2006.01)
  *G01F 1/698* (2006.01)
  *G01F 5/00* (2006.01)
  *G01F 1/34* (2006.01)

(56) References Cited

U.S. PATENT DOCUMENTS

| | | | |
|---|---|---|---|
| 6,640,650 | B2 | 11/2003 | Matsuzawa et al. |
| 6,779,393 | B1 | 8/2004 | Muller et al. |
| 7,560,811 | B2 | 7/2009 | Sakakibara et al. |
| 8,640,538 | B2 * | 2/2014 | Kono et al. .............. 73/204.26 |
| 2004/0244479 | A1 | 12/2004 | Matsumoto et al. |
| 2006/0086188 | A1 | 4/2006 | Avramescu et al. |
| 2007/0210392 | A1 | 9/2007 | Sakakibara et al. |
| 2008/0148842 | A1 | 6/2008 | Oda |
| 2009/0096041 | A1 | 4/2009 | Sakakibara et al. |
| 2009/0230487 | A1 | 9/2009 | Saitoh et al. |

FOREIGN PATENT DOCUMENTS

| | | |
|---|---|---|
| JP | 7-174599 A | 7/1995 |
| JP | 10-77874 A | 3/1998 |
| JP | 2000-31309 A | 1/2000 |
| JP | 2001-505314 A | 4/2001 |
| JP | 2003-240614 A | 8/2003 |
| JP | 2003-254805 A | 9/2003 |
| JP | 2004-074713 A | 3/2004 |
| JP | 2004-361271 A | 12/2004 |
| JP | 2006-250736 A | 9/2006 |
| JP | 2008-20193 A | 1/2008 |
| JP | 2008-157742 A | 7/2008 |
| JP | 2008-175780 A | 7/2008 |
| JP | 2009-25098 A | 2/2009 |
| JP | 2009-31067 A | 2/2009 |
| JP | 2009-36639 A2 | 2/2009 |
| JP | 2009-58230 A | 3/2009 |
| JP | 2010-112804 A | 5/2010 |
| JP | 5456816 B2 | 4/2014 |

OTHER PUBLICATIONS

Abstract of JP 1-301120 A dated Dec. 5, 1989 with assignee Mitsubishi Electric Corp (One (1) page).
International Search Report dated Dec. 13, 2011 (Five (5) pages).
Japanese Office Action dated Feb. 5, 2013 including English-language translation (six (6) pages).
Chinese Office Action dated Apr. 9, 2013 (six (6) pages).
Japanese Office Action dated Sep. 24, 2014 (three (3) pages).
Japanese Office Action dated May 7, 2015, with English translation (Five (5) pages).

* cited by examiner

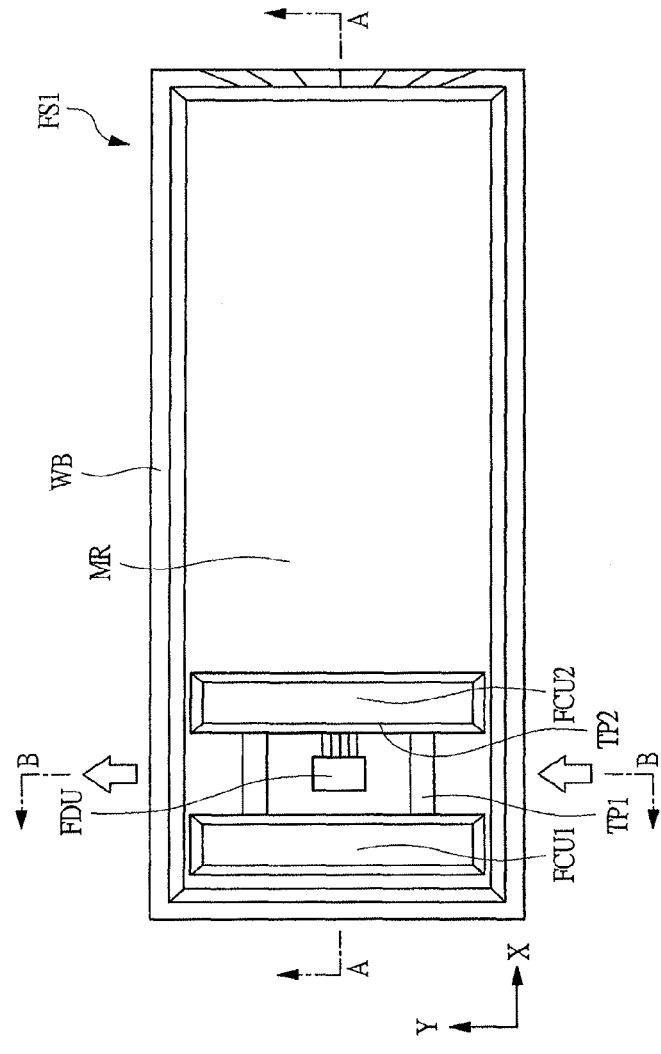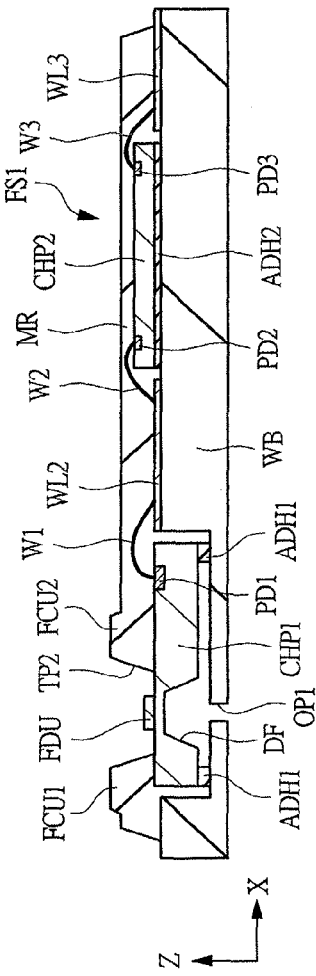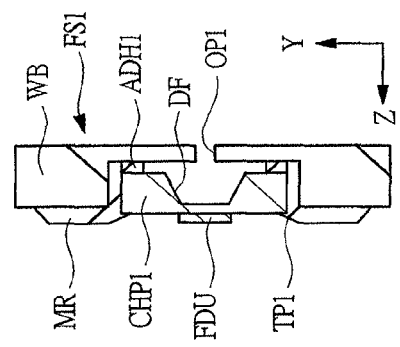

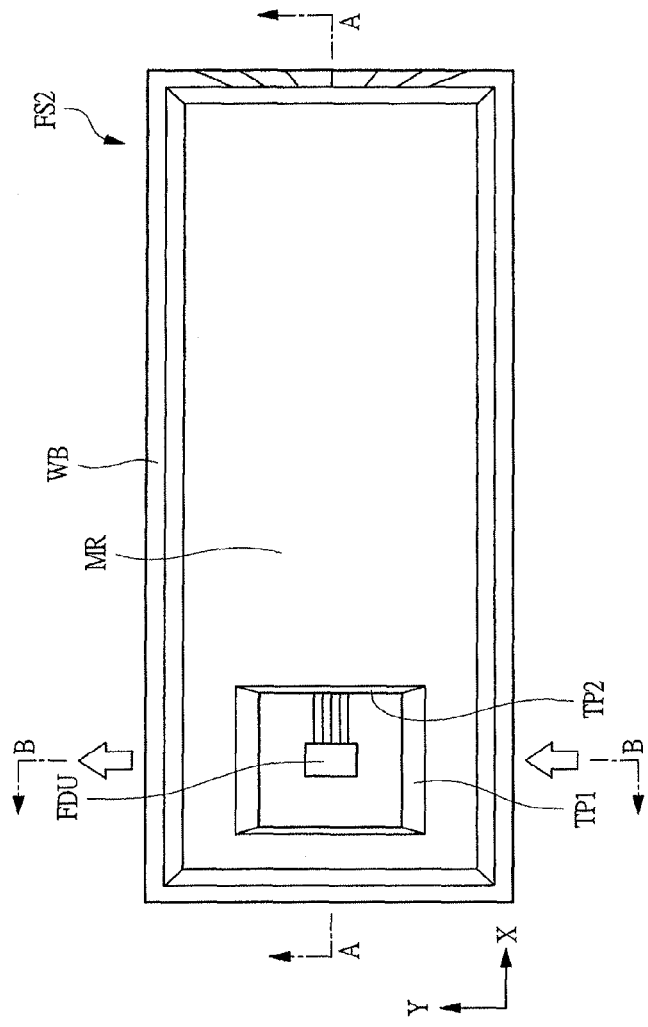
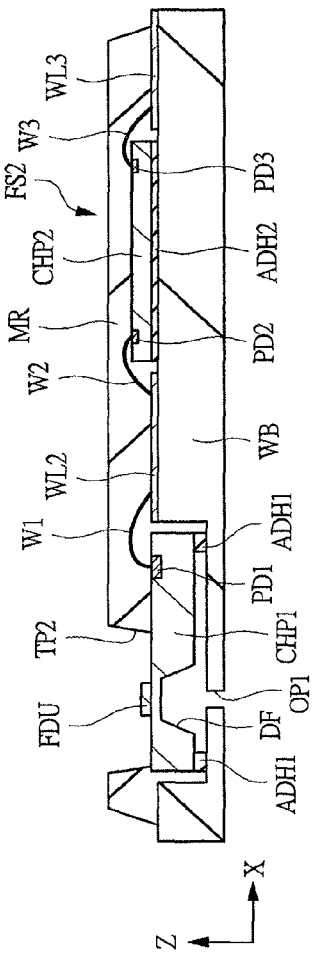
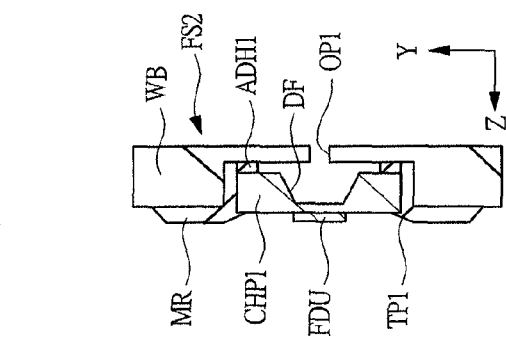

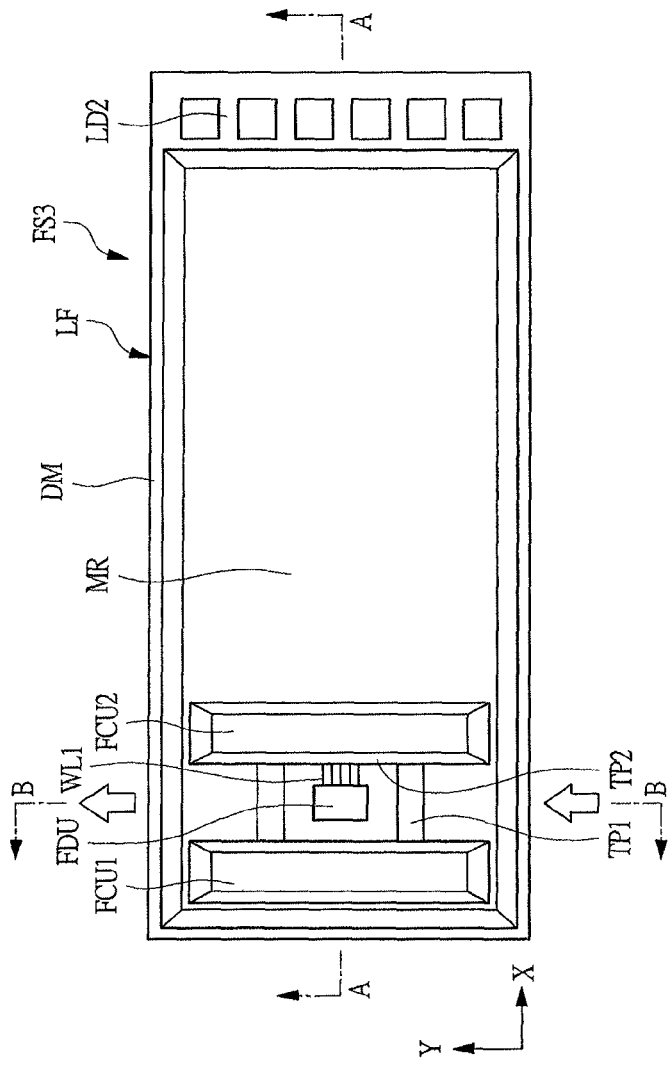
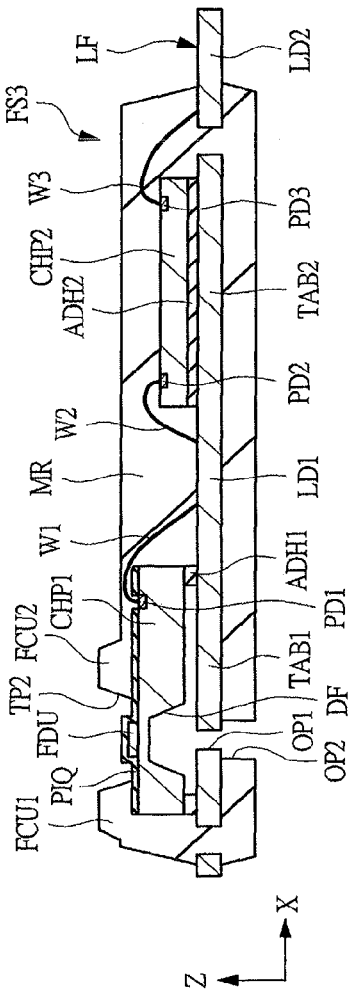
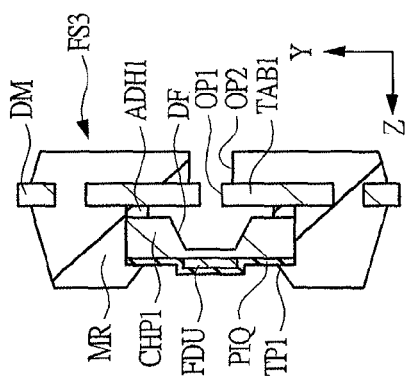

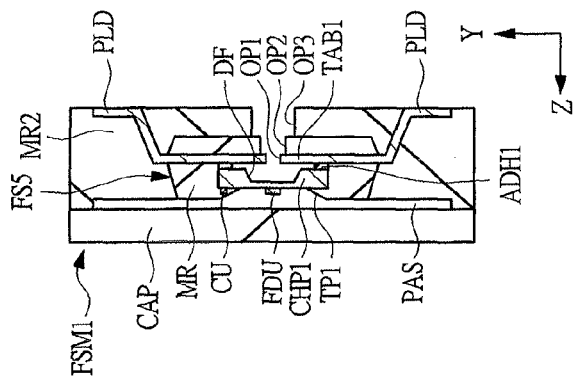
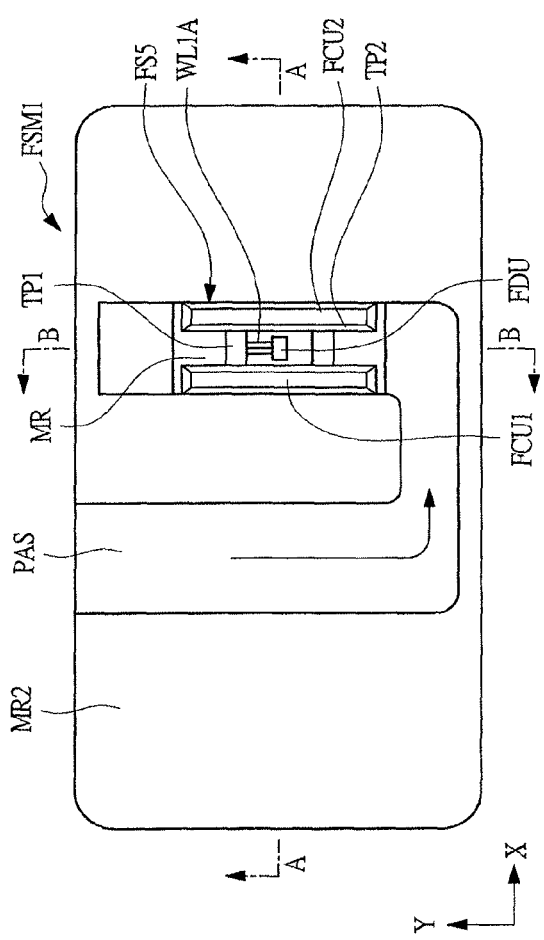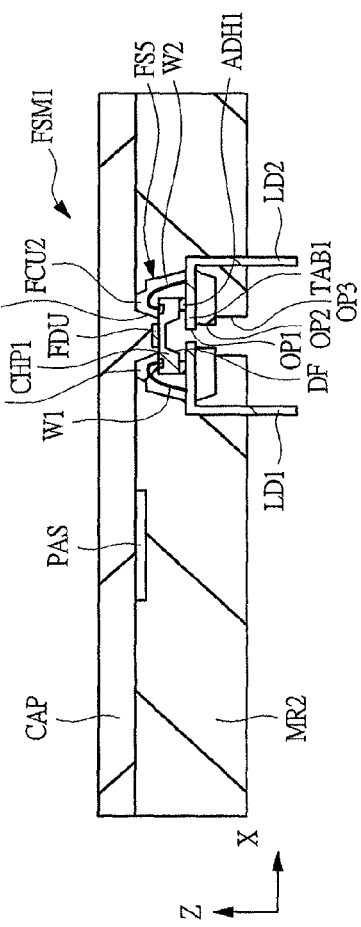

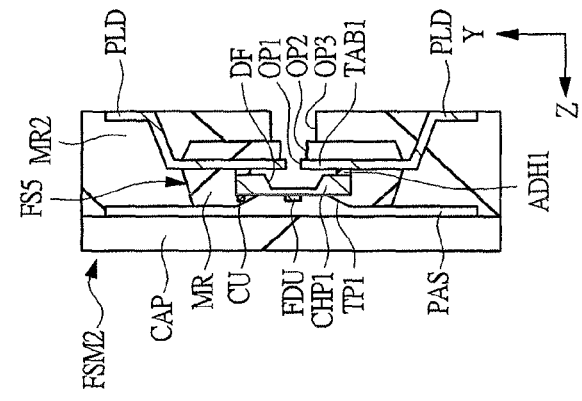
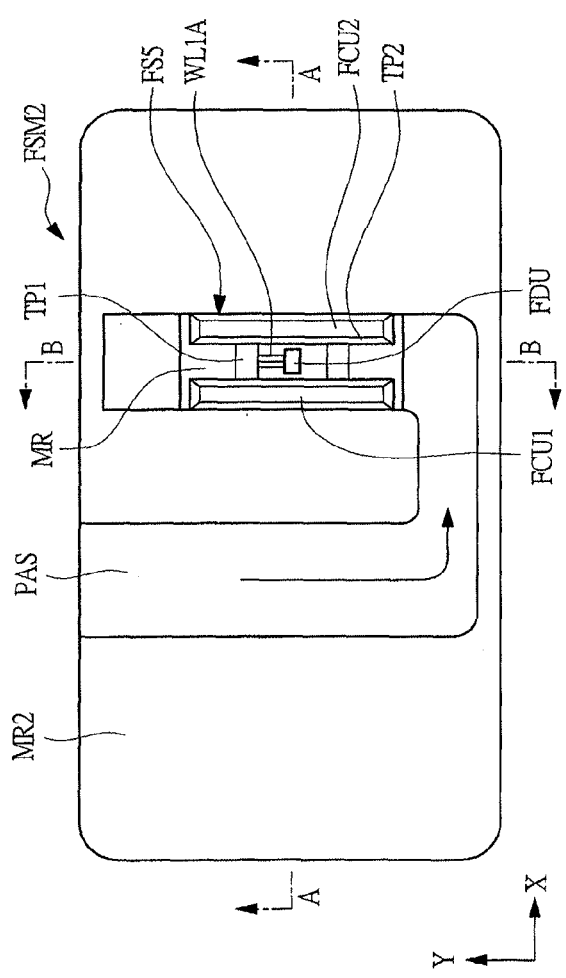
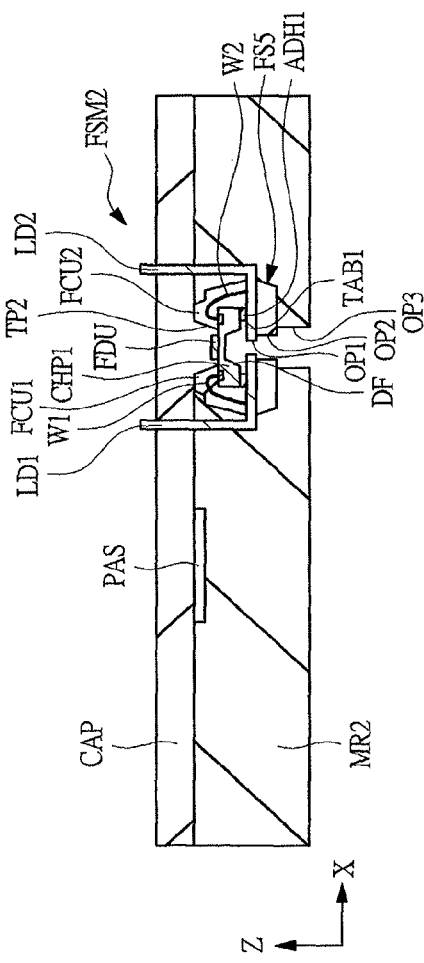

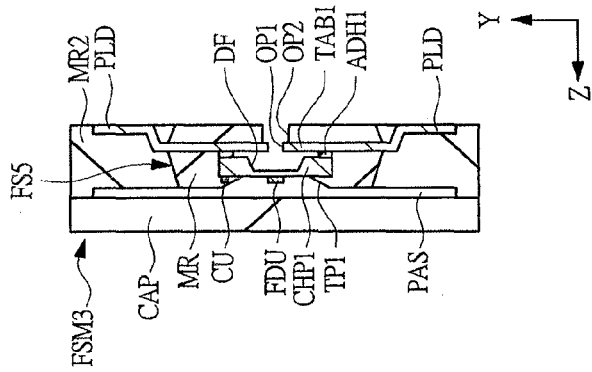
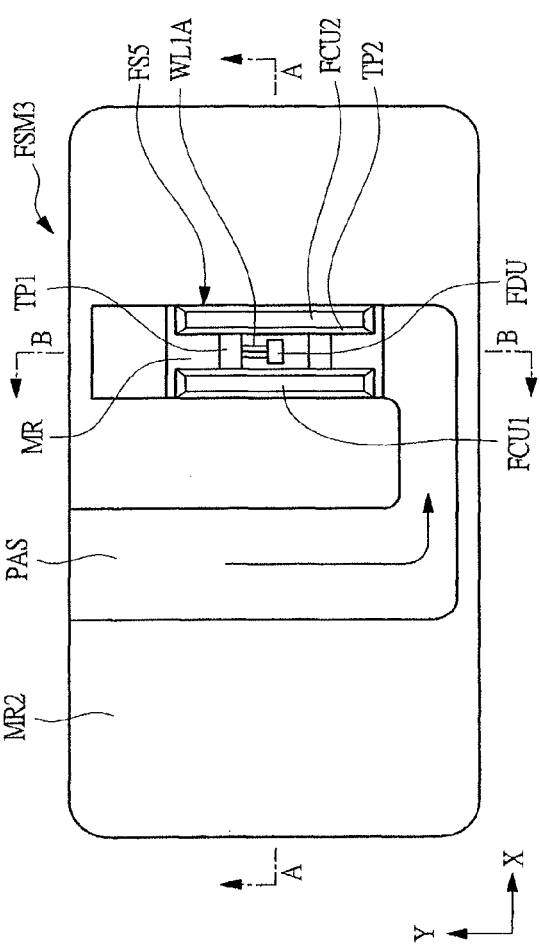
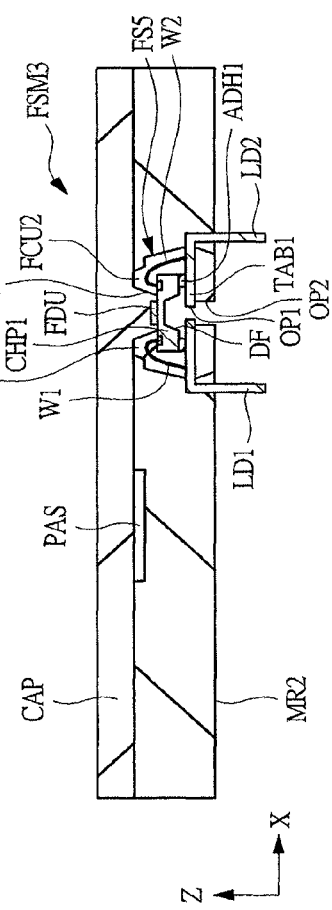
FIG. 38A
FIG. 38B
FIG. 38C

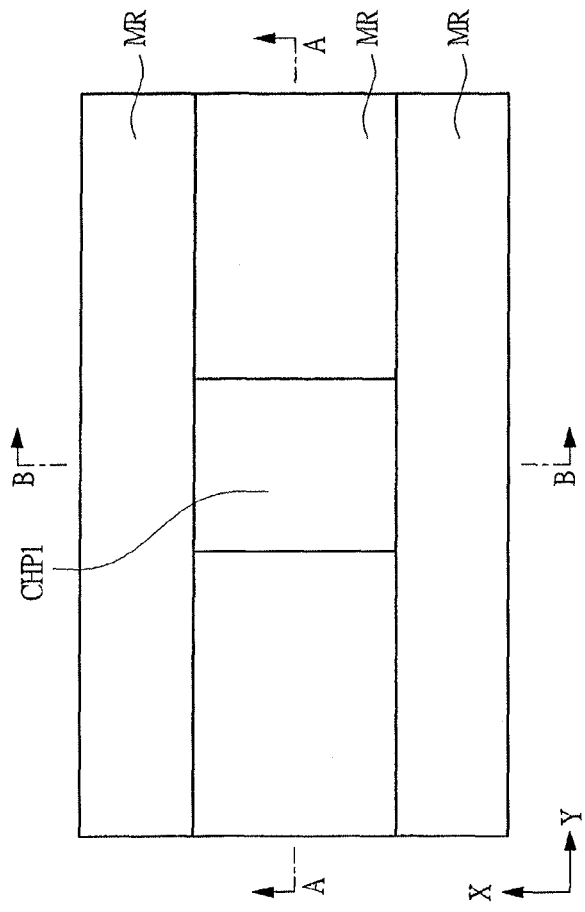
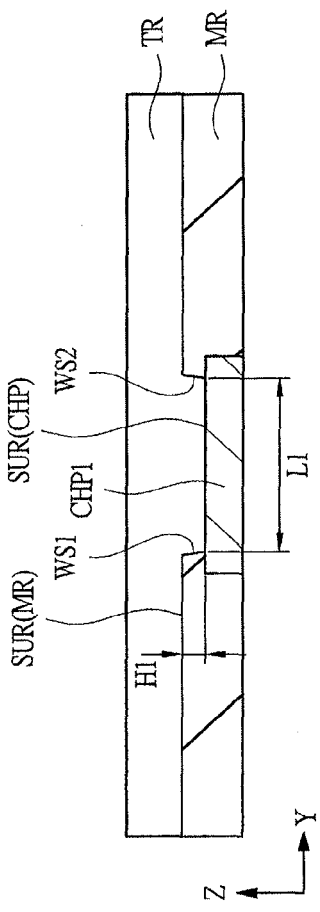
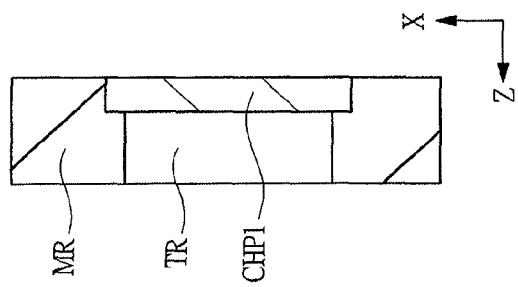

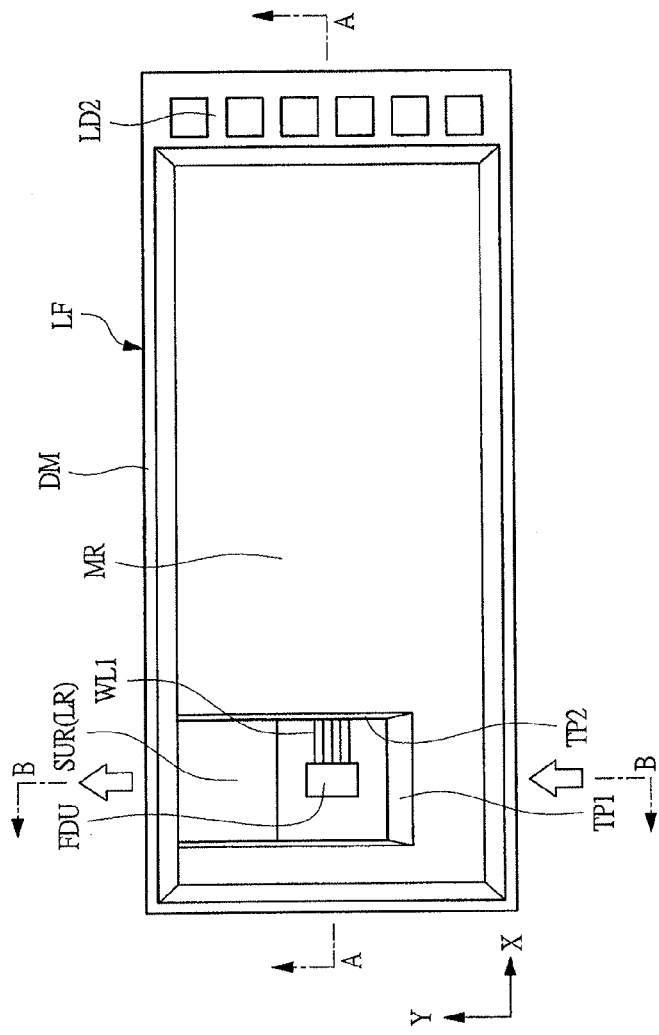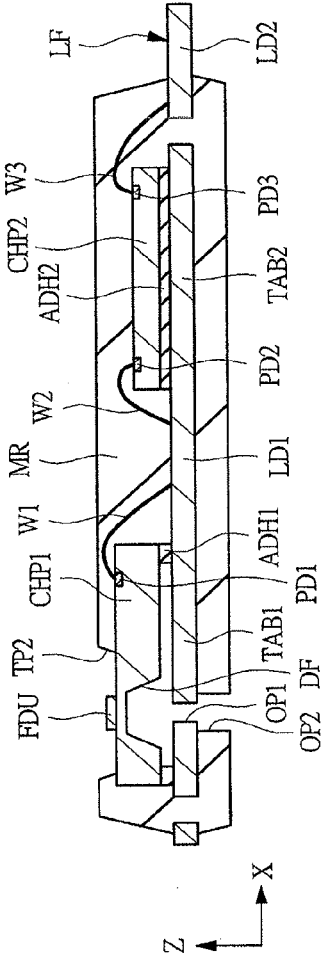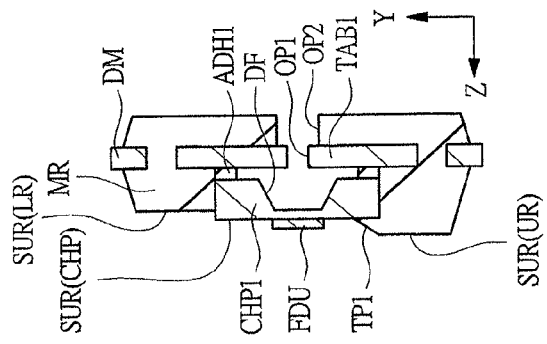
FIG. 52A
FIG. 52B
FIG. 52C

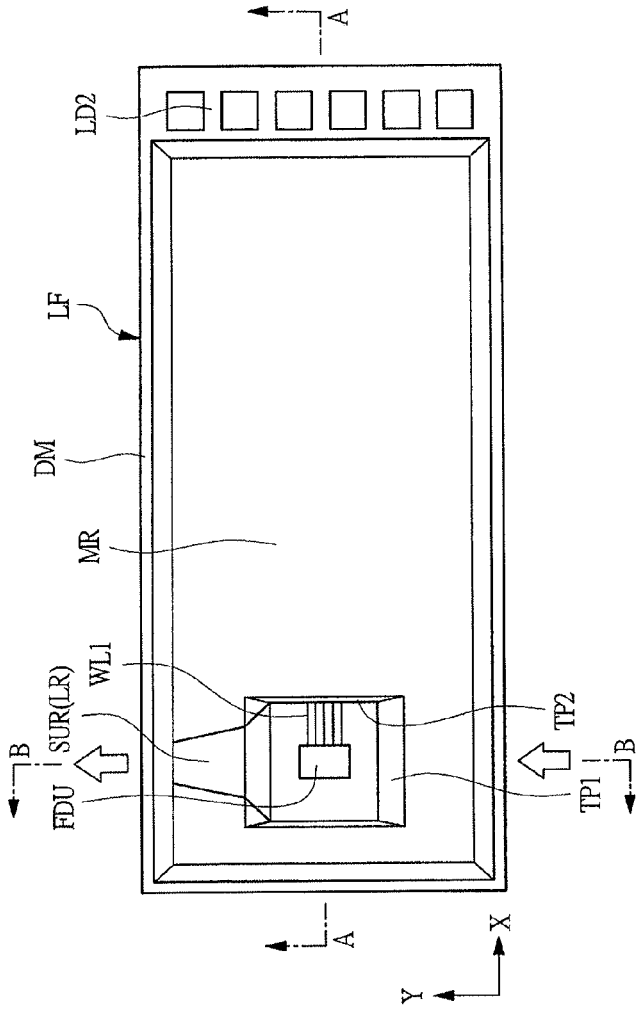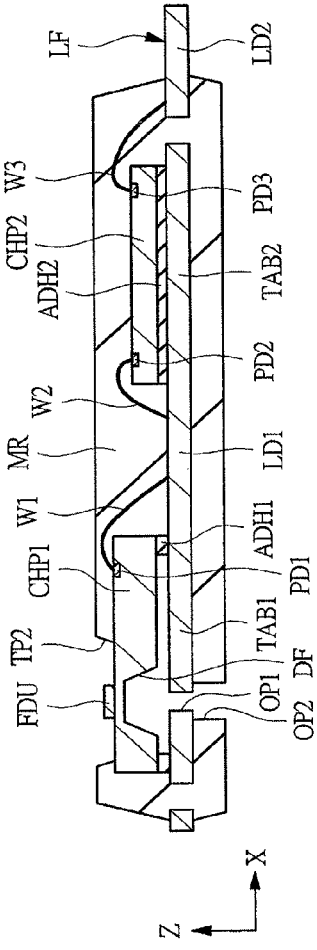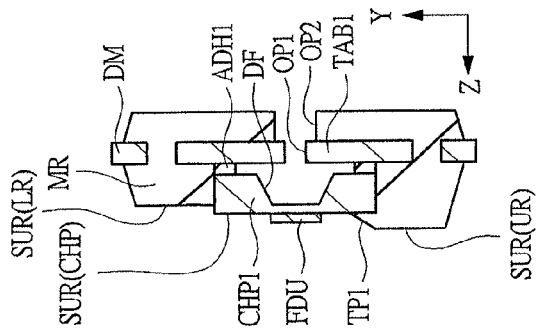
FIG. 53A
FIG. 53B
FIG. 53C

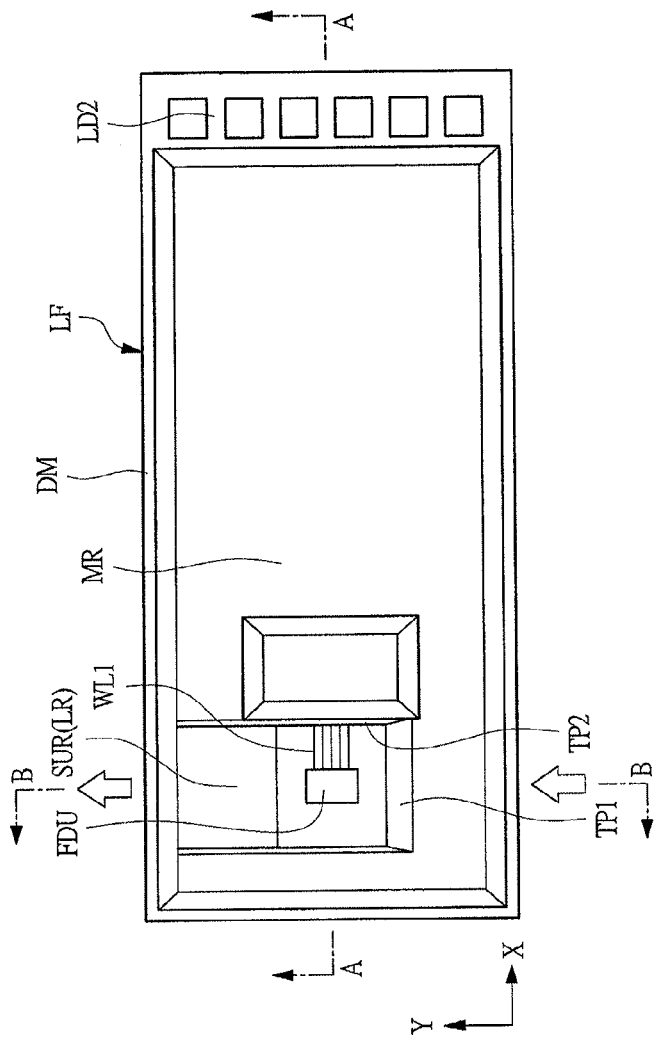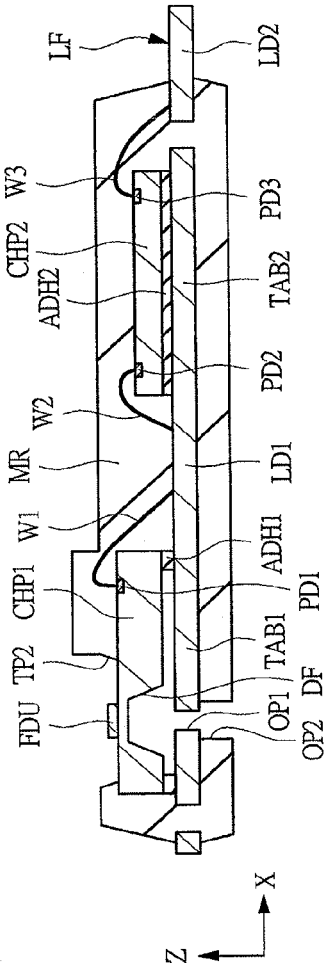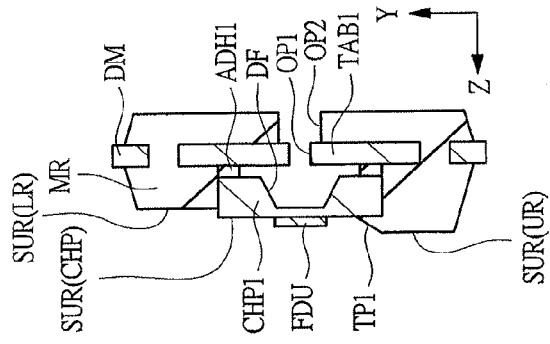

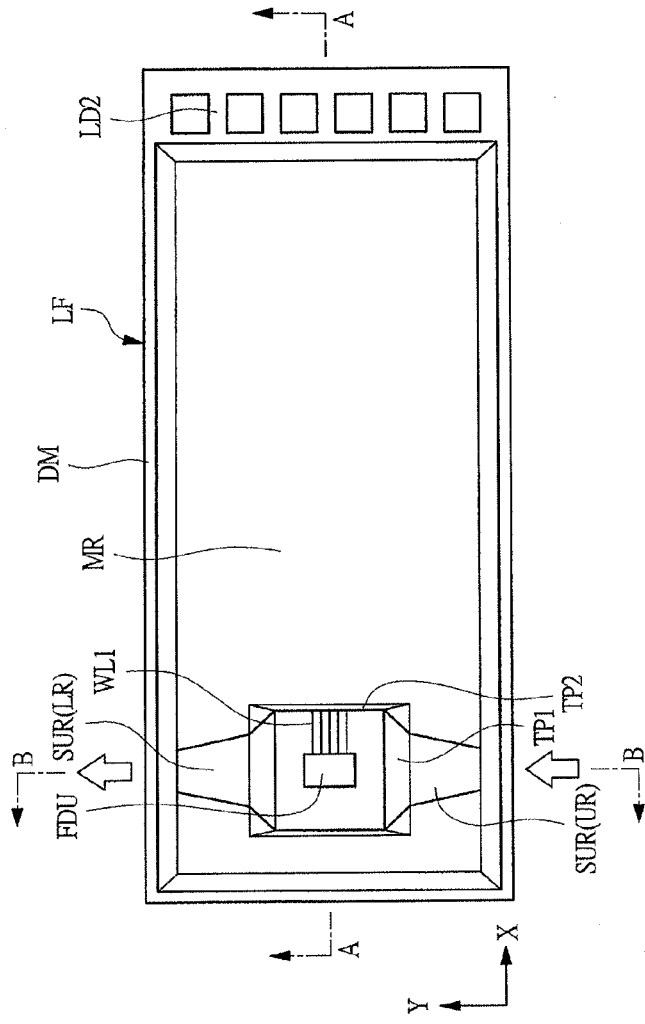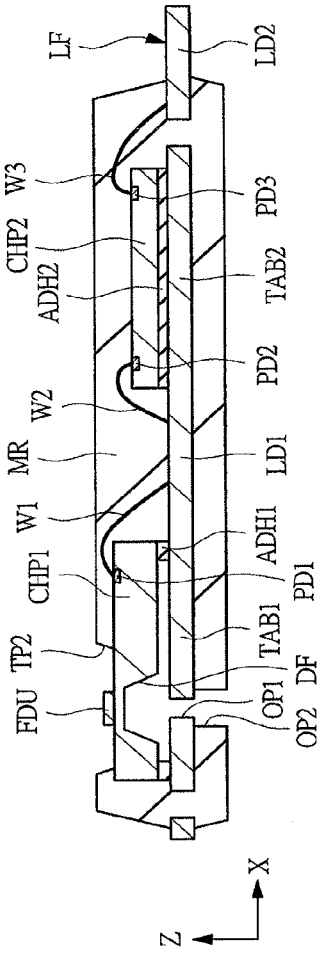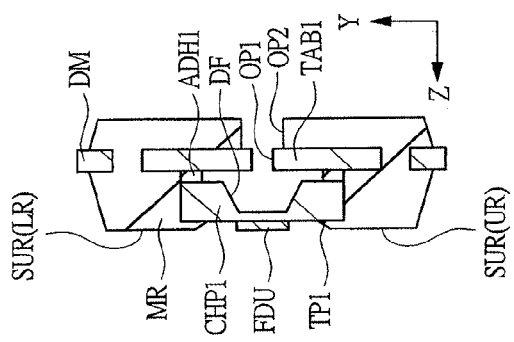
FIG. 60A
FIG. 60B
FIG. 60C

FLOW SENSOR AND MANUFACTURING METHOD OF THE SAME AND FLOW SENSOR MODULE AND MANUFACTURING METHOD OF THE SAME

CROSS-REFERENCE TO RELATED APPLICATIONS

This application is a continuation of U.S. patent application Ser. No. 13/393,155, filed Feb. 28, 2012, which is a National Stage of PCT/JP2011/070900, filed Sep. 13, 2011, which in turn claims priority under 35 U.S.C. §119 to PCT/JP2010/067946, filed Oct. 13, 2010. The disclosures of each of the above-identified U.S. and PCT patent applications are incorporated herein by reference in their entireties.

TECHNICAL FIELD

The present invention relates to a flow sensor and a manufacturing method of the same, and a flow sensor module and a method of manufacturing the same, and in particular, to a technology effectively applied to the package structure of a flow sensor and a flow sensor module.

BACKGROUND ART

Japanese Patent Application Laid-Open Publication No. 2009-31067 (Patent Document 1) discloses a configuration of a flow sensor that mounts a semiconductor chip on a support member and connects this semiconductor chip and an external connection terminal arranged outside the support member by wires. Here, it is disclosed that the wires connecting the semiconductor chip and the external connection terminal are sealed with resin.

Japanese Patent Application Laid-Open Publication No. 2008-175780 (Patent Document 2) discloses a configuration mounting a first semiconductor chip formed with a flow sensing unit of a flow sensor on a support member and a second semiconductor chip formed with a control circuit unit for controlling the flow sensing unit. The first semiconductor chip and the second semiconductor chip are connected by wires, and the second semiconductor chip and the wires are covered with resin. On the other hand, the first semiconductor chip formed with the flow sensing unit has its surface exposed, whereas the resin is formed so as to cover the side surface of the first semiconductor chip. Here, the height of resin formed so as to cover the side surface of the first semiconductor chip and the exposed surface of the first semiconductor chip are flush with each other.

Japanese Patent Application Laid-Open Publication No. 2008-157742 (Patent Document 3) also discloses a configuration of a flow sensor, similarly to Patent Document 1, which mounts a semiconductor chip on the support member, and connects this semiconductor chip and the external connection terminal arranged outside the support member by the wires. At this time, it is disclosed that the wires connecting the semiconductor chip and the external connection terminal are sealed with the resin.

Japanese Patent Application Laid-Open Publication No. 2009-36639 (Patent Document 4) discloses sealing of a semiconductor chip by a die and forming of an air flow path structure, and Japanese Patent Application Laid-Open Publication No. 2000-31309 (Patent Document 5) discloses a structure that mounts a semiconductor chip on a semiconductor chip via an adhesive.

Japanese Patent Application Laid-Open Publication No. 2004-74713 (Patent Document 6) discloses a method for clamping parts by a die provided with a die releasing film and pouring resin into the die as a manufacturing method of a semiconductor package.

PRIOR ART DOCUMENTS

Patent Documents

Patent Document 1: Japanese Patent Application Laid-Open Publication No. 2009-31067
Patent Document 2: Japanese Patent Application Laid-Open Publication No. 2008-175780
Patent Document 3: Japanese Patent Application Laid-Open Publication No. 2008-157742
Patent Document 4: Japanese Patent Application Laid-Open Publication No. 2009-36639
Patent Document 5: Japanese Patent Application Laid-Open Publication No. 2000-31309
Patent Document 6: Japanese Patent Application Laid-Open Publication No. 2004-74713

DISCLOSURE OF THE INVENTION

Problems to be Solved by the Invention

For example, at present, an internal combustion engine such as an automobile is provided with an electronically controlled fuel injection system. This electronically controlled fuel injection system fulfils a role of efficiently activating an internal combustion engine by appropriately adjusting the amount of gas (air) as well as fuel that flows into the internal combustion engine. Hence, the electronically controlled fuel injection system needs to have an accurate picture of the gas (air) that flows into the internal combustion engine. For this reason, the electronically controlled fuel injection system is provided with a flow sensor (air flow sensor) that measures a flow rate of the gas (air).

Among the flow sensors, particularly, the flow sensor manufactured by semiconductor micromachining technology has received widespread attention because it can reduce a cost, and furthermore, can be driven at a low power. Such flow sensor, for example, is configured such that a diaphragm (thin thickness part) is formed on the rear surface of a semiconductor substrate composed of silicon by anisotropic etching, and a surface of the semiconductor substrate facing this diaphragm is formed with a flow sensing unit composed of a heating resistor and a resistance thermometer.

The actual flow sensor has also a second semiconductor chip formed with a control circuit unit for controlling the flow sensing unit in addition to a first semiconductor chip formed with a diaphragm and the flow sensing unit. The first semiconductor chip and the second semiconductor chip, for example, are mounted on a board, and are electrically connected to wires (terminals) formed on the board. Specifically, for example, the first semiconductor chip is connected to the wirings formed on the board by wires composed of gold wires, and the second semiconductor chip is connected to wirings formed on the board by using a bump electrode formed on the second semiconductor chip. In this manner, the first semiconductor chip and the second semiconductor chip mounted on the board are electrically connected by the wirings formed on the board. As a result, the flow sensing unit formed on the first semiconductor chip can be controlled by the control circuit unit formed on the second semiconductor chip, thereby configuring the flow sensor.

At this point, the gold wires (wires) that connect the first semiconductor chip and the board are ordinarily fixed by a potting resin to avoid contact and the like due to deformation. In other words, the gold wires (wires) are covered and fixed by the potting resin, and the gold wires (wires) are protected by this potting resin. On the other hand, the first semiconductor chip and the second semiconductor chip configuring the flow sensor are ordinarily not sealed with the potting resin. That is, the ordinary flow sensor has such a structure that the gold wires (wires) alone are covered with the potting resin.

Here, since the fixing of the gold wires (wires) by the potting resin is not performed in a state in which the first semiconductor chip is fixed by the die and the like, a problem arises that the first semiconductor chip is shifted from the mounting position by contraction of the potting resin. In addition, since the potting resin is formed by dripping, a problem arises that dimensional accuracy of the potting resin is low. As a result, deviation occurs in the mounting position of the first semiconductor chip formed with the flow sensing unit for each flow sensor. At the same time, since the forming position of the potting resin varies delicately, variations occur in the detection performance of each flow sensor. As a consequence, to suppress the performance variations of each flow sensor, the detection performance needs to be corrected for each flow sensor, and this necessitates the addition of a performance correction process to the manufacturing process of the flow sensor. Particularly, when the performance correction process becomes long, the throughput in the manufacturing process of the flow sensor is decreased, and this creates a problem that the cost of the flow sensor is increased. Further, since the potting resin is not subjected to cure acceleration by heating, the time until the potting resin is cured becomes long, and the throughput in the manufacturing process of the flow sensor ends up being decreased.

A preferred aim of the present invention is to provide a technology capable of suppressing performance variations for each flow sensor and thereby improving the performance (including improvement of the reliability and achievement of an improvement of the performance) of the flow sensor.

The above and other preferred aims and novel characteristics of the present invention will be apparent from the description of the present specification and the accompanying drawings.

Means for Solving the Problems

The typical ones of the inventions disclosed in the present application will be briefly described as follows.

A flow sensor according to a representative embodiment includes: (a) a chip mounting unit mounting a semiconductor chip formed with a plurality of pads; (b) a plurality of leads disposed on an outside of the chip mounting unit; (c) the semiconductor chip disposed on the chip mounting unit; and (d) a plurality of wires connecting the plurality of leads and the plurality of pads formed on the semiconductor chip, respectively. The semiconductor chip includes: (c1) a flow sensing unit formed on a main surface of a semiconductor substrate; (c2) a control circuit unit for controlling the flow sensing unit; and (c3) a diaphragm formed in a region facing the flow sensing unit of the rear surface opposite to the main surface of the semiconductor substrate. At this time, a part of the chip mounting unit, a part of each of the plurality of leads, a part of the semiconductor chip, and the plurality of wires are sealed with a sealing body formed of resin in a state in which the flow sensing unit formed on the semiconductor chip is exposed. Here, a pair of air current control units clamping the exposed flow sensing unit and having a long shape in a direction parallel to the traveling direction of the gas that flows above the flow sensing unit is integrally formed with the sealing body.

A flow sensor according to a representative embodiment includes: (a) a chip mounting unit mounting a semiconductor chip formed with a plurality of pads; (b) a plurality of leads disposed on an outside of the chip mounting unit; (c) the semiconductor chip disposed on the chip mounting unit; and (d) a plurality of wires connecting the plurality of leads and the plurality of pads formed on the semiconductor chip, respectively. The semiconductor chip includes: (c1) a flow sensing unit formed on a main surface of a semiconductor substrate; (c2) a control circuit unit for controlling the flow sensing unit; and (c3) a diaphragm formed in a region facing the flow sensing unit of the rear surface opposite to the main surface of the semiconductor substrate. At this time, a part of the chip mounting unit, a part of each of the plurality of leads, a part of the semiconductor chip, and the plurality of wires are sealed with a sealing body formed of resin in a state in which the flow sensing unit formed on the semiconductor chip is exposed. Here, a height at both sides of the sealing body across the exposed flow sensing unit is higher than that of a surface of the semiconductor chip including the flow sensing unit.

A flow sensor according to a representative embodiment includes: (a) a chip mounting unit mounting a semiconductor chip formed with a plurality of pads; (b) a plurality of leads disposed on an outside of the chip mounting unit; (c) the semiconductor chip disposed on the chip mounting unit; and (d) a plurality of wires connecting the plurality of leads and the plurality of pads formed on the semiconductor chip, respectively. The semiconductor chip includes: (c1) a flow sensing unit formed on a main surface of a semiconductor substrate; (c2) a control circuit unit for controlling the flow sensing unit; and (c3) a diaphragm formed in a region facing the flow sensing unit of the rear surface opposite to the main surface of the semiconductor substrate. At this time, a part of the chip mounting unit, a part of each of the plurality of leads, a part of the semiconductor chip, and the plurality of wires are sealed with a sealing body formed of resin in a state in which the flow sensing unit formed on the semiconductor chip is exposed. Here, the chip mounting unit has a first opening formed therein in a region that overlaps with the diaphragm formed on the semiconductor chip when viewed in plan view, a rear surface of the sealing body has a second opening formed therein in a region that overlaps with the diaphragm the first opening and the second opening being communicated with each other, and a cross-sectional area of the first opening is smaller than a cross-sectional area of the second opening.

A method of manufacturing a flow sensor according to a representative embodiment includes the steps of: (a) preparing a lead frame having a first opening formed therein; and (b) preparing a semiconductor chip having a flow sensing unit formed on a main surface of a semiconductor substrate, and a diaphragm formed in a region opposite to the flow sensing unit of the rear surface opposite to the main surface of the semiconductor substrate. Next, the method includes (c) mounting the semiconductor chip on the lead frame so that the diaphragm formed on the semiconductor chip overlaps with the first opening formed in the lead frame when viewed in plan view; and (d) after the step (c), connecting the semiconductor chip and the lead frame by wires. Subsequently, the method includes the steps of: (e) after the step (d), sealing a part of the semiconductor chip, while exposing the flow sensing unit formed on the semiconductor chip. Further, the step (e) includes: (e1) preparing an upper die, and at the same time, preparing a lower die having a first projected part formed thereto, and a second project part formed on the first projected part and having a cross-sectional area smaller than a cross-sectional area of the first projected part; and (e2) after the step (e1), clamping the lead frame mounting the semiconductor chip by the upper die and the lower die interposing a first space, while inserting the second projected part formed in the lower die into the first opening formed in the lead frame and pressing the first projected part against the lead frame. Finally, the method includes the step of: (e3) after the step (e2), injecting resin into the first space.

A flow sensor module according to a representative embodiment includes: (a) a flow sensor in which a semiconductor chip is sealed with a first resin including a flow sensing unit formed on a main surface of a semiconductor substrate and a diaphragm formed in a region facing the flow sensing unit of a rear surface opposite to the main surface of the semiconductor unit, while having the flow sensing unit exposed; and (b) a flow path unit for guiding a gas to the flow sensing unit of the flow sensor. Here, the flow sensor module has a second resin formed so as to cover a further outer side of the first resin sealing the flow sensor and further so as to expose the flow sensing unit. Moreover, the flow path unit is formed so as to be joined to the flow sensing unit of the flow sensor, and is configured such that the gas is guided to the flow sensing unit of the flow sensor by passing through the flow path unit.

A method of manufacturing a flow sensor module according to a representative embodiment includes the step of (a) preparing a flow sensor in which a semiconductor chip is sealed with a first resin including a flow sensing unit formed on a main surface of a semiconductor substrate and a diaphragm formed in a region facing the flow sensing unit of a rear surface opposite to the main surface of the semiconductor unit, while exposing the flow sensing unit. And, the method includes the step of (b) after the step (a), sealing apart of the flow sensor, while exposing the flow sensing unit formed in the flow sensor. Here, the step (b) includes the steps of: (b1) preparing an upper die and a lower die; and (b2) after the step (b1), clamping the flow sensor by the upper die and the lower die interposing a first space. Finally, the method includes the step of (b3) after the step (b2), injecting a second resin into the first space. Here, a part of the flow sensor is sealed with the second resin by clamping the flow sensor by the upper die and the lower die so as to surround the flow sensing unit formed on the flow sensor by a second space isolated from the first space, while exposing the flow sensing unit formed on the flow sensor.

A flow sensor according to the representative embodiment has a structure having a high resin surface, in which a region including the flow sensing unit of the semiconductor chip rather than the surface (element formation surface) of the semiconductor chip is partially exposed and mold-sealed in order to provide a structure capable of stabilizing an air flow in the flow sensing unit.

Further, to provide a flow sensor that improves bonding properties between the semiconductor chip and a die interface (resin interface), the resin is partially molded also on the upper surface of the semiconductor element in the optional cross-section in an air flow direction, thereby improving bonding properties. At this time, the resin is preferably molded (sealed) in a state in which a polyimide film excellent in bonding properties with the resin is formed on the semiconductor chip.

When the flow sensing unit, which is mounting a member (frame body) having a through-hole on the semiconductor chip, is partially exposed, the material of the member (frame body) to be mounted is not the same silicon material as that of the semiconductor chip in order to avoid breakage of the member (frame body) to be mounted, but a pressed article and/or resin molding such as aluminum alloy (Al alloy) and iron alloy (Fe alloy) that can be subjected to press working.

Effects of the Invention

The effects obtained by typical aspects of the present invention will be briefly described below.

The performance variations for each flow sensor are suppressed, thereby improving the performance of the flow sensor.

BRIEF DESCRIPTIONS OF THE DRAWINGS

FIG. 5A is a plan view showing the mounting configuration after sealing the flow sensor according to the first embodiment;

FIG. 5B is a cross-sectional view taken along the line A-A of FIG. 5A;

FIG. 5C is a cross-sectional view taken along the line B-B of FIG. 5A;

FIG. 11A is a plan view showing a mounting configuration after sealing the flow sensor according to a second embodiment;

FIG. 11B is a cross-sectional view taken along the line A-A of FIG. 11A;

FIG. 11C is a cross-sectional view taken along the line B-B of FIG. 11A;

FIG. 13A is a plan view showing the mounting configuration after sealing the flow sensor according to the third embodiment;

FIG. 13B is a cross-sectional view taken along the line A-A of FIG. 13A;

FIG. 13C is a cross-sectional view taken along the line B-B of FIG. 13A;

FIG. 33A is a plan view showing a mounting configuration a flow sensor module according to a ninth embodiment;

FIG. 33B is a cross-sectional view taken along the line A-A of FIG. 33A;

FIG. 33C is a cross-sectional view taken along the line B-B of FIG. 33A;

FIG. 37A is a plan view showing a mounting configuration of a flow sensor module according to a tenth embodiment;

FIG. 37B is a cross-sectional view taken along the line A-A of FIG. 37A;

FIG. 37C is a cross-sectional view taken along the line B-B of FIG. 37A;

FIG. 38A is a plan view showing a mounting configuration of a flow sensor module according to a eleventh embodiment;

FIG. 38B is a cross-sectional view taken along the line A-A of FIG. 38A;

FIG. 38C is a cross-sectional view taken along the line B-B of FIG. 38A;

FIGS. 42A-42C are views showing a configuration of a fluid analysis model, in which FIG. 42A is particularly a plan view of the fluid analysis model seen from above, and FIG. 42B is particularly a cross-sectional view taken along the line A-A of FIG. 42A, and FIG. 42C is a cross-sectional view taken along the line B-B of FIG. 42A;

FIGS. 47A and 47B are views showing a configuration of a frame body, in which FIG. 47A is a plan view showing the configuration of the frame body, and FIG. 47B is a cross-sectional view taken along the line A-A of FIG. 47A;

FIG. 52A is a plan view showing a mounting configuration after sealing the flow sensor according to the fifteenth embodiment;

FIG. 52B is a cross-sectional view taken along the line A-A of FIG. 52A;

FIG. 52C is a cross-sectional view taken along the line B-B of FIG. 52A;

FIG. 53A is a plan view showing a mounting configuration after sealing the flow sensor according to the fifteenth embodiment;

FIG. 53B is a cross-sectional view taken along the line A-A of FIG. 53A;

FIG. 53C is a cross-sectional view taken along the line B-B of FIG. 53A;

FIG. 54A is a plan view showing a mounting configuration after sealing the flow sensor according to the fifteenth embodiment;

FIG. 54B is a cross-sectional view taken along the line A-A of FIG. 54A;

FIG. 54C is a cross-sectional view taken along the line B-B of FIG. 54A;

FIG. 60A is a plan view showing a mounting configuration after sealing the flow sensor according to the fifteenth embodiment;

FIG. 60B is a cross-sectional view taken along the line A-A of FIG. 60A; and FIG. 60C is a cross-sectional view taken along the line B-B of FIG. 60A.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, the description of the same or similar portions is not repeated in principle unless particularly required in the following embodiments. Also, in some drawings used in the embodiments, hatching is used even in a plan view so as to make the drawings easy to see.

First Embodiment

Circuit Configuration of Flow Sensor

Figure 1:
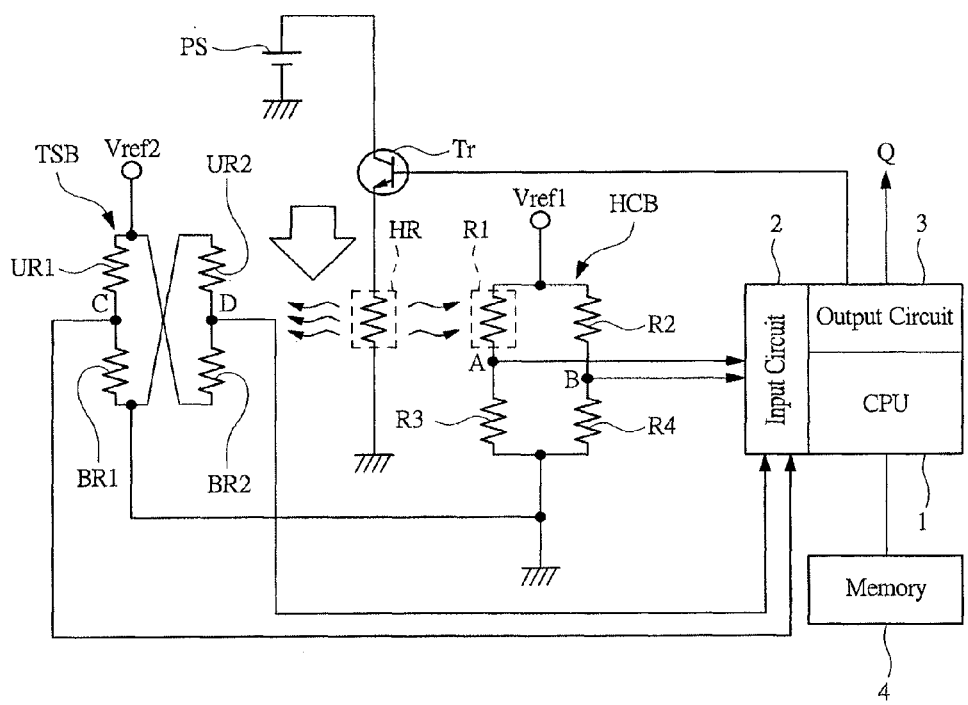
FIG. 1 is a circuit block diagram showing a circuit configuration of a flow sensor according to a first embodiment of the present invention.

First, a circuit configuration of a flow sensor will be described. FIG. 1 is a circuit block diagram showing a circuit configuration of a flow sensor according to a first embodiment. In FIG. 1, the flow sensor of the first embodiment has, to begin with, a CPU (Central Processing Unit) 1 for controlling the flow sensor, and further, an input circuit 2 for inputting an input signal to this CPU1, and an output circuit 3 for outputting an output signal from the CPU1. The flow sensor is provided with a memory 4 for storing data, and the CPU1 has an access to the memory 4 and can refer to data stored in the memory 4.

Next, the CPU1 is connected to a base electrode of a transistor Tr through the output circuit 3. A collector electrode of this transistor Tr is connected to a power supply PS, and an emitter electrode of the transistor Tr is connected to a ground (GND) through a heating resistor HR. Consequently, the transistor Tr is controlled by the CPU1. That is, the base electrode of the transistor Tr is connected to the CPU1 through the output circuit 3 so that an output signal from the CPU1 is inputted to the base electrode of the transistor Tr. As a result, a current flowing through the transistor Tr is controlled by the output signal (control signal) from the CPU1. When the current flowing through the transistor Tr is increased in accordance with the output signal from the CPU1, the current supplied to the heating resistor HR from the power supply PS is increased, and the amount of heating of the heating resistor HR is increased. On the other hand, when the current flowing through the transistor Tr is decreased in accordance with the output signal from the CPU1, the current supplied to the heating resistor HR is decreased, and the amount of heating of the heating resistor HR is decreased. In this manner, it is found that the flow sensor of the first embodiment is configured such that the amount of the current flowing through the heating resistor HR is controlled by the CPU1 and thus, the amount of heating from the heating resistor HR is controlled by the CPU1.

Subsequently, in the flow sensor of the first embodiment, since the current flowing through the heating resistor HR is controlled by the CPU1, a heater control bridge HCB is provided. This heater control bridge HCB is configured such that the amount of heating dissipated from the heating resistor HR is detected and the result of this detection is outputted to the input circuit 2. As a result, the CPU1 can input the detection result from the heater control bridge HCB, and based on this detection result, controls the current flowing through the transistor Tr.

Specifically, the heater control bridge HCB, as shown in FIG. 1, has resistors R1 to R4 configuring a bridge between a reference voltage Vref1 and the ground (GND). In the heater control bridge HCB thus configured, when temperature of a gas heated by the heating resistor HR is higher than an intake-air temperature by a certain specific temperature ($\Delta T$, for example, 100° C.), resistance values of the resistors R1 to R4 are set such that a potential difference between a node A and a node B is 0 V. In other words, the resistors R1 to R4 configuring the heater control bridge HCB configure a bridge in such a manner that a constituent element connecting the resistor R1 and the resistor R3 in series and a constituent element connecting the resistor R2 and the resistor R4 in series are connected in parallel between the reference voltage Vref1 and the ground (GND). The connecting point between the resistor R1 and the resistor R3 becomes the node A, and the connecting point between the resistor R2 and the resistor R4 becomes the node B. At this time, the gas heated by the heating resistor HR is brought into contact with the resistor R1 configuring the heater control bridge HC. Consequently, the resistance value of the resistor R1 configuring the heater control bridge HCB is mainly changed by the amount of heating from the heating resistor HR. When the resistance value of the resistor R1 is changed in this manner, the potential difference between the node A and the node B is changed. Since this potential difference between the node A and the node B is inputted to the CPU1 through the input circuit 2, the CPU1 controls the current flowing through the transistor Tr based on the potential difference between the node A and the node B. Specifically, the CPU1 controls the amount of heating from the heating resistor HR by controlling the current flowing through the transistor Tr so that the potential difference between the node A and the node B becomes 0 V. That is, it is found that the flow sensor according to the first embodiment is configured such that the CPU1 performs a feed back control based on the output of the heater control bridge HCB in order to maintain the temperature of the gas heated by the heating resistor HR at a specific value higher by a certain specific temperature ($\Delta T$, for example, 100° C.).

Subsequently, the flow sensor according to the first embodiment has a temperature sensor bridge TSB for detecting a flow rate of the gas. This temperature sensor bridge TSB includes four resistance thermometers configuring a bridge between a reference voltage Vref2 and the ground (GND). These four resistance thermometers include two upstream resistance thermometers UR1 and UR2 and two downstream resistance thermometers BR1 and BR2. That is, the arrow direction of FIG. 1 shows a gas flow direction, and the upstream side of the gas flow direction is provided with the upstream resistance thermometers UR1 and UR2, and the downstream side is provided with the downstream resistance thermometers BR1 and BR2. These upstream resistance thermometers UR1 and UR2 and the downstream resistance thermometers BR1 and BR2 are arranged such that a distance to the heating resistor HR is the same.

In the temperature sensor bridge TSB, the upstream resistance thermometer UR1 and the downstream resistance thermometer BR1 are connected in series between the reference voltage Vref2 and the ground (GND), and this connecting point of the upstream resistance thermometer UR1 and the downstream resistance thermometer BR1 is a node C. On the other hand, the upstream resistance thermometer UR2 and the downstream resistance thermometer BR2 are connected in series between the ground (GND) and the reference voltage Vref2, and this connecting point of the upstream resistance thermometer UR2 and the downstream resistance thermometer BR2 is a node D. The potentials of the node C and the node D are inputted to the CPU1 through the input circuit 2. When a windless state exists, in which a flow rate of the gas flowing in the arrow direction is zero, each resistance value of the upstream resistance thermometers UR1 and UR2 and the downstream resistance thermometers BR1 and BR2 is set such that the potential difference between the node C and the node D is 0 V. Specifically, the upstream resistance thermometers UR1 and UR2 and the downstream resistance thermometers BR1 and BR2 are equal to each other in distance from the heating resistor HR, and are equal to each other in resistance value. Hence, it is found that the temperature sensor bridge TSB is configured such that the potential difference between the node C and the node D is 0 V if the windless state exists regardless of the amount of heating of the heating resistor HR.

Operation of Flow Sensor

The flow sensor according to the first embodiment is configured as described above, and its operation will be described below with reference to FIG. 1. First, the CPU1 supplies the current to the transistor Tr by outputting an output signal (control signal) to the base electrode of the transistor Tr through the output circuit 3. Then, the current flows into the heating resistor HR connected to the emitter electrode of the transistor Tr from the power supply PS that is connected to the collector electrode of the transistor Tr. Hence, the heating resistor HR produces heat. The gas warmed by heat generation from the heating resistor HR heats the resistor R1 that configures the heater control bridge HCB. At this time, when the gas warmed by the heating resistor HR becomes higher by a specific temperature (for example, 100° C.), each resistance value of the resistors R1 to R4 is set such that the potential difference between the node A and the node B of the heater control bridge HCB is 0 V. Hence, for example, when the gas warmed by the heating resistor HR becomes higher by a specific temperature (for example, 100° C.), the potential difference between the node A and the node B of the heater control bridge HCB is 0 V, and this potential difference (0 V) is inputted to the CPU1 through the input circuit 2. The CPU1 which recognizes that the potential difference from the heater control bridge HCB is 0 V outputs an output signal (control signal) for maintaining the existing amount of current to the base electrode of the transistor Tr through the output circuit 3.

On the other hand, when the gas warmed by the heating resistor HR is shifted from a specific temperature (for example, 100° C.), a potential difference being not 0 V occurs between the node A and the node B of the heater control bridge HCB, and this potential difference is inputted to the CPU1 through the input circuit 2. The CPU1 which recognizes that the potential difference occurs from the heater control bridge HCB outputs an output signal (control signal) by which the potential difference becomes 0 V to the base electrode of the transistor Tr through the output circuit 3. For example, when the potential difference occurs in the direction where the gas warmed by the heating resistor HR becomes higher by a specific temperature (for example, 100° C.), the CPU1 outputs a control signal (output signal) by which the current flowing through the transistor Tr is decreased to the base electrode of the transistor Tr. In contrast to this, when the potential difference occurs in the direction where the gas warmed by the heating resistor HR becomes lower than a specific temperature (for example, 100° C.), the CPU1 outputs a control signal (output signal) by which the current flowing through the transistor Tr is increased to the base electrode of the transistor Tr. By operating as described above, the CPU1 performs a feedback control based on the output signal from the heater control bridge HCB so that the potential difference between the node A and the node B of the heater control bridge HCB is 0 V (equilibrium state). From this, it is understood that the gas warmed by the heating resistor HR is controlled to become a specific temperature in the flow sensor of the first embodiment.

Next, an operation for measuring the flow rate of the gas by the flow sensor according to the first embodiment will be described. First, the case where a windless state exists will be described. When the windless state exists in which the flow rate of the gas flowing to the arrow direction is zero, each resistance value of the upstream resistance thermometers UR1 and UR2 and the downstream resistance thermometers BR1 and BR2 is set such that the potential difference between the potential of the node C and the node D of the temperature sensor bridge TSB is 0 V. Specifically, the upstream resistance thermometers UR1 and UR2 and the downstream resistance thermometers BR1 and BR2 are configured to be equal in distance from the heating resistor HR, and also equal in resistance value. Hence, if the temperature sensor bridge TSB is in a windless state regardless of the amount of heating of the heating resistor HR, the potential difference between the node C and the node D becomes 0 V, and this potential difference (0 V) is inputted to the CPU1 through the input circuit 2. The CPU1 which recognizes that the potential difference from the temperature sensor bridge TSB is 0 V recognizes that the flow rate of the gas flowing to the arrow direction is zero, and an output signal showing that the flow rate Q of the gas flowing through the output circuit 3 is zero is outputted from the flow sensor of the first embodiment.

Subsequently, a situation where the gas flows in the arrow direction of FIG. 1 is assumed. In this case, as shown in FIG. 1, the upstream resistance thermometers UR1 and UR2 arranged on the upper stream side in the gas flow direction are cooled by the gas flowing to the arrow direction. Hence, the temperatures of the upstream resistance thermometers UR1 and UR2 are dropped, whereas the downstream resistance thermometers BR1 and BR2 arranged on the downstream side in the gas flow direction rise in temperature since the gas warmed by the heating resistor HR flows to the downstream resistance thermometer BR1 and BR2. As a result, the balance of the temperature sensor bridge TSB is lost, and the potential difference being not 0 V occurs between the node C and the node D of the temperature sensor bridge TSB. This potential difference is inputted to the CPU1 through the input circuit 2. Then, the CPU1, which has recognized that the potential difference from the temperature sensor bridge TSB is not zero, recognizes that the flow rate of the gas flowing in the arrow direction is not zero. After that, the CPU1 accesses the memory 4. Since the memory 4 stores a contrast list (table) corresponding to the potential difference and the gas flow rate, the CPU1 having an access to the memory 4 calculates the gas flow rate Q from the contrast table stored in the memory 4. In this way, the gas flow rate Q calculated by the CPU1 is outputted from the flow sensor of the first embodiment through the output circuit 3. According to the operation performed as described above, it is understood that the flow rate of the gas can be obtained according to the flow sensor of the first embodiment.

Layout Configuration of Flow Sensor

Next, a layout configuration of the flow sensor of the first embodiment will be described. For example, the flow sensor of the first embodiment shown in FIG. 1 is formed in the two semiconductor chips. Specifically, the heating resistor HR, the heat control bridge HCB, and the temperature sensor bridge TSB are formed on one semiconductor chip, whereas the CPU1, the input circuit 2, the output circuit 3, the memory 4 and the like are formed on the other semiconductor chip. The layout configuration of the semiconductor chip formed with the heating resistor HR, the heater control bridge HCB, and the temperature sensor bridge TSB will be described below.

Figure 2:
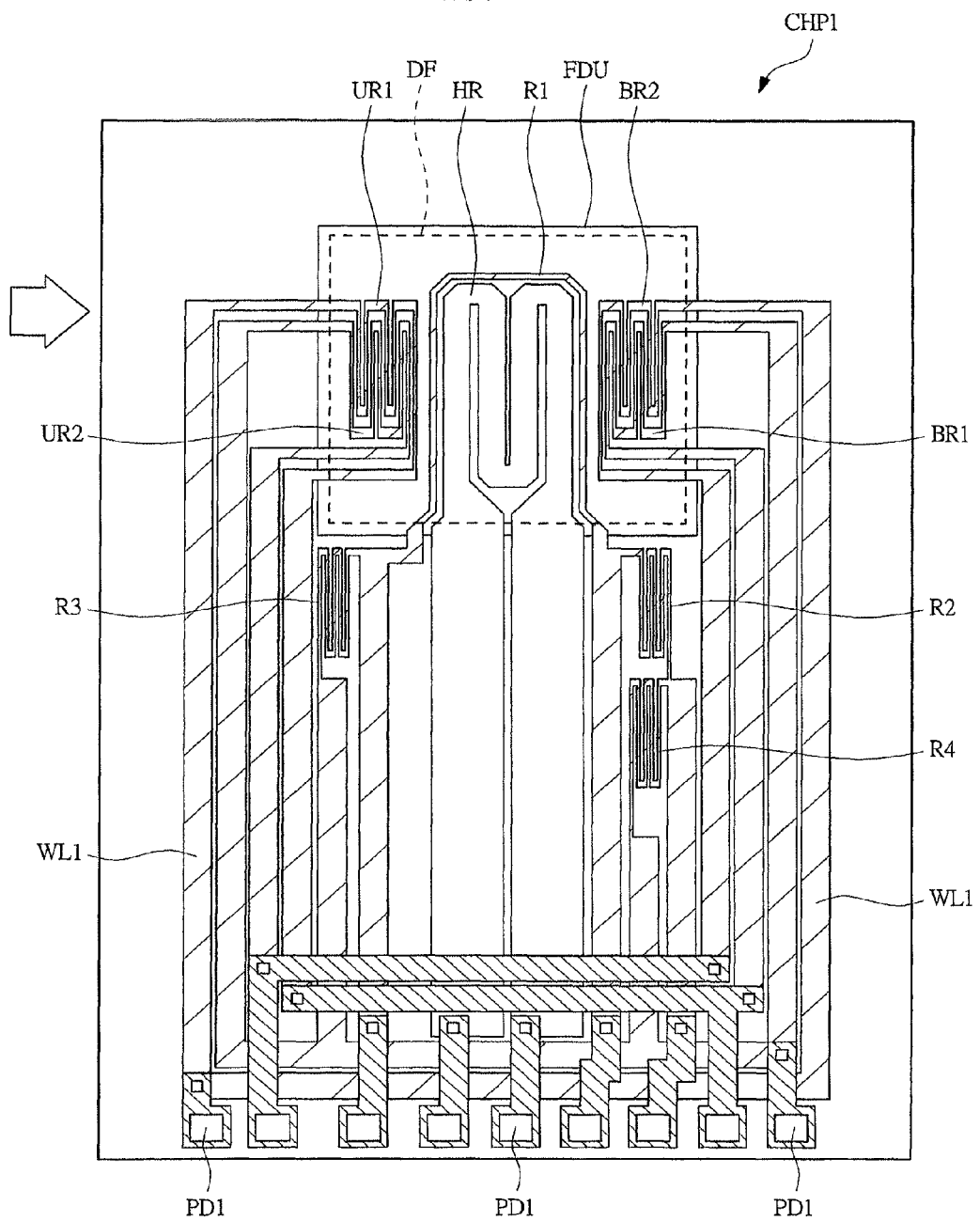
FIG. 2 is a plan view showing a layout configuration of a semiconductor chip configuring a part of the flow sensor according to the first embodiment of the present invention.

FIG. 2 is a plan view showing the layout configuration of a semiconductor chip CHP1 that configures a part of the flow sensor of the first embodiment. First, as shown in FIG. 2, the semiconductor chip CHP1 is in a rectangular shape, and the gas flows from the left side of this semiconductor chip CHP1 to the right side (arrow direction). As shown in FIG. 2, a diaphragm DF having a rectangular shape is formed on the rear surface of the rectangular shaped semiconductor chip CHP1. The diaphragm DF means a thin plate region in which the thickness of the semiconductor chip CHP1 is made thin. In other words, the thickness of the region in which the diaphragm DF is formed is made thinner than the thicknesses of the region of the other semiconductor chip CHP1.

The surface region of the semiconductor chip CHP1 facing the rear surface region formed with the diaphragm in this manner is formed with the flow sensing unit FDU as shown in FIG. 2. Specifically, the central part of this flow sensing unit FDU is formed with the heating resistor HR, and around this heating resistor HR, the resistor R1 configuring the heat control bridge is formed. On the outer side of the flow sensing unit FDU, the resistors R2 to R4 configuring the heater control bridge are formed. By the resistors R1 to R4 formed in this way, the heater control bridge is formed. Particularly, since the resistor R1 configuring the heater control bridge is formed in the vicinity of the heating resistor HR, the temperature of the gas warmed by heat generation from the heating resistor HR can be reflected to the resistor R1 with sufficient accuracy. On the other hand, since the resistors R2 to R4 configuring the heater control bridge are arranged away from the heating resistor HR, the resistors R2 to R4 are hardly affected by heat generation from the heating resistor HR. As a consequence, the resistor R1 can be configured to sensitively react to the temperature of the gas warmed by the heating resistor HR, whereas the resistors R2 to R4 can be configured to be hardly affected by the heating resistor HR and easy to maintain the resistance value at a specific value. Hence, the detection accuracy of the heater control bridge can be enhanced.

In addition, the upstream resistance thermometers UR1 and UR2 and the downstream resistance thermometers BR1 and BR2 are arranged in such a manner as to clamp the heating resistor HR formed on the flow sensing unit FDU. Specifically, the upstream resistance thermometers UR1 and UR2 are formed on the upstream side in the arrow direction to which the gas flows, and the downstream resistance thermometers BR1 and BR2 are formed on the downstream side in the arrow direction to which the gas flows. With such a configuration, when the gas flows to the arrow direction, the temperatures of the upstream resistance thermometers UR1 and UR2 can be lowered, and the temperatures of the downstream resistance thermometers BR1 and BR2 can be increased. In this way, the temperature sensor bridge can be formed by the upstream resistance thermometers UR1 and UR2 and the downstream resistance thermometers BR1 and BR2 that are arranged in the flow sensing unit FDU.

The heating resistor HR, the upstream resistance thermometers UR1 and UR2, and the downstream resistance thermometers BR1 and BR2 described above are formed by patterning by a method such as ion etching after forming, for example, a metal film such as platinum and/or a semiconductor thin film such as polysilicon (polycrystalline silicon) by methods such as sputtering method, CVD (Chemical Vapor Deposition) method and/or the like.

The heating resistor HR thus configured, the resistors R1 to R4 configuring the heater control bridge, and the upstream resistance thermometers UR1 and UR2 and the downstream resistance thermometers BR1 and BR2 configuring the temperature sensor bridge are connected to wirings WL1, respectively, and are pulled out to pads PD1 arranged along the lower side of the semiconductor chip CHP1.

Thus, the semiconductor chip CHP1 configuring a part of the flow sensor of the first embodiment is laid out. The actual flow sensor has one semiconductor chip formed with the heating resistor HR, the heater control bridge HCB, and the temperature sensor bridge TSB, and another semiconductor chip formed with the CPU1, the input circuit 2, the output circuit 3, the memory 4 and the like, and mounts these semiconductor chips on the board. The flow sensor thus mounting these semiconductor chips on the board will be described below. First, the mounting configuration of the flow sensor in the existing technology will be described. Then, the problem on the mounting configuration of the flow sensor in an existing technology will be described, and the mounting configuration of the flow sensor of the first embodiment devised to solve the problem on the mounting configuration of the flow sensor in the existing technology will be described.

Mounting Configuration of Conventional Flow Sensor

Figure 3A:
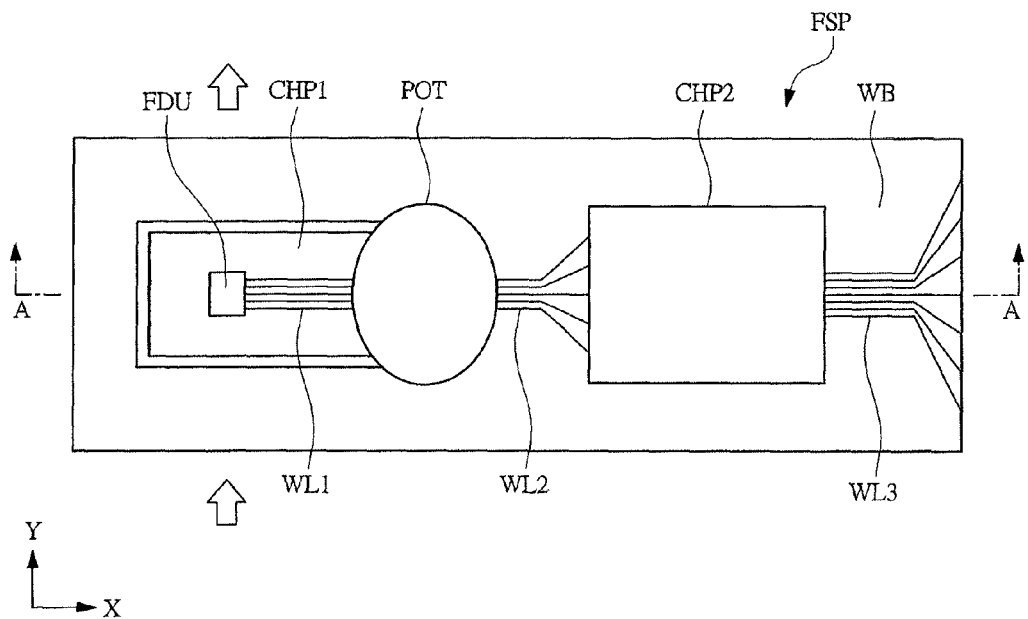
FIG. 3A is a plan view showing a mounting configuration of the flow sensor according to an existing technique.
Figure 3B:
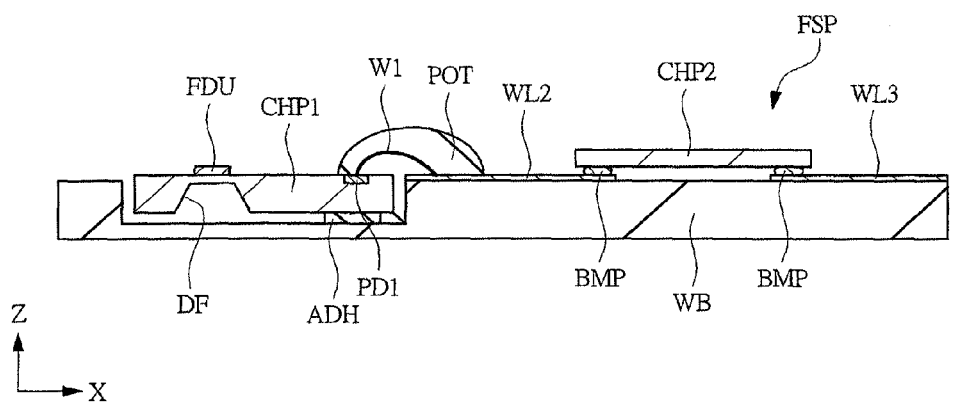
FIG. 3B is a cross-sectional view taken along the line A-A of FIG. 3A.

FIGS. 3A and 3B are views showing a mounting configuration of a flow sensor FSP of the existing technology. Specifically, FIG. 3A is a plan view showing the mounting configuration of the flow sensor FSP in the existing technology, and FIG. 3B is a cross-sectional view taken along the line A-A of FIG. 3A.

As shown in FIG. 3A, the flow sensor FSP in the existing technology has a rectangular-shaped wiring board WB, and is arranged such that a semiconductor chip CHP1 and a semiconductor chip CHP2 are arranged side by side along an X direction of this wiring board WB.

The semiconductor chip CHP1 is formed with a flow sensing unit FDU, and a gas flows above this flow sensing unit FDU. Specifically, the gas flows along the arrow direction (Y direction) above the flow sensing unit FDU. The flow sensing unit FDU formed on this semiconductor chip CHP1 is connected to the wirings WL1 provided on the semiconductor chip CHP1. These wirings WL1 are connected to wirings WL2 formed on a wiring board WB. At this time, in FIG. 3A, the wirings WL1 formed on the semiconductor chip CHP1 and a connecting region with the wirings WL2 formed on the wiring board WB are covered with potting resin POT. The wirings WL2 formed on the wiring board WB are connected to the semiconductor chip CHP2, and the semiconductor chip CHP2 is connected to wirings WL3 formed on the wiring board WB. Thus, the semiconductor chip CHP1 and the semiconductor chip CHP2, both of which are mounted on the wiring board WB, are electrically connected.

Next, as shown in FIG. 3B, a part of the region of the wiring board WB is formed with a groove, and the semiconductor chip CHP1 is arranged inside this groove. The rear surface of the semiconductor chip CHP1 is formed with a diaphragm DF, and the surface of the semiconductor chip CHP1 facing this diaphragm DF is formed with the flow sensing unit FDU. The surface of the semiconductor chip CHP1 apart from the flow sensing unit FDU is formed with the pads PD1. This flow sensing unit FDU and the pads PD1 are connected by the wirings WL1 shown in FIG. 3A.

The semiconductor chip CHP1 is fixed to the bottom of the groove by an adhesive ADH. Specifically, the rear surface of the semiconductor chip CHP1 facing the pads PD1 is applied with the adhesive ADH, and by this adhesive ADH, the semiconductor chip CHP1 is fixed to the bottom of the groove formed in the wiring board WB. On the other hand, in the rear surface of the semiconductor chip CHP1, the region in which the diaphragm DF is formed is not formed with the adhesive ADH, and the external space communicates with the inside of the diaphragm DF. As a result, the internal pressure of the diaphragm DF can be made equal to the pressure of the external space so that the stress caused by a difference in pressure is restrained from acting upon the flow sensing unit FDU, which is formed on the surface of the semiconductor chip CHP1 facing the diaphragm DF.

The pads PD1 formed on the semiconductor chip CHP1 are connected to wirings WL2 formed on the wiring board WB by wires W1, and these wires W1 are sealed with the potting resin POT.

On the other hand, the semiconductor chip CHP2 is connected to the wirings WL2 formed on the wiring board WB by a bump electrode BMP, and is also connected to wirings WL3 formed on the wiring board WB through the bump electrode.

Problem of Conventional Flow Sensor

Although the flow sensor FSP in the existing technique is thus configured to be mounted, the existing flow sensor FSP has the following problems. As described above, the gold wires (wires W1) connecting the semiconductor chip CHP1 and the wiring board WB are ordinarily fixed by the potting resin POT to prevent contact due to deformation and the like. In other words, the gold wires (wires W1) are covered and fixed by the potting resin POT, and the gold wires (wires W1) are protected by this potting resin POT. On the other hand, the semiconductor chip CHP1 and the semiconductor chip CHP2 configuring flow sensor FSP are ordinarily not sealed with the potting resin POT. That is, the ordinary flow sensor FSP has a structure in which the gold wires (wires W1) alone are covered with the potting resin POT.

Here, since the fixing of the gold wires (wires W1) by the potting resin POT is not performed in a state in which the semiconductor chip CHP1 is fixed by the die and the like, a problem arises that the semiconductor chip CHP1 is shifted from the mounting position due to contraction of the potting resin POT. Furthermore, there is a problem that dimension accuracy of the potting resin POT is low because the potting resin POT is formed by dripping. As a result, deviation occurs in the mounting position of the semiconductor chip CHP1 formed with the flow sensing unit FDU for each flow sensor FSP, and the forming position of the potting resin POT is also slightly different, and variations occur in the detection performance of each flow sensor FSP. Hence, to suppress performance variations of each flow sensor FSP, the detection performance needs to be corrected for each flow sensor FSP, and a necessity of adding a performance correction process to the manufacturing process of the flow sensor FSP arises. Particularly, when the performance correction process becomes long, the throughput in the manufacturing process of the flow sensor FSP is decreased, and a problem such as the increase in the cost of the flow sensor FSP is also posed.

Further, the potting resin POT takes time until it is cured because curing by heating is not accelerated, and the throughput in the manufacturing process of the flow sensor FSP ends up being decreased. Thus, it is found that because the mounting configuration of the existing flow sensor FSP is such that only the wires W1 are sealed with the potting resin POT with no excellent positional accuracy, a problem is created in that performance variations occur for each flow sensor FSP.

Mounting Configuration of Flow Sensor of First Embodiment

Hence, in the first embodiment, the mounting configuration of the flow sensor is devised in such a manner as to solve the problem of the performance variations that exist in the existing flow sensor FSP. The mounting configuration of the flow sensor of the first embodiment designed with such device will be described below with reference to the drawings.

Figure 4A:
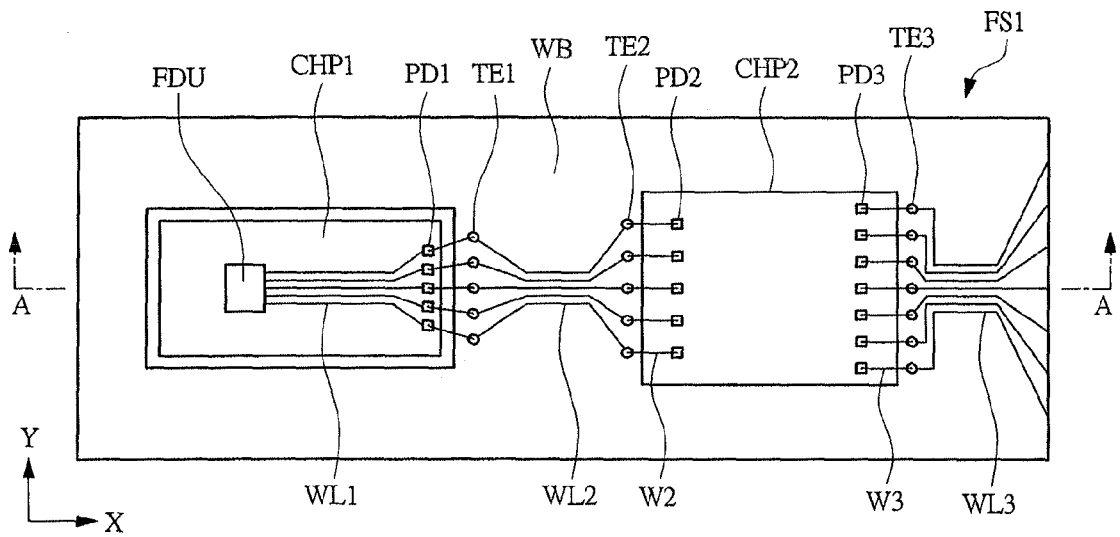
FIG. 4A is a plan view showing the mounting configuration before sealing the flow sensor according to the first embodiment.
Figure 4B:
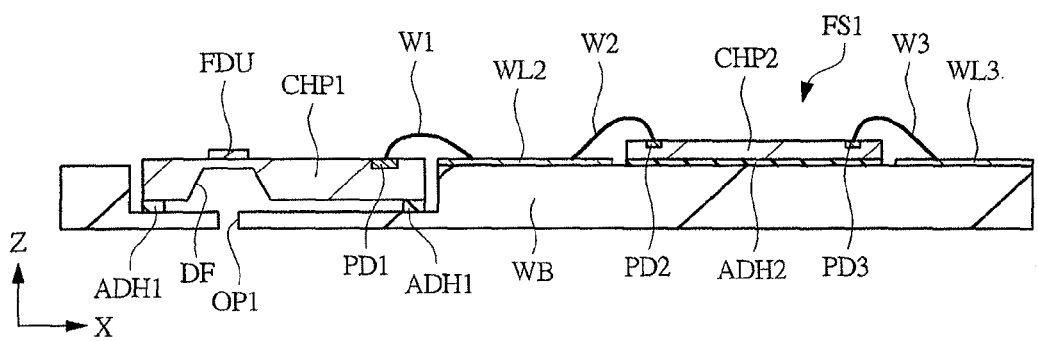
FIG. 4B is a cross-sectional view taken along the line A-A of FIG. 4A.
Figure 4C:
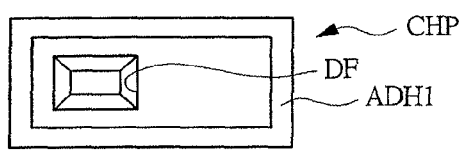
FIG. 4C is a plan view showing a rear surface of a semiconductor chip.

FIGS. 4A to 4C are views showing a mounting configuration of a flow sensor FS1 of the first embodiment, and are views of the configuration before the flow sensor FS1 is sealed with resin. Particularly, FIG. 4A is a plan view showing the mounting configuration of the flow sensor FS1 of the first embodiment. FIG. 4B is a cross-sectional view taken along the line A-A of FIG. 4A, and FIG. 4C is a plan view showing the rear surface of the semiconductor chip CHP1.

First, as shown in FIG. 4A, the flow sensor FS1 of the first embodiment, for example, has a rectangular-shaped wiring board WB composed of glass epoxy resin, and is mounting the semiconductor chip CHP1 and the semiconductor chip CHP2 in such a manner as to be side by side in the X direction on this wiring board WB. The semiconductor chip CHP1 is in a rectangular shape, and the flow sensing unit FDU is formed approximately in its center. The wirings WL1 connected to the flow sensing unit FDU are formed on the semiconductor chip CHP1, and these wirings WL1 are connected to a plurality of pads PD1 formed along one side of the semiconductor chip CHP1. That is, the flow sensing unit FDU and the plurality of pads PD1 are connected by the wirings WL1. These pads PD1 are connected to terminals TE1 formed on the wiring board WB through the wires W1 composed of, for example, gold wires. The terminals TE1 formed on the wiring board WB are connected to the wirings WL2 formed on the wiring board WB, and the wirings WL2 are connected to the terminals TE2. Further, the terminals TE2 are connected to the pads PD2 formed on the semiconductor chip CHP2 through the wires W2 composed of, for example, gold wires.

The semiconductor chip CHP2 is formed with integrated circuits composed of semiconductor elements such as MISFET (Metal Insulator Semiconductor Field Effect Transistor) and wirings. Specifically, the semiconductor chip CHP2 is formed with the integrated circuit configuring the CPU1, the input circuit 2, the output circuit 3, the memory 4 or the like as shown in FIG. 1. These integrated circuits are connected to the pads PD2 and pads PD3 that function as external connection terminals. The pads PD3 formed on the semiconductor chip CHP2 are connected to terminals TE3 formed on the wiring board WB through wires W3 composed of, for example, gold wires. These terminals TE3 are connected to the wirings WL3 formed on the wiring board WB. In this manner, it is understood that the semiconductor chip CHP1 formed with the flow sensing unit FDU and the semiconductor chip CHP2 formed with the control circuit are connected by the wirings WL2 formed on the wiring board WB.

Subsequently, as shown in FIG. 4B, a groove (cavity) is formed at a specific region of the wiring board WB, and inside this groove, there is mounted the semiconductor chip CHP1. This semiconductor chip CHP1 is bonded to the wiring board WB by an adhesive ADH1. The rear surface of the semiconductor chip CHP1 is formed with the diaphragm DF (thin plate part). The surface of the semiconductor chip CHP1 facing the diaphragm DF is formed with the flow sensing unit FDU. On the other hand, the bottom of the groove existing under the diaphragm DF is formed with an opening OP1.

The diaphragm DF has a function to easily make a minimum of heat-insulation of the flow sensing unit FDU formed on the surface of the semiconductor chip CHP1. In other words, the flow sensing unit FDU, as shown in FIG. 2, is formed with the upstream resistance thermometers UR1 and UR2 and the downstream resistance thermometers BR1 and BR2. In such a flow sensing unit FDU, the flow rate of the gas is detected by utilizing the fact that the temperatures of the upstream resistance thermometers UR1 and UR2 and the downstream resistance thermometers BR1 and BR2 are changed due to the flow rate of the gas, and the resistance values of the upstream resistance thermometers UR1 and UR2 and the downstream resistance thermometers BR1 and BR2 are changed by this temperature change. For this reason, it is desirable that the upstream resistance thermometers UR1 and UR2 and the downstream resistance thermometers BR1 and BR2 configuring the flow sensing unit FDU detect only the temperature change due to the flow rate of the gas, if possible, and eliminate the temperature change due to the influences such as heat conduction through the inside of the semiconductor chip CHP1. Thus, the rear surface of the semiconductor chip CHP1 facing the flow sensing unit FDU is provided with the diaphragm DF, which is a region reducing the thickness of the semiconductor chip CHP1, and thus, the influences of heat conduction toward the flow sensing unit FDU through the inside of the semiconductor chip CHP1 are reduced.

Although the diaphragm DF is provided in the semiconductor chip CHP1 because of the above-described reasons, when the internal space of this diaphragm DF is isolated from the external space of the semiconductor chip CHP1, the pressure of the external space and the internal pressure inside the diaphragm DF are made different. In this case, stress occurs in the diaphragm DF due to the difference between the pressure of the external space and the inner pressure inside the diaphragm DF, and there is fear that the detection accuracy of the flow sensing unit FDU formed on the diaphragm DF is decreased. Hence, in the first embodiment, the bottom of the groove existing under the diaphragm DF is provided with the opening OP1. Therefore, the internal space of the diaphragm DF communicates with the external space through the opening OP1, and the pressure of the external space can be made equal to the internal pressure inside the diaphragm DF. As a result, the application of the stress onto the diaphragm. DF can be suppressed, and the detection accuracy of the flow sensing unit FDU formed on the diaphragm DF can be prevented from being lowered.

As shown in FIG. 4B, the surface (top face) of the semiconductor chip CHP1 is formed with the pads PD1 connected to the flow sensing unit FDU in addition to the flow sensing unit FDU. These pads PD1 are connected to the wirings WL2 formed on the wiring board WB through the wires W1. The wiring board WB is mounting the semiconductor chip CHP2 also in addition to the semiconductor chip CHP1. The semiconductor chip CHP2 is bonded to the wiring board WB by adhesive ADH2. Further, the pads PD2 formed on the semiconductor chip CHP2 are connected to the wirings WL2 formed on the wiring board WB through the wires W2. The pads PD3 formed on the semiconductor chip CHP2 and the wirings WL3 formed on the wiring board WB are electrically connected by the wires W3.

The adhesive ADH1 that bonds the semiconductor chip CHP1 and the wiring board WB and the adhesive ADH2 that bonds the semiconductor chip CHP2 and the wiring board WB, for example, can use thermoset resin such as epoxy resin and polyurethane resin, and thermoplastic resin such as polyimide resin and acryl resin.

For example, the bonding of the semiconductor chip CHP1 to the wiring board WB, as shown in FIG. 4C, can be performed by applying the adhesive ADH1. FIG. 4C is a plan view showing the rear surface of the semiconductor chip CHP1. As shown in FIG. 4C, the rear surface of the semiconductor chip CHP1 is formed with the diaphragm DF, and the adhesive ADH1 is applied to surround this diaphragm DF. In FIG. 4C, an example of applying the adhesive ADH1 to surround the diaphragm DF in a square shape is shown, but the embodiment is not limited to this, and for example, the adhesive ADH1 may be applied to surround the diaphragm DF in an optional shape such as an elliptical shape.

In the flow sensor FS1 of the first embodiment, the mounting configuration of the flow sensor FS1 before being sealed with resin is as described above, and the mounting configuration of the flow sensor FS1 after being sealed with resin will be described below.

FIGS. 5A to 5C are views showing the mounting configuration of the flow sensor FS1 of the first embodiment, and are views showing the configuration after being sealed with resin. Particularly, FIG. 5A is a plan view showing the mounting configuration of the flow sensor FS1 of the first embodiment. FIG. 5B is a cross-sectional view taken along the line A-A of FIG. 5A, and FIG. 5C is a cross-sectional view taken along the line B-B of FIG. 5A.

First, as being understood by referring to FIG. 4A and FIG. 5A, the flow sensor FS1 of the first embodiment has a structure in which a part of the semiconductor chip CHP1 and the whole of the semiconductor chip CHP2 are covered with resin MR in a state in which the flow sensing unit FDU formed on the semiconductor chip CHP1 is exposed. This is a first feature of the first embodiment.

For example, the existing flow sensor FSP shown in FIGS. 3A and 3B has a structure in which the gold wires (wires W1) alone are covered with potting resin POT, and the semiconductor chip CHP1 and the semiconductor chip CHP2 are not covered with the resin. In this case, since the fixing of the gold wires (wires W1) by the potting resin POT is not performed when the semiconductor chip CHP1 is fixed by a die and the like, the semiconductor chip CHP1 is shifted from the mounting position by contraction of the potting resin POT. Furthermore, there is a problem that dimension accuracy of the potting resin POT is low because the potting resin POT is formed by dripping. This means that variations occur in the position of the semiconductor chip CHP1 for each flow sensor FSP. As a result, variations also occur in the position of the flow sensing unit FDU formed on the semiconductor chip CHP1. As a consequence, because the position of the flow sensing unit FDU detecting the flow rate of the gas is different for each flow sensor FSP, variations occur in the performance of detecting the flow rate of the gas in each flow sensor FSP.

In contrast to this, the flow sensor FS1 of the first embodiment has a structure, in which, as shown in FIG. 4A, a part of the semiconductor chip CHP1 and the whole of the semiconductor chip CHP2 are covered with the resin MR in a state in which the flow sensing unit FDU formed on the semiconductor chip CHP1 is exposed. In other words, in the first embodiment, the region of the semiconductor chip CHP1 except for the flow sensing unit FDU and the whole region of the semiconductor chip CHP2 are collectively sealed with the resin MR. The sealing with this resin MR can be performed in a state in which the semiconductor chip CHP1 formed with the flow sensor unit FDU is fixed by the mold. Therefore, a part of the semiconductor chip CHP1 and the semiconductor chip CHP2 can be sealed with the resin MR, while suppressing displacement of the semiconductor chip CHP1. This means that, according to the flow sensor FS1 of the first embodiment, a part of the semiconductor chip CHP1 and the whole region of the semiconductor chip CHP2 can be sealed with the resin MR, while suppressing the displacement of each flow sensor FS1 and also that variations of the position of the flow sensing unit FDU formed on the semiconductor chip CHP1 can be suppressed. As a result, according to the first embodiment, the position of the flow sensing unit FDU detecting the flow rate of the gas can be matched with each flow sensor FS1. Hence, prominent effects can be obtained where performance variations in detecting the flow rate of the gas in each flow sensor FS1 can be suppressed. In other words, in the first embodiment, from the viewpoint that the semiconductor chip CHP1 can be sealed with the resin MR, while being fixed by using the mold, a configuration is adopted in which a part of the semiconductor chip CHP1 and the semiconductor chip CHP2 are collectively sealed with the resin MR, while exposing the flow sensing unit FDU. That is, according to the first embodiment, since the sealing can be performed in a state in which the wiring board WB including the semiconductor chip CHP1 is being clamped by the mold, the positioning accuracy of the semiconductor chip CHP1 is improved, and further, the curing time of the resin MR can be made short due to heat conduction toward the resin MR injected from the mold. For example, the existing flow sensor FSP shown in FIG. 3 uses potting resin POT, but this potting resin POT is unable to make the time to heat and cure short, and thus the time of curing the potting resin POT becomes long. As a result, the throughput of the flow sensor is decreased, and the cost thereof is increased. In contrast to this, according to a first feature of the first embodiment, since the curing time of the resin MR can be shortened due to heat conduction toward the resin MR injected from the mold, the throughput can be improved with a result that the manufacturing cost of the flow sensor FS1 of the first embodiment can be reduced.

The resin MR, for example, can use a thermoset resin such as epoxy resin and phenol resin, and a thermoplastic resin such as polycarbonate, polyethylene terephthalate, and can mix a bulking agent such as glass and mica into resin.

Subsequently, a second feature of the first embodiment, as shown in FIG. 5A, lies in that the height of the resin MR (sealing body) at both sides across the exposed flow sensing unit FDU is higher than the height of the surface of the semiconductor chip CHP1 including the flow sensing unit FDU. In other words, the exposed flow sensing unit FDU has its periphery surrounded by the resin MR, and the height of the resin MR that surrounds the flow sensing unit FDU becomes higher than the height of the flow sensing unit FDU. To put it another way, in the first embodiment, the resin MR is formed with a recess, and the flow sensing unit FDU is formed inside the recess formed in this resin MR. Furthermore, in an optional cross-section including the flow sensing unit FDU that is orthogonal to the exposed surface (XY surface) of the semiconductor chip CHP1, the height dimension of the resin MR at both sides across the flow sensing unit FDU can be said to be larger than the exposed surface (XY surface) of the semiconductor chip CHP1. According to such a second feature of the second embodiment, since component parts can be prevented from colliding against the flow sensing unit FDU whose component parts are exposed at the time of mounting and assembling component parts, breakage of the semiconductor chip CHP1 formed with the flow sensing unit FDU can be prevented. That is, the height of the resin MR that clamps the flow sensing unit FDU becomes higher than the height of the exposed flow sensing unit FDU. For this reason, when the component parts contact the flow sensor, first, the component parts contact the resin MR whose height is high, and therefore, breakage of the semiconductor chip CHP1, which occurs when the exposed surface (XY surface) of the semiconductor chip CHP1 including the flow sensing unit FDU whose height is low contacts the component parts, can be prevented.

Particularly, according to the first embodiment, a majority of the region of the semiconductor chip CHP1 except for the exposed flow sensing unit FDU is covered with the resin MR. Even from this viewpoint, the semiconductor chip CHP1 is protected by the resin MR, and breakage of the semiconductor chip CHP1 can be suppressed. For example, as shown in FIGS. 3A and 3B, in the existing flow sensor FSP, because a majority of the region of the semiconductor chip CHP1 except for the flow sensing unit FDU is also exposed, the component parts contact the semiconductor chip CHP1 at the time of mounting and assembling component parts, and there is high possibility that the semiconductor chip CHP1 is broken. In contrast to this, according to the first embodiment, breakage of the semiconductor chip CHP1 can be effectively prevented by a combination of a characteristic point that a majority of the region of the semiconductor chip CHP1 except for the exposed flow sensing unit FDU is covered with the resin MR and a characteristic point that the exposed flow sensing unit FDU itself is lower in height than the height of the resin MR.

Next, a third feature of the first embodiment, as shown in FIG. 5A, lies in that a pair of air current control units FCU1 and FCU2 clamping the exposed flow sensing unit FDU and having a long shape in the direction parallel to the traveling direction (arrow direction, Y direction) of the gas that flows on the flow sensing unit FDU is formed integrally with the resin MR (sealing body). For example, in the existing flow sensor FSP shown in FIGS. 3A and 3B, though the gas flows in the Y direction on the upper part of the flow sensing unit FDU, the potting resin POT forms a flow path at one side of the gas flowing on the upper part of the flow sensing unit FDU. As a consequence, the gas flow is disturbed by dimension accuracy of the potting resin POT, and the accurate flow rate of the gas is likely not to be measured. Furthermore, in the existing flow sensor FSP shown in FIGS. 3A and 3B, since the potting resin POT that forms a flow path is not arranged for the flow sensing unit FDU at the side facing the potting resin POT, the gas is unable to flow above the upper part of the flow sensing unit FDU in a state in which the dimension of the gas flow path is reduced. Consequently, particularly, when the flow rate of the gas that flows is few, a problem arises that the detection accuracy of the flow rate of the gas is lowered.

In contrast to this, a third feature of the first embodiment lies in that a pair of air current control units FCU1 and FCU2 that clamp the exposed flow sensing unit FDU and having a long shape in the direction parallel to the traveling direction (arrow direction, Y direction) of the gas that flows on the flow sensing unit FDU is formed integrally with the resin MR (sealing body). Thereby, first, the pair of air current control units FCU1 and FCU2 forms the flow paths of both sides of the gas that flows on the upper part of the flow sensing unit FDU. The pair of air current control units FCU1 and FCU2 is formed integrally with the resin MR with high accuracy by clamping with a die of high dimension accuracy. As a consequence, according to the flow sensor FS1 of the first embodiment, a flow of the gas is not disturbed by dimension accuracy of the pair of air current control units FCU1 and FCU2, and the flow rate of the gas can be accurately measured. Furthermore, in the first embodiment, as described above, the pair of air current control units FCU1 and FCU2 forms the flow paths of both sides of the gas that flows above the flow sensing unit FDU. Hence, the gas can be let flow above the flow sensing unit FDU in a state in which the gas flow path dimension is made narrower. As a result, according to the flow sensor FS1 of the first embodiment, particularly even when the flow rate of the gas that flows is small, lowering of the detection accuracy of the gas flow rate can be suppressed.

A fourth feature of the first embodiment, as shown in FIG. 5B, lies in that an interface region between the flow sensing unit FDU exposed from the resin MR (sealing body) and the resin MR (sealing body) has a tapered shape. In the interface region, the tapered shape of the interface region orthogonal to the traveling direction (arrow direction, Y direction) of the gas that flows on the flow sensing unit FDU is steeper than the tapered shape of the interface region parallel to the traveling direction of the gas. That is, the angle of the tapered shape TP2 of the direction (X direction) orthogonal to the flow of the gas of the flow sensing unit FDU is steeper than the angle of a tapered shape TP1 in the gas flow direction (Y direction) of the flow sensing unit FDU. Thus, in the first embodiment, the angle of the tapered shape TP1 is made small in the gas flow direction (Y direction) so that the dimension change of the flow path of the gas that flows to the Y direction can be made less. This can prevent the gas from separating from the resin MR and can suppress deviations of measurement of the flow rate due to back-flow and eddy-flow of the gas. On the other hand, by increasing the angle of a tapered shape TP2 in the direction (X direction) orthogonal to the gas flow direction, the wall of the gas flow path can be formed, and the flow of the gas to the X direction can be suppressed.

Next, while the flow sensor FS1 of the first embodiment has a fifth feature and a sixth feature, as s premise of describing these features, the structure of FIGS. 5B and 5C will be described. FIG. 5B is a cross-sectional view taken along the line A-A of FIG. 5A, and FIG. 5C is a cross-sectional view taken along the line B-B of FIG. 5A.

As shown in FIG. 5B, a groove is formed in the wiring board WB, and the semiconductor chip CHP1 is bonded inside this groove by the adhesive ADH1. The rear surface of the semiconductor chip CHP1 is formed with the diaphragm DF, and the bottom of the groove existing under this diaphragm DF is formed with the opening OP1. On the other hand, the surface of the semiconductor chip CHP1 facing the diaphragm DF is formed with the flow sensing unit FDU, and further, is formed with the pads PD1 that are connected to this flow sensing unit FDU. These pads PD1 are connected to the wirings WL2 formed on the wiring board WB through the wires W1. The wirings WL2 are connected to the pads PD2 formed on the semiconductor chip CHP2 on the wiring board WB through the ADH2 by the wires W2. The pads PD3 formed on the semiconductor chip CHP2 are connected to the wirings WL3 formed on the wiring board WB through the wires W3. In the flow sensor FS1 of the first embodiment, in a state in which the flow sensing unit FDU and its vicinity are exposed, the other region (including the pads PD1), that is, a part of the semiconductor chip CHP1, the wires W1, the wirings WL2, the wires W2, the semiconductor chip CHP2, the wires W3, and a part of the wirings WL3 are collectively sealed with the resin MR. At this time, the interface region between the exposed flow sensing unit FDU and the resin MR is in a tapered shape TP2, and the pair of air stream control units FCU1 and FCU2 is integrally formed with the resin MR in such a manner as to clamp the flow sensing unit FDU.

As shown in FIG. 5C, the wiring board WB is formed with a groove, and the semiconductor chip CHP1 is bonded inside this groove by the adhesive ADH1. The rear surface of the semiconductor chip CHP1 is formed with the diaphragm DF, and the bottom of the groove existing under this diaphragm DF is formed with the opening OP1. On the other hand, the surface of the semiconductor chip CHP1 facing the diaphragm DF is formed with the flow sensing unit FDU, and the resin MR is formed in such a manner as to surround the periphery of the semiconductor chip CHP1. At this time, the interface region between the flow sensing unit FDU and the resin MR is in the tapered shape TP1, and the angle of this tapered shape TP1 is gentler than the angle of the tapered shape TP2 shown in FIG. 5B.

Here, the fifth feature of the first embodiment, as shown in FIGS. 5B and 5C, lies in that the bottom of the groove existing under the diaphragm DF formed on the rear side of the semiconductor chip CHP1 is formed with the opening OP1. The reason why the opening OP1 is provided on the wiring board WB in this way in the first embodiment will be described below.

First, in the existing flow sensor FSP shown in FIGS. 3A and 3B, as shown in FIG. 3B, the adhesive ADH is applied only to the one-side terminal of the semiconductor chip CHP1, and the other side terminal is not applied with the adhesive ADH, but is formed with a gap. Thus, in the existing flow sensor FSP, the internal space of the diaphragm DF formed on the semiconductor chip CHP1 communicates with the external space of the flow sensor FSP through this gap, and the pressure of the internal space of the diaphragm DF can be made equal to the pressure of the external space of the flow sensor FSP. In this way, in the existing flow sensor FSP, the stress applied on the diaphragm DF can be suppressed.

On the other hand, the flow sensor FS1 of the first embodiment shown in FIGS. 5B and 5C is unable to adopt the same configuration as that of the existing flow sensor FSP shown in FIG. 3. This is because the flow sensor FS1 of the first embodiment is configured such that the region of the semiconductor chip CHP1 excluding the flow sensing unit FDU and its vicinity is covered with the resin MR. In other words, in the first embodiment, when a gap is formed between the semiconductor chip CHP1 and the bottom of the groove, the resin M infiltrates into the internal space of the diaphragm DF from this gap. As a consequence, in the first embodiment, both terminals of the semiconductor chip CHP1 are applied with the adhesive ADH1, and by this adhesive ADH1, the resin MR is prevented from infiltrating the internal space of the diaphragm. DF. That is, in the flow sensor FS1 of the first embodiment, the adhesive ADH1 has a primary function of bonding the semiconductor chip CHP1 on the wiring board WB, and has also a function unique to the first embodiment of preventing the resin MR from infiltrating into the internal space of the diaphragm. DF. To realize the unique function by this adhesive ADH1, in the first embodiment, for example, as shown in FIG. 4C, the adhesive ADH1 is applied to the rear surface of the semiconductor chip CHP1 to surround the diaphragm DF formed on the rear surface of the semiconductor chip CHP1.

When such a configuration is adopted and the bottom of the groove of the wiring board WB is not formed with the opening OP1, the internal space of the diaphragm DF is isolated from the external space of the flow sensor FS1, and the pressure of the internal space of the diaphragm DF becomes different from the pressure of the external space of the flow sensor FS1, and the stress caused by the pressure difference is applied to the diaphragm DF. Hence, in the first embodiment, to prevent the resin MR from infiltrating into the internal space of the diaphragm DF, for example, as shown in FIG. 4C, it is premised on using a configuration in which the adhesive ADH1 is applied to surround the diaphragm DF formed on the rear surface of the semiconductor chip CHP1, and to avoid inconvenience due to such a configuration, as shown in FIGS. 5B and 5C, the bottom of the groove existing under the diaphragm DF formed on the rear surface of the semiconductor chip CHP1 is formed with the opening OP1. Thus, according to the flow sensor FS1 according to the first embodiment, the internal space of the diaphragm DF communicates with the external space of the flow sensor FS1 through the opening OP1 that is formed at the bottom of the groove of the wiring board WB. As a result, the pressure of the internal space of the diaphragm DF can be made equal to the pressure of the external space of the flow sensor FS1 so that the stress applied on the diaphragm DF can be suppressed.

Subsequently, the sixth feature of the first embodiment lies in that not only the semiconductor chip CHP1 and the wiring board WB, but also the semiconductor chip CHP2 and the wiring board WB are connected by wires W2 and W3. For example, in the existing flow sensor FSP shown in FIGS. 3A and 3B, the semiconductor chip CHP2 is connected to the wiring board WB by using a bump electrode BMP. This is because, when the semiconductor chip CHP2 is also connected by the wires, these wires need to be protected and sealed with the potting resin POT. In other words, as shown in FIGS. 3A and 3B, since the semiconductor chip CHP1 and the wiring board WB are connected by the wires W1, these wires W1 need to be sealed with the potting resin POT. However, when the semiconductor chip CHP2 and the wiring board WB are connected by the wires W2 and W3, these wires W2 and W3 also need to be protected by the potting resin POT. Hence, in the existing flow sensor FSP, the semiconductor chip CHP2 is connected to the wiring board WB by the bump electrode BMP, thereby omitting further sealing with the potting resin POT. However, when the semiconductor chip CHP2 is connected to the wiring board WB by using the bump electrode, for example, a solder ball needs to be used, and this creates a problem that the manufacturing cost of the flow sensor is increased.

Hence, in the first embodiment, not only the semiconductor chip CHP1 and the wiring board WB, but also the semiconductor chip CHP2 and the wiring board WB are connected by the wires W2 and W3. This configuration can be realized by adopting a characteristic configuration according to the first embodiment in which the whole of the semiconductor chip CHP1 excluding the flow sensing unit FDU and its vicinity and the semiconductor chip CHP2 is collectively sealed with the resin MR. In other words, according to the first embodiment, since the semiconductor chip CHP2 is also collectively sealed with the resin MR, even when the semiconductor chip CHP2 and the wiring board WB are connected by the wires W2 and W3, the wires W2 and W3 can be also protected by the resin MR simultaneously with the wires W1 that connect the semiconductor chip CHP1 and the wiring board WB. In other words, since the first embodiment collectively seals the semiconductor chip CHP1 and the semiconductor chip CHP2 by the resin MR, regardless of whether the connection between the semiconductor chip CHP2 and the wiring board WB is performed by the bump electrode or the wires, the sealing of the resin MR is completed at one time. Consequently, in the first embodiment, although the solder ball is not used, the semiconductor chip CHP2 is connected to the wiring board WB by using the wires W2 and W3, thereby reducing the manufacturing cost of the flow sensor.

Manufacturing Method of Flow Sensor of First Embodiment

The flow sensor FS1 of the first embodiment is configured as described above, and its manufacturing method will be described below with reference to FIGS. 6 to 10. FIGS. 6 to 10 show a manufacturing process in the cross-section taken along the line A-A of FIG. 5A.

Figure 6:
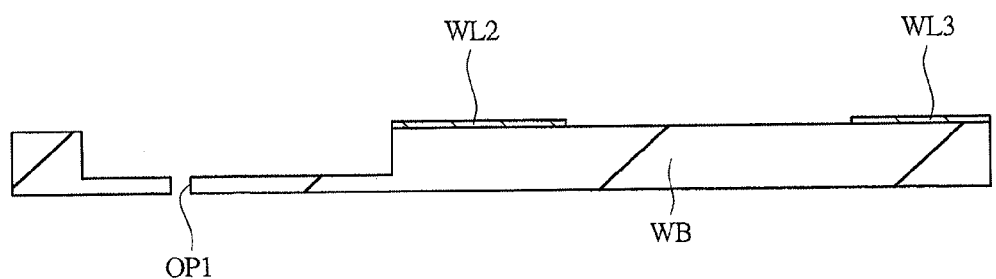
FIG. 6 is a cross-sectional view showing a manufacturing process of the flow sensor according to the first embodiment.

First, as shown in FIG. 6, for example, a wiring board WB composed of glass epoxy resin is prepared. The main surface (surface, top face) of this wiring board WB is formed with a groove, and an opening OP1 is formed at the bottom of the groove. On the other hand, the main surface of the wiring board WB is also formed with the wirings WL2 and also the wirings WL3.

Figure 7:
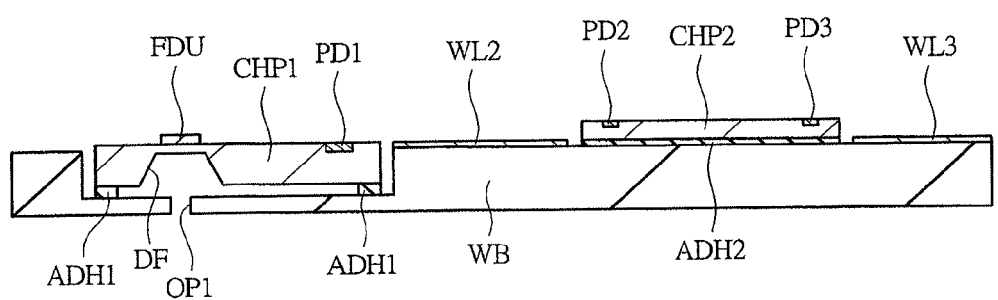
FIG. 7 is a cross-sectional view showing the manufacturing process of the flow sensor continued from FIG. 6.

Subsequently, as shown in FIG. 7, the semiconductor chip CHP1 and the semiconductor chip CHP2 are mounted on the wiring board WB. Specifically, the semiconductor chip CHP1 is connected to the inside of the groove formed in the wiring board WB by the adhesive ADH1. At this time, the semiconductor chip CHP1 is mounted on the wiring board WB so that the diaphragm DF formed on the semiconductor chip CHP1 communicates with the opening OP1 formed in the wiring board WB. The semiconductor chip CHP1 is formed with the flow sensing unit FDU, wirings (not shown), and the pads PD1 by the ordinary semiconductor manufacturing process, and the diaphragm DF is formed at the position of the rear surface of the semiconductor chip CHP1 facing the flow sensing unit FDU formed on the surface of the semiconductor chip CHP1, for example, by anisotropic etching. Further, the semiconductor chip CHP2 is also mounted on the wiring board WB by the adhesive ADH2. This semiconductor chip CHP2 is formed previously with semiconductor elements (not shown) such as MISFETs and wirings (not shown), the pads PD2, and the pads PD3 by the ordinary semiconductor manufacturing process.

Figure 8:
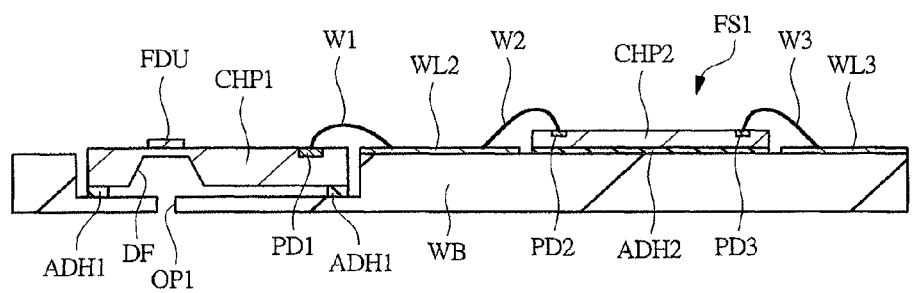
FIG. 8 is a cross-sectional view showing the manufacturing process of the flow sensor continued from FIG. 7.

Next, as shown in FIG. 8, the pads PD1 formed on the semiconductor chip CHP1 and the wirings WL2 formed on the wiring board WB are connected by the wires W1 (Wire Bonding). Similarly, the pads PD2 formed on the semiconductor chip CHP2 are connected to the wirings WL2 by the wires W2, and the pads P3 formed on the semiconductor chip CHP2 are connected to the wirings WL3 by the wires W3. The wires W1 to W3 are formed, for example, by gold wires.

Figure 9:
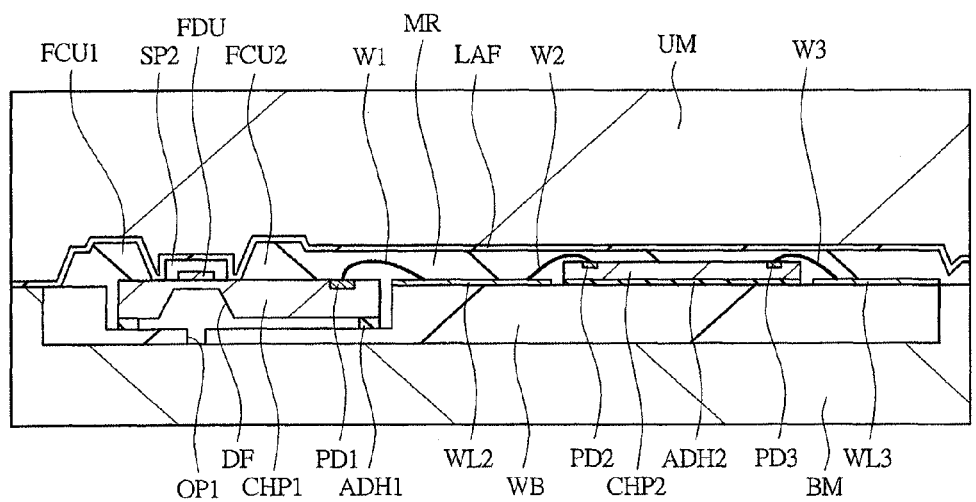
FIG. 9 is a cross-sectional view showing the manufacturing process of the flow sensor continued from FIG. 8.

After that, as shown in FIG. 9, the surface of the semiconductor chip CHP1 excluding the flow sensing unit FDU and its vicinity, the wires W1, the wirings WL2, the wires W2, the whole main surface of the semiconductor chip CHP2, the wires W3, and the wirings WL3 are sealed with the resin MR (molding process). Specifically, as shown in FIG. 9, the wiring board WB mounting the semiconductor chip CHP1 and the semiconductor chip CHP2 is clamped by an upper die UM and a lower die BM interposing a first space. After that, the resin MR is poured into the first space under heating, and as a result, the surface of the semiconductor chip CHP1 excluding the flow sensing unit FDU and its vicinity, the wires W1, the wirings WL2, the wires W2, the whole main surface of the semiconductor chip CHP2, the wires W3, and the wirings WL3 are sealed with the resin MR. At this time, as shown in FIG. 9, the internal space of the diaphragm DF is isolated from the first space by the adhesive ADH1, and this prevents the resin MR from infiltrating into the internal space of the diaphragm DF upon also filling the first space with the resin MR.

Further, in the first embodiment, the sealing can be performed in a state in which the semiconductor chip CHP1 formed with the flow sensing unit FDU is fixed by the mold, and consequently, a part of the semiconductor chip CHP1 and the semiconductor chip CHP2 can be sealed with the resin MR, while suppressing the displacement of the semiconductor chip CHP1. This means that, according to the manufacturing method of the flow sensor of the first embodiment, a part of the semiconductor chip CHP1 and the whole region of the semiconductor chip CHP2 can be sealed with the resin MR, while suppressing the displacement of each flow sensor, and also that variations of the position of the flow sensing unit FDU formed on the semiconductor chip CHP1 can be suppressed. As a result, according to the first embodiment, because the position of the flow sensing unit FDU detecting the flow rate of the gas can be matched with each flow sensor, prominent effects can be obtained where performance variations in detecting the gas flow rate can be suppressed in each flow sensor.

Here, the feature of the manufacturing method of the flow sensor of the first embodiment lies in that the wiring board WB mounting the semiconductor chip CHP1 is clamped by the lower die BM and the upper die UM so that the flow sensing unit FDU formed on the semiconductor chip CHP1 is surrounded by the second space SP2 isolated from the first space. Thereby, according to the first embodiment, while exposing the flow sensing unit FDU formed on the semiconductor chip CHP1 and its vicinity, the other surface region of the semiconductor chip CHP1 can be sealed.

Further, the feature of the manufacturing method of the flow sensor of the first embodiment lies in that, when the wiring board WB mounting the semiconductor chip CHP1 is clamped by the upper die UM and the lower die BM, an elastic film LAF is interposed between the wiring board WB mounting the semiconductor chip CHP1 and the upper die UM. For example, since there are dimensional variations in the thickness of individual semiconductor chip CHP1, when the thickness of the semiconductor chip CHP1 is thinner than an average thickness, a gap occurs when the wiring board WB mounting the semiconductor chip CHP1 is clamped by the upper die UM and the lower die BM and the resin MR leaks onto the semiconductor chip CHP1 from this gap. On the other hand, when the thickness of the semiconductor chip CHP1 is thicker than the average thickness, force applied to the semiconductor chip CHP1 becomes large when the wiring board WB mounting the semiconductor chip CHP1 is clamped by the upper die UM and the lower die BM, and there is fear that the semiconductor chip CHP1 is broken.

Hence, in the first embodiment, to prevent a leakage of the resin onto the semiconductor chip CHP1 due to thickness variations of the semiconductor chip CHP1 or breakage of the semiconductor chip CHP1, a device of interposing an elastic film LAF between the wiring board WB mounting the semiconductor chip CHP1 and the upper die UM is employed. In this manner, for example, when the thickness of the semiconductor chip CHP1 is thinner than the average thickness, a gap occurs when the wiring board WB mounting the semiconductor chip CHP1 is clamped by the upper die UM and the lower die BM, but since this gap can be filled up with the elastic film LAF, the leakage of the resin onto the semiconductor chip CHP1 can be prevented. On the other hand, when the thickness of the semiconductor chip CHP1 is thicker than the average thickness, in the case the wiring board WB mounting the semiconductor chip CHP1 is clamped by the upper die UM and the lower die BM, since the elastic film LAF is soft, a dimension in the thickness direction of the elastic film LAF changes so as to absorb the thickness of the semiconductor chip CHP1. In this manner, even when the thickness of the semiconductor chip CHP1 is thicker than the average thickness, force application to the semiconductor chip CHP1 more than necessary can be prevented. As a result, breakage of the semiconductor chip CHP1 can be prevented.

As the elastic film LAF, for example, high-polymer materials such as Teflon (Registered Trademark) and fluorine resin can be used.

Figure 10:
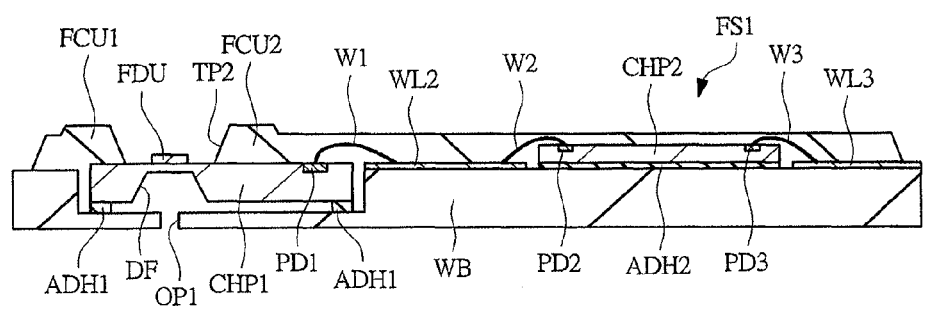
FIG. 10 is a cross-sectional view showing the manufacturing process of the flow sensor continued from FIG. 9.

After that, as shown in FIG. 10, the wiring board WB mounting the semiconductor chip CHP1 and the semiconductor chip CHP2 is dismounted from the upper die UM and the lower die BM at the stage of having cured the resin MR. Thereby, the flow sensor FS1 of the first embodiment can be manufactured.

Second Embodiment

In the first embodiment, an example of a pair of air current control units FCU1 and FCU2 integrally formed with the resin MR (sealing body) has been described, in which the pair of air current control units FCU1 and FCU2 clamps an exposed flow sensing unit FDU and has a rectangular shape in the direction parallel to the traveling direction of the gas flowing on a flow sensing unit FDU. In a second embodiment, a flow sensor not provided with the air current control units FCU1 and FCU2 will be described.

FIGS. 11A to 11C are views showing a mounting configuration of a flow sensor FS2 of the second embodiment, and are views showing the configuration after the flow sensor FS2 is sealed with resin. Particularly, FIG. 11A is a plan view showing the mounting configuration of the flow sensor FS2 of the second embodiment. FIG. 11B is a cross-sectional view taken along the line A-A of FIG. 11A, and FIG. 11C is a cross-sectional view taken along the line B-B of FIG. 11A.

The mounting configuration of the flow sensor FS2 of the second embodiment is the same as that of the flow sensor FS1 of the first embodiment except that the air current control units FCU1 and FCU2 are not provided. Consequently, the flow sensor FS2 of the second embodiment has also the first feature to the second feature and the fourth feature to the sixth feature as explained in the first embodiment.

Specifically, the flow sensor FS2 of the second embodiment also has a structure, in which as shown in FIG. 11A, a part of a semiconductor chip CHP1 and the whole of a second semiconductor CHP2 are covered with resin MR in a state in which a flow sensing unit FDU formed on the semiconductor chip CHP1 is exposed (the first feature). In other words, in the second embodiment, the region of the semiconductor chip CHP1 except for the flow sensing unit FDU and the whole region of the semiconductor chip CHP2 are collectively sealed with the resin MR. This sealing with the resin MR can be performed in a state in which the semiconductor chip CHP1 formed with the flow sensing unit FDU is fixed by a mold. Therefore, a part of the semiconductor chip CHP1 and the semiconductor chip CHP2 can be sealed with the resin MR, while suppressing the displacement of the semiconductor chip CHP1. This means, according to the flow sensor FS2 of the second embodiment, that apart of the semiconductor chip CHP1 and the whole region of the semiconductor chip CHP2 can be sealed with the resin MR, while suppressing the displacement of each flow sensor FS2, and also that variations of the position of the flow sensing unit FDU formed on the semiconductor chip CHP1 can be suppressed. As a result, according to the second embodiment, because the position of the flow sensing unit FDU detecting a flow rate of gas can be matched with each flow sensor FS2, prominent effects can be obtained where performance variations in detecting the gas flow rate can be suppressed in each flow sensor FS2.

Subsequently, also in the flow sensor FS2 of the second embodiment, as shown in FIG. 11A, the height of the resin MR (sealing body) at both sides across the exposed flow sensing unit FDU becomes higher than the height of the surface of the semiconductor chip CHP1 including the flow sensing unit FDU (the second feature). In other words, the exposed flow sensing unit FDU has its periphery surrounded by the resin MR, and the height of the resin MR that surrounds the flow sensing unit FDU becomes higher than the height of the flow sensing unit FDU. According to such a second feature of the second embodiment, because the component parts can be prevented from colliding against the exposed flow sensing unit FDU upon mounting and assembling component parts, breakage of the semiconductor chip CHP1 formed with the flow sensing unit FDU can be prevented. That is, the height of the resin MR that clamps the flow sensing unit FDU becomes higher than the height of the exposed flow sensing unit FDU. For this reason, when the component parts contact the flow sensor, first, the component parts contact the resin MR whose height is high, and therefore, breakage of the semiconductor chip CHP, which occurs when the exposed surface (XY surface) of the semiconductor chip CHP1 including the flow sensing unit FDU whose height is low contacts the component parts, can be prevented.

Further, also in the flow sensor FS2 of the second embodiment, as shown in FIG. 11A, the interface region between the flow sensing unit FDU exposed from the resin MR (sealing body) and the resin MR (sealing body) is in a tapered shape, and in the interface region, the tapered shape of the interface region orthogonal to the traveling direction (arrow direction, Y direction) of the gas that flows above the flow sensing unit FDU is steeper than the tapered shape of the interface region parallel to the traveling direction of the gas (the fourth feature). That is, the angle of the tapered shape TP2 in the direction (X direction) orthogonal to the flow of the gas of the flow sensing unit FDU is steeper than the angle of a tapered shape TP1 in the gas flow direction (Y direction) of the flow detection sensor FDU. Thus, in the second embodiment, by reducing the angle of the tapered shape TP1 in the gas flow direction (Y direction), the dimension change of the flow path of the gas flowing in the Y direction can be reduced. This can prevent the gas from separating from the resin MR and can suppress deviations of measurement of the flow rate due to back-flow and eddy-flow of the gas. On the other hand, by increasing the angle of a tapered shape TP2 in the direction (X direction) orthogonal to the gas flow direction, the wall of the gas flow path can be formed, and the flow of the gas to the X direction can be suppressed.

Further, also in the second embodiment, to prevent the resin MR from infiltrating into the internal space of the diaphragm DF, for example, it is premised on using a configuration in which the adhesive ADH1 is applied to surround the diaphragm DF formed on the rear surface of the semiconductor chip CHP1, and to avoid inconvenience due to such configuration, as shown in FIGS. 11B and 11C, the bottom of the groove existing under the diaphragm DF formed on the rear surface of the semiconductor chip CHP1 is formed with an opening OP1 (the fifth feature). In this manner, according to the flow sensor FS2 of the second embodiment, the internal space of the diaphragm DF communicates with the external space of the flow sensor FS2 through the opening OP1 formed at the bottom of the groove of the wiring board WB. As a result, the pressure of the internal space of the diaphragm DF can be made equal to the pressure of the external space of the flow sensor FS2 so that the stress applied on the diaphragm DF can be suppressed.

Also in the flow sensor FS2 of the second embodiment, not only the semiconductor chip CHP1 and the wiring board WB, but also the semiconductor chip CHP2 and the wiring board WB are connected by the wires W2 and W3 (the sixth feature). Thus, in the second embodiment, a solder ball is not used, and therefore, the manufacturing cost of the flow sensor can be reduced.

Third Embodiment

In a third embodiment, to solve a problem of deterioration of the performance of a flow sensor FSP due to variations of the performance existing in the existing flow sensor FSP, a device is applied to the mounting configuration of a flow sensor. The devised mounting configuration of the flow sensor according to the third embodiment will be described below with reference to the drawings.

In the first embodiment and the second embodiment, an example of mounting the semiconductor chip CHP1 and the semiconductor chip CHP2 on the wiring board WR has been described. In the third embodiment, an example of using a lead frame instead of the wiring board WB will be described.

Figure 12A:
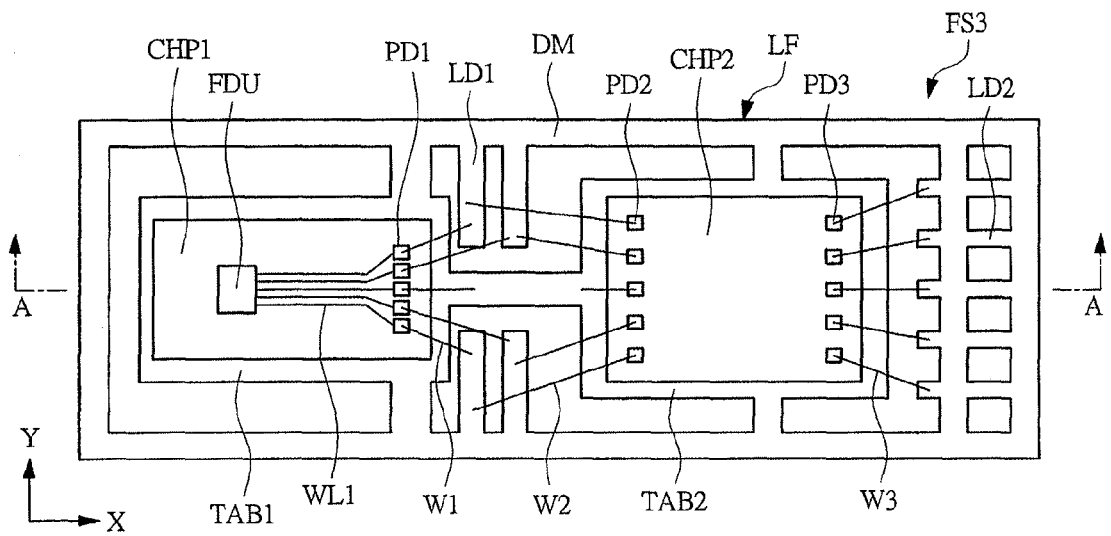
FIG. 12A is a plan view showing the mounting configuration before sealing the flow sensor according to a third embodiment.
Figure 12B:
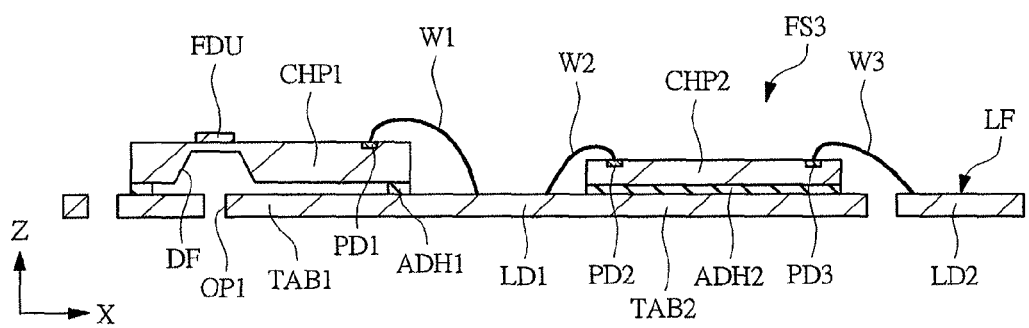
FIG. 12B is a cross-sectional view taken along the line A-A of FIG. 12A.
Figure 12C:
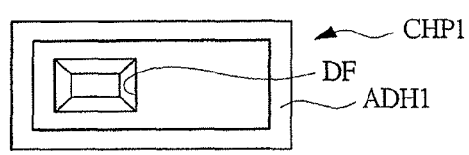
FIG. 12C is a plan view showing a rear surface of a semiconductor chip.

FIGS. 12A to 12C are views showing the mounting configuration of a flow sensor FS3 of the third embodiment, and are views showing a configuration before the flow sensor FS3 is sealed with resin. Particularly, FIG. 12A is a plan view showing the mounting configuration of the flow sensor FS3 of the third embodiment. FIG. 12B is a cross-sectional view taken along the line A-A of FIG. 12A, and FIG. 12C is a plan view showing the rear surface of the semiconductor chip CHP1.

First, as shown in FIG. 12A, the flow sensor FS3 of the third embodiment, for example, has a lead frame LF composed of a copper material. This lead frame LF has a chip mounting unit TAB1 and a chip mounting unit TAB2 in the inside surrounded by a dam bar DM configuring an outer frame body. The semiconductor chip CHP1 is mounted on the chip mounting unit TAB1, and the semiconductor chip CHP2 is mounted on the chip mounting unit TAB2.

The semiconductor chip CHP1 is in a rectangular shape, and the flow sensing unit FDU is formed approximately in its center. Wirings WL1 connected to the flow sensing unit FDU are formed on the semiconductor chip CHP1. These wirings WL1 are connected to a plurality of pads PD1 that are formed along one side of the semiconductor chip CHP1. That is, the flow sensing unit FDU and the plurality of pads PD1 are connected by the wirings WL1. These pads PD1 are connected to leads LD1 formed on the lead frame LF through the wires W1 composed of, for example, gold wires. The leads LD1 formed on the lead frame LF are further connected to pads PD2 formed on the semiconductor chip CHP2 through wires W2 composed of, for example, gold wires. The outermost surface (device forming surface) of the semiconductor chip CHP1 may be formed with a polyimide film designed for the purpose of the stress buffer function with the resin to be bonded, the surface protection function, the insulation protection function, or the like.

The semiconductor chip CHP2 is formed with integrated circuits composed of semiconductor elements such as MIS-FET (Metal Insulator Semiconductor Field Effect Transistor) and wirings. Specifically, the semiconductor chip CHP2 is formed with integrated circuits configuring a CPU1, an input circuit 2, an output circuit 3 or a memory 4 and the like, all of which are shown in FIG. 1. These integrated circuits are connected to the pads PD2 and the pads PD3 that function as external connection terminals. The pads PD3 formed on the semiconductor chip CHP2 are connected to leads LD2 formed on the lead frame LF through wires W3 composed of, for example, gold wires. In this way, it is found that the semiconductor chip CHP1 formed with the flow sensing unit FDU and the semiconductor chip CHP2 formed with the control circuit are connected through the leads LD1 formed on the lead frame LF.

Subsequently, as shown in FIG. 12B, the lead frame LF is formed with the chip mounting unit TAB1, and the semiconductor chip CHP1 is mounted on this chip mounting unit TAB1. This semiconductor chip CHP1 is bonded to the chip mounting unit TAB1 by an adhesive ADH1. The rear surface of the semiconductor chip CHP1 is formed with a diaphragm DF (thin plate part), and the surface of the semiconductor chip CHP1 facing the diaphragm DF is formed with the flow sensing unit FDU. On the other hand, the bottom of the chip mounting unit TAB1 existing under the diaphragm DF is formed with an opening OP1.

Further, as shown in FIG. 12B, the surface (top face) of the semiconductor chip CHP1 is formed with the pads PD1 that are connected to the flow sensing unit FDU in addition to the flow sensing unit FDU. These pads PD1 are connected to the leads LD1 formed on the lead frame LF through the wires W1. The lead frame LF is also mounting the semiconductor chip CHP2 in addition to the semiconductor chip CHP1, and the semiconductor chip CHP2 is bonded on the chip mounting unit TAB2 by an adhesive ADH2. Further, the pads PD2 formed on the semiconductor chip CHP2 and the leads LD1 formed on the lead frame LF are connected through the wires W2. Further, the pads PD3 formed on the semiconductor chip CHP2 and the leads LD2 formed on the lead frame LF are electrically connected through the wires W3.

As the adhesive ADH1 that bonds the semiconductor chip CHP1 and the chip mounting unit TAB1 and the adhesive ADH2 that bonds the semiconductor chip CHP2 and the chip mounting unit TAB2, for example, a thermoset resin such as epoxy resin and polyethylene resin, and a thermoplastic resin such as polyimide resin and acryl resin can be used.

For example, the bonding of the semiconductor chip CHP1 to the chip mounting unit TAB1, as shown in FIG. 12C, can be performed by applying the adhesive ADH1. FIG. 12C is a plan view showing the rear surface of the semiconductor chip CHP1. As shown in FIG. 12C, the rear surface of the semiconductor chip CHP1 is formed with the diaphragm DF, and the adhesive ADH1 is applied to surround this diaphragm DF. In FIG. 12C, an example of applying the adhesive ADH1 to surround the diaphragm DF in a square shape is shown, but the embodiment is not limited to this, and for example, the adhesive ADH1 may be applied to surround the diaphragm DF in an optional shape such as an elliptical shape.

In the flow sensor FS3 of the third embodiment, the mounting configuration of the flow sensor FS3 before being sealed with resin is configured as described above, and the mounting configuration of the flow sensor FS3 after being sealed with resin will be described below.

FIGS. 13A to 13C are views showing the mounting configuration of the flow sensor FS3 according to the third embodiment, and are views showing the configuration after being sealed with resin. Particularly, FIG. 13A is a plan view showing the mounting configuration of the flow sensor FS3 of the third embodiment. FIG. 13B is a cross-sectional view taken along the line A-A of FIG. 13A, and FIG. 13C is a cross-sectional view taken along the line B-B of FIG. 13A.

The flow sensor FS3 of the third embodiment also has a structure, in which, as shown in FIG. 13A, a part of the semiconductor chip CHP1 and the whole of the semiconductor chip CHP2 are covered with the resin MR in a state in which the flow sensing unit FDU formed on the semiconductor chip CHP1 is exposed (the first feature). In other words, in the third embodiment, the region of the semiconductor chip CHP1 except for the flow sensing unit FDU and the whole area of the semiconductor chip CHP2 are collectively covered with the resin MR. This sealing with the resin MR can be performed in a state in which the semiconductor chip CHP1 formed with the flow sensing unit FDU is fixed by a mold. Therefore, while suppressing the displacement of each flow sensor FS3, a part of the semiconductor chip CHP1 and the semiconductor chip CHP2 can be sealed with the resin MR. This means that, according to the flow sensor FS3 of the third embodiment, while suppressing the displacement of the semiconductor chip CHP1, a part of the semiconductor chip CHP1 and the whole region of the semiconductor chip CHP2 can be sealed with the resin MR, and also that variations of the position of the flow sensing unit FDU formed on the semiconductor chip CHP1 can be suppressed. As a result, according to the third embodiment, because the position of the flow sensing unit FDU detecting the flow rate of gas can be matched with each flow sensor FS3, prominent effects can be obtained where performance variations in detecting the gas flow rate can be suppressed in each flow sensor FS3.

Subsequently, also in the flow sensor FS3 of the third embodiment, as shown in FIG. 13A, the height of the resin MR (sealing body) at both sides across the exposed flow sensing unit FDU is higher than the height of the surface of the semiconductor chip CHP1 including the flow sensing unit FDU (the second feature). In other words, the exposed flow sensing unit FDU has its periphery surrounded by the resin MR, and the height of the resin MR that surrounds the flow sensing unit FDU is higher than that of the flow sensing unit FDU. According to such second feature of the third embodiment, because the component parts can be prevented from colliding against the exposed flow sensing unit FDU upon mounting and assembling component parts, breakage of the semiconductor chip CHP1 formed with the flow sensing unit FDU can be prevented. That is, the height of the resin MR that clamps the flow sensing unit FDU is higher than that of the exposed flow sensing unit FDU. For this reason, when the component parts contact the flow sensor, first, the component parts contact the resin MR whose height is high, and therefore, breakage of the semiconductor chip CHP1, which occurs when the exposed surface (XY surface) of the semiconductor chip CHP1 including the flow sensing unit FDU whose height is low contacts the component parts, can be prevented.

Particularly, in the cross-section (FIG. 13C) of the direction parallel to the air flow, the height of the resin MR (sealing body) becomes higher than the height of the surface of the semiconductor chip CHP1 including the flow sensing unit FDU (a second A feature). In this manner, the air flow flowing above of the flow sensing unit FDU can be stabilized, and thus, the flow detection accuracy in the flow sensing unit FDU can be improved. The specific second A feature will be described in detail in the twelfth embodiment to be described later.

Further, to suppress performance variations for each flow sensor having the existing structure as described above, the semiconductor chip may be sealed with the resin, and an air flow path structure may be formed at the same time as disclosed in Japanese Patent Application Laid-Open Publication No. 2009-36639 (Patent Document 4).

However, the flow sensing unit needs to be exposed, and the exposed structure in the vicinity part of this flow sensing unit is different from the ordinary package structure that seals the whole surface of the semiconductor chip by resin, and a contact area between the semiconductor chip and the resin becomes small. Therefore, peeling occurs at the interface between the semiconductor chip and the resin, and consequently, there is a possibility of creating a problem that cracks occur and the airflow is disturbed.

With respect to this problem, Japanese Patent Application Laid-Open Publication No. 2009-36639 (Patent Document 4) does not make any mention about a structure that improves bonding properties at the interface between the semiconductor chip and the resin in the cross-section of the direction parallel to the air flow. Therefore, depending on the structure of the interface between the semiconductor chip and the resin, there is a possibility of causing problems that the air flow in the vicinity of the flow sensing unit is disturbed and interface peeling between the semiconductor chip and the resin occurs. In other words, according to Japanese Patent Application Laid-Open Publication No. 2009-36639 (Patent Document 4), when the interface between the semiconductor chip and the resin peels off by heating cycle due to the temperature change and the like in the optional cross-section of the air flow direction (Y direction), there is a possibility of causing problems that cracks grow from the peeled part to become large cracks or the air flow is disturbed at the peeled part, and then, the disturbed air flow flows into the flow sensing unit, thereby making accurate measurement of the air flow difficult.

Hence, in the third embodiment, for example, as shown in FIG. 13C, the cross-section in the direction (Y direction) parallel to the air flow has a shape in which the resin MR partially covers the upper part of the semiconductor chip CHP1 (second B feature). Consequently, in the cross-section of the direction parallel to the air flow, a contact area between the semiconductor chip CHP1 and the resin MR is increased such that the peeling of the interface between the semiconductor chip CHP1 and the resin MR can be prevented. As a result, according to the third embodiment, a problem of cracks growing from the peeled part to become large cracks can be prevented and the disturbance of the air flow on the upper part of the flow sensing unit FDU can be suppressed. This can lead to an improvement of measurement accuracy of the accurate air flow at the flow sensing unit FDU.

Here, as shown in FIGS. 13B and 13C, the outermost surface (device forming surface) of the semiconductor chip CHP1 may be formed with a polyimide film PIQ that is high in bonding strength with the resin MR. In this case, the formation of the polyimide film PIQ high in boding strength with the resin MR on the outermost surface of the semiconductor chip CHP1 can further improve the bonding strength between the semiconductor chip CHP1 and the resin MR. The polyimide film PIQ, for example, is formed by its application on the semiconductor chip CHP1, and can be patterned by implementing photolithography technology and etching technology as needed. In the present invention, the thickness of the polyimide film PIQ is assumed to be about 1 to 120 μm, but the embodiment is not limited to this film thickness, and, in the surface area of the semiconductor chip CHP1, the polyimide film PIQ is formed on the region covered with the resin MR. In the subsequent drawings, while the polyimide film PIQ is not illustrated, the polyimide film PIQ may be formed as needed.

Next, also in the flow sensor FS3 of the third embodiment, as shown in FIG. 13C, a pair of air current control units FCU1 and FCU2 clamping the exposed flow sensing unit FDU and having a long shape in the direction parallel to the traveling direction (arrow direction, Y direction) of the gas that flows above the flow sensing unit FDU is formed integrally with the resin MR (sealing body) (the third feature). In this manner, first, the pair of air current control units FCU1 and FCU2 forms the flow paths of both sides of the gas that flows above the flow sensing unit FDU. The pair of air current control units FCU1 and FCU2 is formed integrally with the resin MR with very high accuracy by clamping with a die of high dimension accuracy. As a consequence, according to the flow sensor FS3 of the third embodiment, a flow of the gas is not disturbed by dimension accuracy of the pair of air current control units FCU1 and FCU2, and the flow rate of the gas can be accurately measured. Furthermore, in the third embodiment, as described above, the pair of air current control units FCU1 and FCU2 forms the flow paths of both sides of the gas that flows on the upper part of the flow sensing unit FDU. Hence, the gas can be let flow above the flow sensing unit FDU in a state in which the gas flow path dimension is made narrower. As a result, according to the flow sensor FS3 of the third embodiment, particularly even when the flow rate of the gas that flows is small, lowering of the detection accuracy of the gas flow rate can be suppressed.

Further, in the flow sensor FS3 of the third embodiment, as shown in FIG. 13A, an interface region between the flow sensing unit FDU exposed from the resin MR (sealing body) and the resin MR (sealing body) is in a tapered shape, and, in the interface region, the tapered shape of the interface region orthogonal to the traveling direction (arrow direction, Y direction) of the gas that flows on the flow sensing unit FDU is steeper than the tapered shape of the interface region parallel to the traveling direction of the gas (the fourth feature). That is, the angle of the tapered shape TP2 in the direction (X direction) orthogonal to the flow of the gas of the flow sensing unit FDU is steeper than the angle of the tapered shape TP1 in the direction (Y direction) to which the gas flows of the flow detection sensor FDU. Thus, in the third embodiment, by reducing the angle of the tapered shape TP1 in the gas flow direction (Y direction), the dimension change of the flow path of the gas flowing in the Y direction can be reduced. This can prevent the gas from separating from the resin MR and can suppress deviations of measurement of the flow rate due to back-flow and eddy-flow of the gas. On the other hand, by increasing the angle of a tapered shape TP2 in the direction (X direction) orthogonal to the gas flow direction, the wall of the gas flow path can be formed, and the flow of the gas to the X direction can be suppressed.

Subsequently, while the flow sensor FS3 of the third embodiment also has the fifth feature and the sixth feature, as the premise of describing these features, the structures of FIGS. 13B and 13C will be described. FIG. 13B is a cross-sectional view taken along the line A-A of FIG. 13A, and FIG. 13C is a cross-sectional view taken along the line B-B of FIG. 13A.

As shown in FIG. 13B, the lead frame LF is formed with the chip mounting unit TAB1, and the semiconductor chip CHP1 is bonded on this chip mounting unit TAB1 by the adhesive ADH1. The rear surface of the semiconductor chip CHP1 is formed with the diaphragm DF, and the bottom of the chip mounting unit TAB1 existing under this diaphragm DF is formed with the opening OP1. Further, the rear surface of the lead frame LF is covered with the resin MR, but, in the rear surface of the lead frame LF, the resin MR formed on the rear surface of the chip mounting unit TAB1 is formed with an opening OP2. The opening OP1 formed on this chip mounting unit TAB1 communicates with the opening OP2 formed in the resin MR, and the internal space of the diaphragm DF becomes continuous with the external space of the flow sensor FS3 through these openings OP1 and OP2. At this time, the cross-sectional area of the opening OP1 is configured to become smaller than the cross-sectional area of the opening OP2. To put it another way, a cross-sectional area of the opening OP1 is larger than a cross-sectional area of the opening OP2.

On the other hand, the surface of the semiconductor chip CHP1 facing the diaphragm DF is formed with the flow sensing unit FDU, and is further formed with the pads PD1 that are connected to this flow sensing unit FDU. These pads PD1 are connected to the leads LD1 formed on the lead frame LF through the wires W1, and the leads LD1 are connected to the pads PD2 formed on the semiconductor chip CHP2 mounted on the chip mounting unit TAB2 through the adhesive ADH2 by the wires W2. The pads PD3 formed on the semiconductor chip CHP2 are connected to the leads LD2 formed on the lead frame LF through the wires W3. In the flow sensor FS3 of the third embodiment, in a state in which the flow sensing unit FDU and its vicinity are exposed, the other region (including the pads PD1), that is, a part of the semiconductor chip CHP1, the wires W1, the leads LD1, the wires W2, the semiconductor chip CHP2, the wires W3, and a part of the leads LD2 are collectively sealed with the resin MR. At this time, the interface region between the exposed flow sensing unit FDU and the resin MR is in the tapered shape TP2, and the pair of air current control units FCU1 and FCU2 is formed integrally with the resin MR in such a manner as to clamp the flow sensing unit FDU.

Further, as shown in FIG. 13C, the lead frame LF is formed with the chip mounting unit TAB1, and the semiconductor chip CHP1 is bonded on this chip mounting unit TAB1 by the adhesive ADH1. The rear surface of the semiconductor chip CHP1 is formed with the diaphragm DF, and the bottom of the chip mounting unit TAB1 existing under this diaphragm DF is formed with an opening OP1. Further, the resin MR that covers the rear surface of the chip mounting unit TAB1 is formed with an opening OP2. The opening OP1 formed on this chip mounting unit TAB1 communicates with the opening OP2 formed in the resin MR, and the internal space of the diaphragm DF becomes continuous with the external space of the flow sensor FS3 through these openings OP1 and OP2. At this time, the cross-sectional area of the opening OP1 is smaller than the cross-sectional area of the opening OP2. To put it another way, the cross-sectional area of the opening OP1 is larger than the cross-sectional area of the opening OP2.

On the other hand, the surface of the semiconductor chip CHP1 facing the diaphragm DF is formed with the flow sensing unit FDU, and is formed with the resin MR to surround the semiconductor chip CHP1. At this time, the interface region between the flow sensing unit FDU and the resin MR is in a tapered shape TP1, and the angle of this tapered shape TP1 is gentler than the angle of the tapered shape TP2 shown in FIG. 13B.

Here, also in the third embodiment, to prevent the resin MR from infiltrating into the internal space of the diaphragm DF, for example, it is premised on using a configuration in which the adhesive ADH1 is applied to surround the diaphragm. DF formed on the rear surface of the semiconductor chip CHP1, and to avoid inconvenience due to such configuration, as shown in FIGS. 13B and 13C, the bottom of the chip mounting unit TAB1 existing under the diaphragm DF formed on the rear surface of the semiconductor chip CHP1 is formed with the opening OP1, and further, the resin MR covering the rear surface of the chip mounting unit TAB1 is provided with the opening OP2 (the fifth feature). In this manner, according to the flow sensor FS3 by the third embodiment, the internal space of the diaphragm DF communicates with the external space of the flow sensor FS3 through the opening OP1 formed at the bottom of the chip mounting unit TAB1 and the opening OP2 formed in the resin MR. As a result, the pressure of the internal space of the diaphragm DF can be made equal to the pressure of the external space of the flow sensor FS3 so that the stress applied on the diaphragm DF can be suppressed.

Further, also in the flow sensor FS3 of the third embodiment, not only the semiconductor chip CHP1 and the leads LD1, but also the semiconductor chip CHP2 and the leads LD1 and LD2 are connected by the wires W2 and W3 (the sixth feature). In this manner, in the third embodiment, a solder ball is not used, and therefore, the manufacturing cost of the flow sensor can be reduced.

Figure 14:
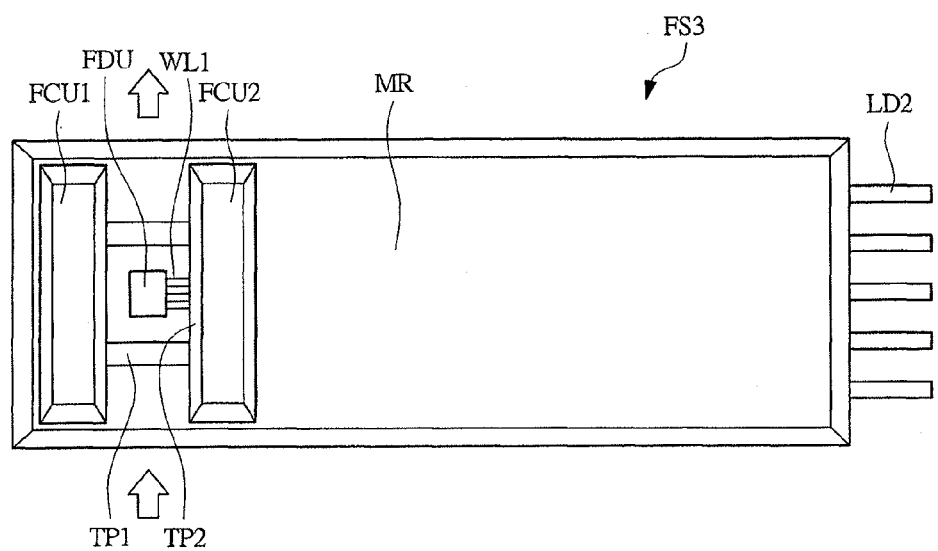
FIG. 14 is a plan view showing the mounting configuration of the flow sensor after removing a dam bar.

Thus, while the mounting configuration of the flow sensor FS3 of the third embodiment is used, in the actual flow sensor FS3, the dam bar DM configuring the outer frame body of the lead frame LF is removed after being sealed with the resin MR. FIG. 14 is a plan view showing the mounting configuration of the flow sensor FS3 after the removable of the dam bar DM. As shown in FIG. 14, by disconnecting the dam bar DM, it is understood that a plurality of electric signals can be independently taken out from a plurality of leads LD2.

Manufacturing Method of Flow Sensor of Third Embodiment

The flow sensor FS3 of the third embodiment is configured as described above, and its manufacturing method will be described below with reference to FIGS. 15 to 19. FIGS. 15 to 19 show a manufacturing process in the cross-section taken along the line A-A of FIG. 13A.

Figure 15:
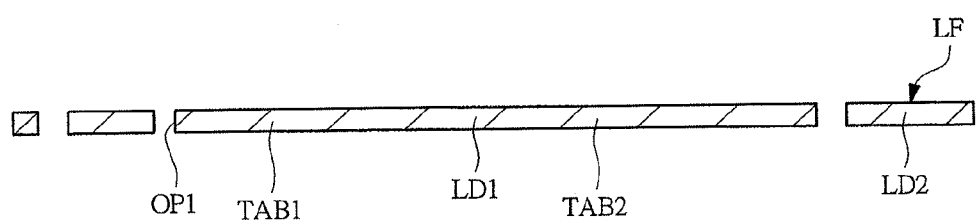
FIG. 15 is a cross-sectional view showing the manufacturing process of a flow sensor according to the third embodiment.

First, as shown in FIG. 15, for example, the lead frame LF composed of a copper material is prepared. This lead frame LF is integrally formed with the chip mounting unit TAB1, the chip mounting unit TAB2, the leads LD1, and the leads LD2. The bottom of the chip mounting unit TAB1 is formed with the opening OP1.

Figure 16:
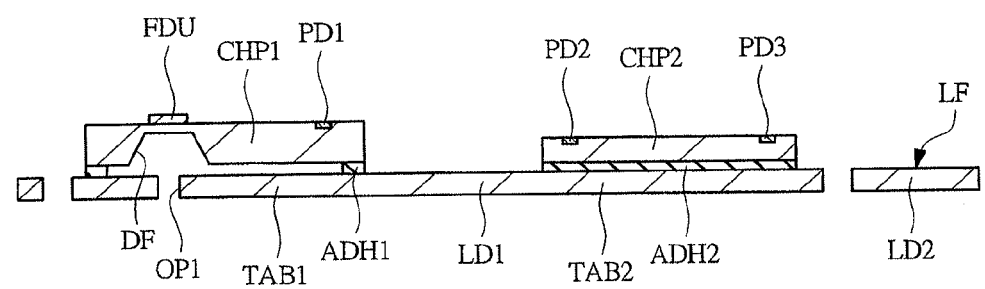
FIG. 16 is a cross-sectional view showing the manufacturing process of a flow sensor continued from FIG. 15.

Subsequently, as shown in FIG. 16, the semiconductor chip CHP1 is mounted on the chip mounting unit TAB1, and the semiconductor chip CHP2 is mounted on the chip mounting unit TAB2. Specifically, the semiconductor chip CHP1 is bonded on the chip mounting unit TAB1 formed on the lead frame LA by the adhesive ADH1. At this time, the semiconductor chip CHP1 is mounted on the chip mounting unit TAB1 so that the diaphragm DF formed on the semiconductor chip CHP1 communicates with the opening OP1 formed at the bottom of the chip mounting unit TAB1. The semiconductor chip CHP1 is formed with the flow sensing unit FDU, wirings (not shown), and the pads PD1 by the ordinary semiconductor manufacturing process, and the diaphragm DF is formed at the position of the rear surface of the semiconductor chip CHP1 facing the flow sensing unit FDU formed on the surface of the semiconductor chip CHP1, for example, by anisotropic etching. Further, the semiconductor chip CHP2 is also mounted on the chip mounting unit TAB2 formed on the lead frame LF by the adhesive ADH2. This semiconductor chip CHP2 is formed previously with the semiconductor elements (not shown) such as MISFET and wirings (not shown), the pads PD2, and the pads PD3 by the ordinary semiconductor manufacturing process.

Figure 17:
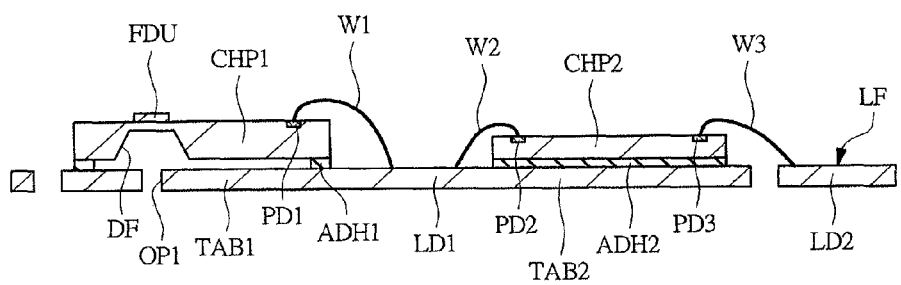
FIG. 17 is a cross-sectional view showing the manufacturing process of a flow sensor continued from FIG. 16.

Next, as shown in FIG. 17, the pads PD1 formed on the semiconductor chip CHP1 and the leads LD1 formed on the lead frame LF are connected by the wires W1 (Wire Bonding). Similarly, the pads PD2 formed on the semiconductor chip CHP2 and the leads LD1 are connected by the wires W2, and the pads PD3 formed on the semiconductor chip CHP2 are connected to the leads LD2 by wires W3. The wires W1 to W3 are composed of, for example, gold wires.

Figure 18:
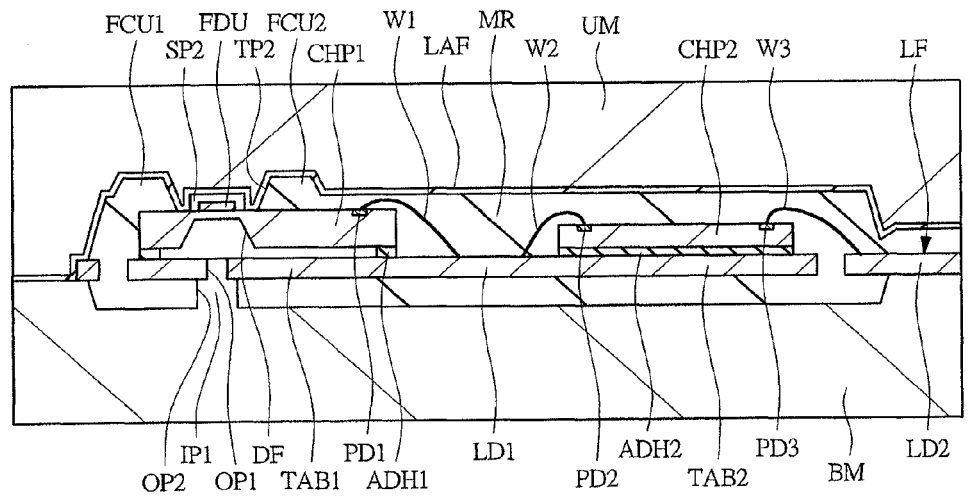
FIG. 18 is a cross-sectional view showing the manufacturing process of a flow sensor continued from FIG. 17.

After that, as shown in FIG. 18, the surface of the semiconductor chip CHP1 excluding the flow sensing unit FDU and its vicinity, the wires W1, the leads LD1, the wires W2, the whole main surface of the semiconductor chip CHP2, the wires W3, and a part of the leads LD2 are sealed with the resin MR (Die Process). Specifically, as shown in FIG. 18, the semiconductor chip CHP1 and the lead frame LF mounting the semiconductor chip CHP2 are clamped by an upper die UM and a lower die BM interposing a first space. After that, the resin MR is poured into this first space under heating, and as a result, the surface of the semiconductor chip CHP1 excluding the flow sensing unit FDU and its vicinity, the wires W1, the leads LD1, the wires W2, the whole main surface of the semiconductor chip CHP2, the wires W3, and a part of the leads LD2 are sealed with the resin MR. At this time, as shown in FIG. 18, the internal space of the diaphragm DF is isolated from the first space by the adhesive ADH1, and this prevents the resin MR from infiltrating into the internal space of the diaphragm DF also when the first space is filled up with the resin MR.

Further, in the third embodiment, since the sealing with the resin MR can be performed in a state in which the semiconductor chip CHP1 formed with the flow detection sensor FDU is fixed by the mold, a part of the semiconductor chip CHP1 and the semiconductor chip CHP2 can be sealed with the resin MR, while suppressing the displacement of the semiconductor chip CHP1. This means that, according to the manufacturing method of the flow sensor of the third embodiment, a part of the semiconductor chip CHP1 and the whole region of the semiconductor chip CHP2 can be sealed with the resin MR, while suppressing the displacement of each flow sensor, and also that variations of the position of the flow sensing unit FDU formed on the semiconductor chip CHP1 can be suppressed. As a result, according to the third embodiment, the position of the flow sensing unit FDU detecting the flow rate of the gas can be matched with each flow sensor. Hence, prominent effects can be obtained where performance variations in detecting the flow rate of the gas in each flow sensor can be suppressed.

Here, the feature of the manufacturing method of the flow sensor of the third embodiment lies in that the lead frame LF mounting the semiconductor chip CHP1 is clamped by the lower die BM and the upper die UM to surround the flow sensing unit FDU formed on the semiconductor chip CHP1 by a second space SP2 isolated from the first space. Thereby, according to the third embodiment, while exposing the flow sensing unit FDU formed on the semiconductor chip CHP1 and its vicinity, the other surface region of the semiconductor chip CHP1 can be sealed.

Further, the feature of the manufacturing method of the flow sensor of the third embodiment lies in that, when the lead frame LF mounting the semiconductor chip CHP1 is clamped by the upper die UM and the lower die BM, an elastic film LAF is interposed between the lead frame LF mounting the semiconductor chip CHP1 and the upper die UM. For example, since there is a dimension variation in the thickness of the individual semiconductor chip CHP1, when the thickness of the semiconductor chip CHP1 is thinner than the average thickness, a gap occurs in the case that the lead frame LF mounting the semiconductor chip CHP1 is clamped by the upper die UM and the lower die BM, and the resin MR leaks from this gap on the semiconductor chip CHP1. On the other hand, when the thickness of the semiconductor chip CHP1 is thicker than the average thickness, force applied on the semiconductor chip CHP1 becomes large in the case that the lead frame LF mounting the semiconductor chip CHP1 is clamped by the upper die UM and the lower die BM, and there is fear that the semiconductor chip CHP1 is broken.

Hence, in the third embodiment, to prevent a leakage of the resin onto the semiconductor chip CHP1 due to thickness variations of the semiconductor chip CHP1 as described above or breakage of the semiconductor chip CHP1, a device to interpose an elastic film LAF between the lead frame LF mounting the semiconductor chip CHP1 and the upper die UM is employed. Thus, for example, when the thickness of the semiconductor chip CHP1 is thinner than the average thickness, a gap occurs in the case that the lead frame LF mounting the semiconductor chip CHP1 is clamped by the upper die UM and the lower die BM, but since this gap can be filled up with the elastic film LAF, the leakage of the resin onto the semiconductor chip CHP1 can be prevented. On the other hand, when the thickness of the semiconductor chip CHP1 is thicker than the average thickness, in the case that the lead frame LF mounting the semiconductor chip CHP1 is clamped by the upper die UM and the lower die BM, since the elastic film LAF is soft, the thickness direction of the elastic film LAF changes so as to absorb the thickness of the semiconductor chip CHP1. Thus, even when the thickness of the semiconductor chip CHP1 is thicker than the average thickness, force application to the semiconductor chip CHP1 more than necessary can be prevented. As a result, breakage of the semiconductor chip CHP1 can be prevented.

Here, even in the case of the manufacturing method using the above-described elastic film LAF, when the semiconductor chip CHP1 is clamped by the die via the elastic film LAF, there is a possibility of creating a problem that a clamping weight is applied to the flow sensing unit FDU on the semiconductor chip CHP1 and the thin diaphragm DF, thereby breaking them.

Hence, in the third embodiment, as shown in FIG. 18, to prevent such breakage of the flow sensing unit FDU and the thin diaphragm DF, a manufacturing method is used in which the second space SP2 is provided on the upper die UM including a projected area of the flow sensing unit FDU, and the elastic film LAF is absorbed into the second space SP2 of the upper die UM. According to such third embodiment, by the manufacturing method using a die structure and an elastic film LAF, the die can be clamped without bringing the flow sensing unit FDU on the semiconductor chip CHP1 into contact with the elastic film LAF so that breakage of the flow sensing unit FDU and the diaphragm DF can be prevented.

As the elastic film LAF, for example, Teflon (Registered Trademark) and high molecular materials such as fluoric resin can be used.

Subsequently, a feature unique to the third embodiment will be described. As shown in FIG. 18, in the third embodiment, the resin MR flows also into the rear surface of the lead frame LF. As a consequence, since the opening OP1 is formed at the bottom of the chip mounting unit TAB1, there is fear that the resin MR flows into the internal space of the diaphragm DF from this opening OP1. Hence, in the third embodiment, a device is applied to the shape of the lower die BM that clamps the lead frame LF. Specifically, as shown in FIG. 18, a projection-like insert piece IP1 is formed on the lower die BM, and when the lead frame LF is clamped by the upper die UM and the lower die BM, the projection-like insert piece IP1 formed on the lower die BM is inserted into the opening OP1 formed on the bottom of the chip mounting unit TAB1. Thus, since the insert piece IP1 is inserted closely into the opening OP1, the resin MR can be prevented from infiltrating into the internal space of the diaphragm DF from the opening OP1. In other words, the feature of the third embodiment lies in that the projection-like insert piece IP1 is formed on the lower die BM, and, at the time of sealing with the resin, this insert piece IP1 is inserted into the opening OP1 formed on the bottom of the chip mounting unit TAB1.

Further, the feature of the third embodiment lies in that a device is applied to the shape of the insert piece IP1. Specifically, in the third embodiment, the insert piece IP1 is configured by an insert part to be inserted into the opening OP1 and a pedestal part to support this insert part, and a cross-sectional area of the pedestal part becomes larger than the insert part. Thereby, the insert piece IP1 is configured to be provided with a stepped part between the insert part and the pedestal part, and this stepped part adheres to the bottom of the chip mounting unit TAB1.

By configuring the insert piece IP1 in this way, the effects shown below can be obtained. For example, when the shape of the insert piece IP1 is configured by the insert part alone, since the insert part is inserted into the opening OP1, a diameter of the insert part of the insert piece IP1 is slightly smaller than a diameter of the opening OP1. Consequently, when the insert piece IP1 is configured by the insert part alone, even when the insert part of the insert piece IP1 is inserted into the opening OP1, it is believed that there exists a slight gap between the inserted insert part and the opening OP1. In this case, there is fear that the resin MR infiltrates into the internal space of the diaphragm DF from the gap.

Hence, in the third embodiment, the insert piece IP1 has a configuration, in which the insert part is formed on the pedestal part that has a cross-sectional area larger than the insert part. In this case, as shown in FIG. 18, the insert part of the insert piece IP1 is inserted into the opening OP1, and the pedestal part of the insert piece IP1 is closely attached to the bottom of the chip mounting unit TAB1. As a result, even if a slight gap occurs between the insert part of the insert piece IP1 and the opening OP1, since the pedestal part is firmly pressed against the rear surface of the chip mounting unit TAB1, the resin MR can be prevented from infiltrating into the opening OP1. In other words, in the third embodiment, the insert piece IP1 has a configuration, in which the insert part is formed on the pedestal part that has a cross-sectional area larger than the insert part. Therefore, by a combination of a characteristic point that the resin MR does not come down to the opening OP1 due to the pedestal part and a characteristic point that a stepped part formed between the pedestal part and the insert part is pressed against the chip mounting unit TAB1, the resin MR is effectively prevented from infiltrating into the internal space of the diaphragm DF through the opening OP1.

Figure 19:
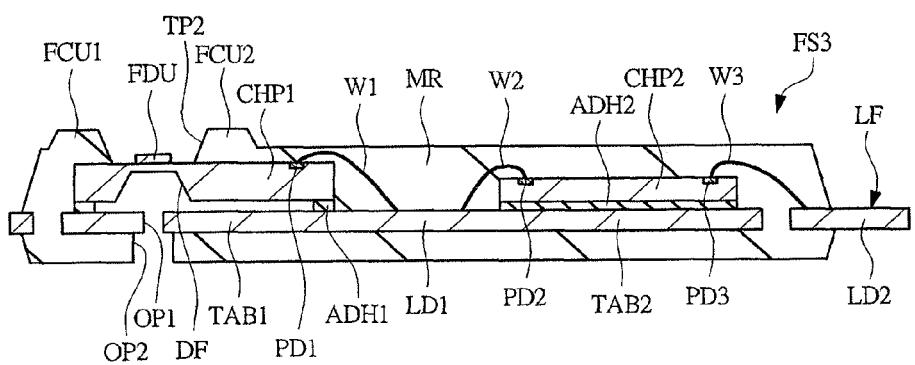
FIG. 19 is a cross-sectional view showing the manufacturing process of a flow sensor continued from FIG. 18.

After that, as shown in FIG. 19, at the stage of the resin MR having cured, the lead frame LF mounting the semiconductor chip CHP1 and the semiconductor chip CHP2 is dismounted from the upper die UM and the lower die BM. Thus, the flow sensor FS3 of the third embodiment can be manufactured. In the flow sensor FS3 manufactured at this time, as a result of using the lower die BM formed with the insert piece IP1 in the resin sealing process, as shown in FIG. 19, the opening OP1 is formed at the bottom of the chip mounting unit TAB1, and the opening OP2 communicating with this opening OP1 is formed in the resin MR. This opening OP2 is generated as a result of forming the pedestal part in the insert piece IP1, and a cross-sectional area of this opening OP2 becomes larger than a cross-sectional area of the opening OP1. Thus, according to the flow sensor FS3 by the third embodiment, the internal space of the diaphragm DF communicates with the external space of the flow sensor FS3 through the opening OP1 formed at the bottom of the chip mounting unit TAB1 and the opening OP2 formed in the resin MR. As a result, the pressure of the internal space of the diaphragm DF can be made equal to the pressure of the external space of the flow sensor FS3 so that the stress applied on the diaphragm DF can be suppressed.

Fourth Embodiment

In the third embodiment, an example of a pair of air current control units FCU1 and FCU2 integrally formed with the resin MR (sealing body) has been described, in which the pair of air current control units FCU1 and FCU2 clamps an exposed flow sensing unit FDU and has a rectangular shape in the direction parallel to the traveling direction of the gas flowing on a flow sensing unit FDU. In a fourth embodiment, the flow sensor not provided with the air current control units FCU1 and FCU2 will be described.

Figure 20A:
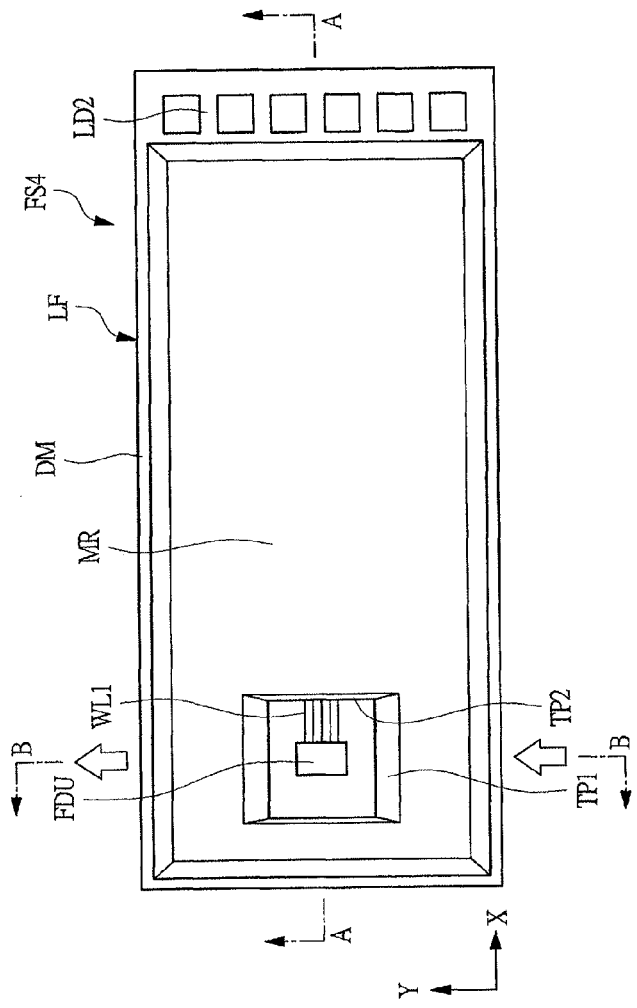
FIG. 20A is a plan view showing a mounting configuration after sealing a flow sensor according to a fourth embodiment.
Figure 20B:
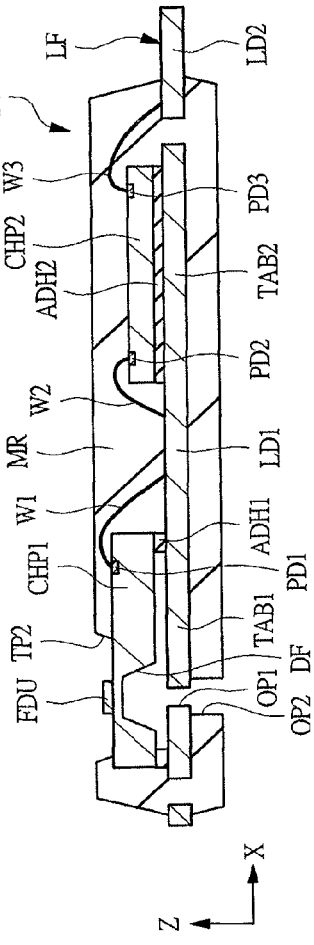
FIG. 20B is a cross-sectional view taken along the line A-A of FIG. 20A.
Figure 20C:
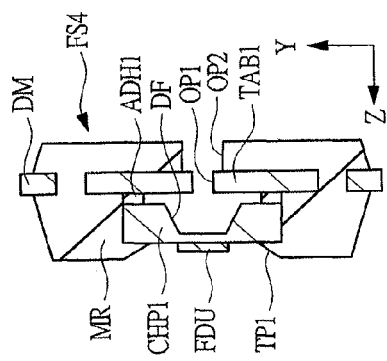
FIG. 20C is a cross-sectional view taken along the line B-B of FIG. 20A.

FIGS. 20A to 20C are views showing a mounting configuration of a flow sensor FS4 of the fourth embodiment, and are views showing the configuration after being sealed with the resin. Particularly, FIG. 20A is a plan view showing the mounting configuration of the flows sensor FS4 of the fourth embodiment. FIG. 20B is a cross-sectional view taken along the line A-A of FIG. 20A, and FIG. 20C is a cross-sectional view taken along the line B-B of FIG. 20A.

The mounting configuration of the flow sensor FS4 of the fourth embodiment is the same as the mounting configuration of the flow sensor FS3 of the third embodiment except that the air current control units FCU1 and FCU2 are not provided. Consequently, the flow sensor FS4 of the fourth embodiment also has the first feature to the second feature and the fourth feature to the sixth feature as described in the third embodiment.

The outermost surface (device forming surface) of a semiconductor chip CHP1 may be formed with a polyimide film designed for the purpose of the buffer function regarding stress with the resin to be bonded, the surface protection function, the insulation protection function, or the like.

Specifically, the flow sensor FS4 of the fourth embodiment also has a structure, in which, as shown in FIG. 20A, a part of the semiconductor chip CHP1 and the whole of the semiconductor CHP2 are covered with resin MR in a state in which a flow sensing unit FDU formed on the semiconductor chip CHP1 is exposed (the first feature). In other words, in the fourth embodiment, the region of the semiconductor chip CHP1 except for the flow sensing unit FDU and the whole region of the semiconductor chip CHP2 are collectively sealed with the resin MR. This sealing with the resin MR can be performed in a state in which the semiconductor chip CHP1 formed with the flow sensing unit FDU is fixed by a mold. Therefore, a part of the semiconductor chip CHP1 and the semiconductor chip CHP2 can be sealed with the resin MR, while suppressing the displacement of the semiconductor chip CHP1. This means, according to the flow sensor FS4 of the fourth embodiment, that apart of the semiconductor chip CHP1 and the whole region of the semiconductor chip CHP2 can be sealed with the resin MR, while suppressing the displacement of each flow sensor FS4, and also that variations of the position of the flow sensing unit FDU formed on the semiconductor chip CHP1 can be suppressed. As a result, according to the fourth embodiment, because the position of the flow sensing unit FDU detecting a flow rate of gas can be matched with each flow sensor FS4, prominent effects can be obtained where performance variations in detecting the gas flow rate can be suppressed in each flow sensor FS4.

Subsequently, also in the flow sensor FS4 of the fourth embodiment, as shown in FIG. 20A, the height of the resin MR (sealing body) at both sides across the exposed flow sensing unit FDU is higher than the height of the surface of the semiconductor chip CHP1 including the flow sensing unit FDU (the second feature). In other words, the exposed flow sensing unit FDU has its periphery surrounded by the resin MR, and the height of the resin MR that surrounds the flow sensing unit FDU becomes higher than the height of the flow sensing unit FDU. According to such second feature of the fourth embodiment, because the component parts can be prevented from colliding against the exposed flow sensing unit FDU upon mounting and assembling component parts, breakage of the semiconductor chip CHP1 formed with the flow sensing unit FDU can be prevented. That is, the height of the resin MR that clamps the flow sensing unit FDU becomes higher than the height of the exposed flow sensing unit FDU. For this reason, when the component parts contact the flow sensor, first, the component parts contact the resin MR whose height is high, and therefore, breakage of the semiconductor chip CHP1, which occurs when the exposed surface (XY surface) of the semiconductor chip CHP1 including the flow sensing unit FDU whose height is low contacts the component parts, can be prevented.

Particularly, in the cross-section (FIG. 20C) of the direction parallel to the air flow, there is a feature that the height of the resin MR (sealing body) becomes higher than the height of the surface of the semiconductor chip CHP1 including the flow sensing unit FDU (the second A feature). Thus, the air flow flowing on the upper part of the flow sensing unit FDU can be stabilized, and thus, the flow detection accuracy in the flow sensing unit FDU can be improved. The specific second A feature will be described in detail in the twelfth embodiment to be described later.

Further, when the interface between the semiconductor chip CHP1 and the resin MR peels off by heating cycle due to the temperature change and the like in an optional cross section in the air flow direction (Y direction), there is a possibility of causing problems that cracks grow from the peeled part to become large cracks or the air flow is disturbed at the peeled part, and then, the disturbed air flow flows into the flow sensing unit FDU, thereby making accurate measurement of the air flow rate difficult. Hence, in the fourth embodiment, for example, as shown in FIG. 20C, the resin MR has a shape partially covering the upper part of the semiconductor chip CHP1 in the cross-section of the direction (Y direction) parallel to the air flow (the second B feature). Consequently, in the cross-section of the direction parallel to the air flow, a contact area between the semiconductor chip CHP1 and the resin MR is increased such that the peeling of the interface between the semiconductor chip CHP1 and the resin MR can be prevented. As a result, according to the fourth embodiment, a problem of cracks growing from the peeled part to become large cracks can be prevented and the disturbance of the air flow on the upper part of the flow sensing unit FDU can be suppressed. This can lead to the improvement of measurement accuracy of the accurate air flow at the flow sensing unit FDU.

Further, also in the flow sensor FS4 of the fourth embodiment, as shown in FIG. 20A, the interface region between the flow sensing unit FDU exposed from the resin MR (sealing body) and the resin MR (sealing body) is in a tapered shape, and in the interface region, the tapered shape of the interface region orthogonal to the traveling direction (arrow direction, Y direction) of the gas that flows above the flow sensing unit FDU is steeper than the tapered shape of the interface region parallel to the traveling direction of the gas (the fourth feature). That is, the angle of the tapered shape TP2 in the direction (X direction) orthogonal to the flow of the gas of the flow sensing unit FDU is steeper than the angle of the tapered shape TP1 in the direction (Y direction) to which the gas flows of the flow sensing unit FDU. Thus, in the fourth embodiment, by reducing the angle of the tapered shape TP1 in the gas flow direction (Y direction), the dimension change of the flow path of the gas flowing in the Y direction can be reduced. This can prevent the gas from separating from the resin MR and can suppress deviations of measurement of the flow rate due to back-flow and eddy-flow of the gas. On the other hand, by increasing the angle of a tapered shape TP2 in the direction (X direction) orthogonal to the gas flow direction, the wall of the gas flow path can be formed, and the flow of the gas to the X direction can be suppressed.

Further, also in the fourth embodiment, to prevent the resin MR from infiltrating into the internal space of the diaphragm DF, for example, it is premised on using a configuration in which the adhesive ADH1 is applied to surround the diaphragm DF formed on the rear surface of the semiconductor chip CHP1, and to avoid inconvenience due to such configuration, as shown in FIGS. 20B and 20C, the bottom of a chip mounting unit TAB1 existing under the diaphragm DF formed on the rear surface of the semiconductor chip CHP1 is provided with the opening OP1, and further, the resin MR covering the rear surface of the chip mounting unit TAB1 is provided with an opening OP2 (the fifth feature). Thus, according to the flow sensor FS4 according to the fourth embodiment, the internal space of the diaphragm DF communicates with the external space of the flow sensor FS4 through the opening OP1 formed at the bottom of the chip mounting unit TAB1 and the opening OP2 formed in the resin MR. As a result, the pressure of the internal space of the diaphragm DF can be made equal to the pressure of the external space of the flow sensor FS3 so that the stress applied on the diaphragm DF can be suppressed.

Further, also in the flow sensor FS4 of the fourth embodiment, not only the semiconductor chip CHP1 and the leads LD1, but also the semiconductor chip CHP2 and the leads LD1 and LD2 are connected by the wires W2 and W3 (the sixth feature). In this manner, in the fourth embodiment, a solder ball is not used, and therefore, the manufacturing cost of the flow sensor can be reduced.

Figure 21:
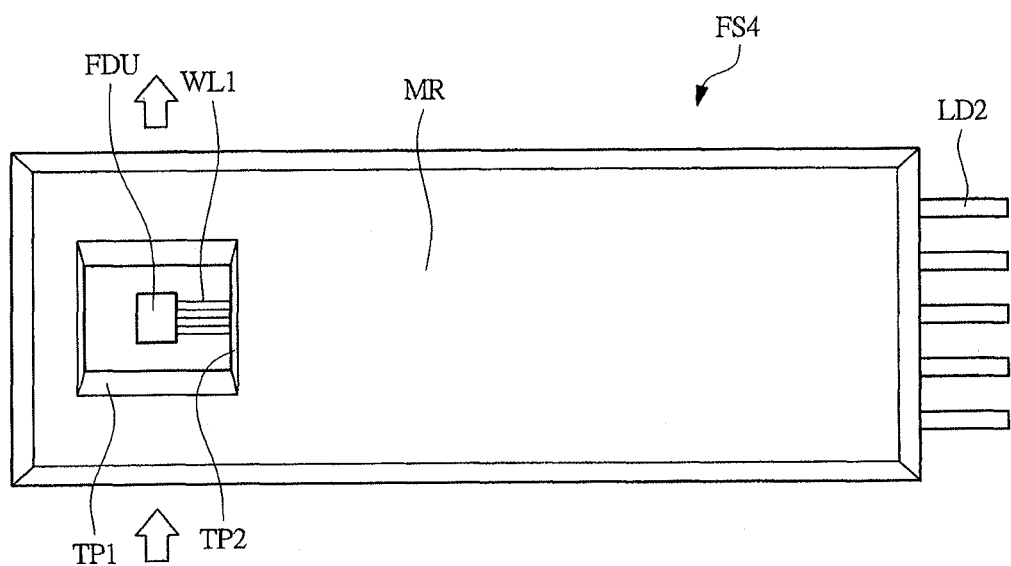
FIG. 21 is a plan view showing the mounting configuration of the flow sensor after removing the dam bar.

In the above-described manner, the mounting configuration of the flow sensor FS4 of the fourth embodiment is facilitated, but in the actual flow sensor FS4, a dam bar DM configuring the outer frame body of the lead frame LF is removed after being sealed with the resin MR. FIG. 21 is a plan view showing the mounting configuration of the flow sensor FS4 after removing the dam bar DM. As shown in FIG. 21, it is understood that a plurality of electric signals can be independently taken out from a plurality of leads LD2 by disconnecting the dam bar DM.

Fifth Embodiment

The flow sensors FS1 to FS4 of the first embodiment to the fourth embodiment include the semiconductor chip CHP1 formed with the flow sensing unit FDU and the semiconductor chip CHP2 formed with the control circuit; but in a fifth embodiment, a flow sensor forming a flow sensing unit and a control circuit in one semiconductor chip will be described.

Figure 22:
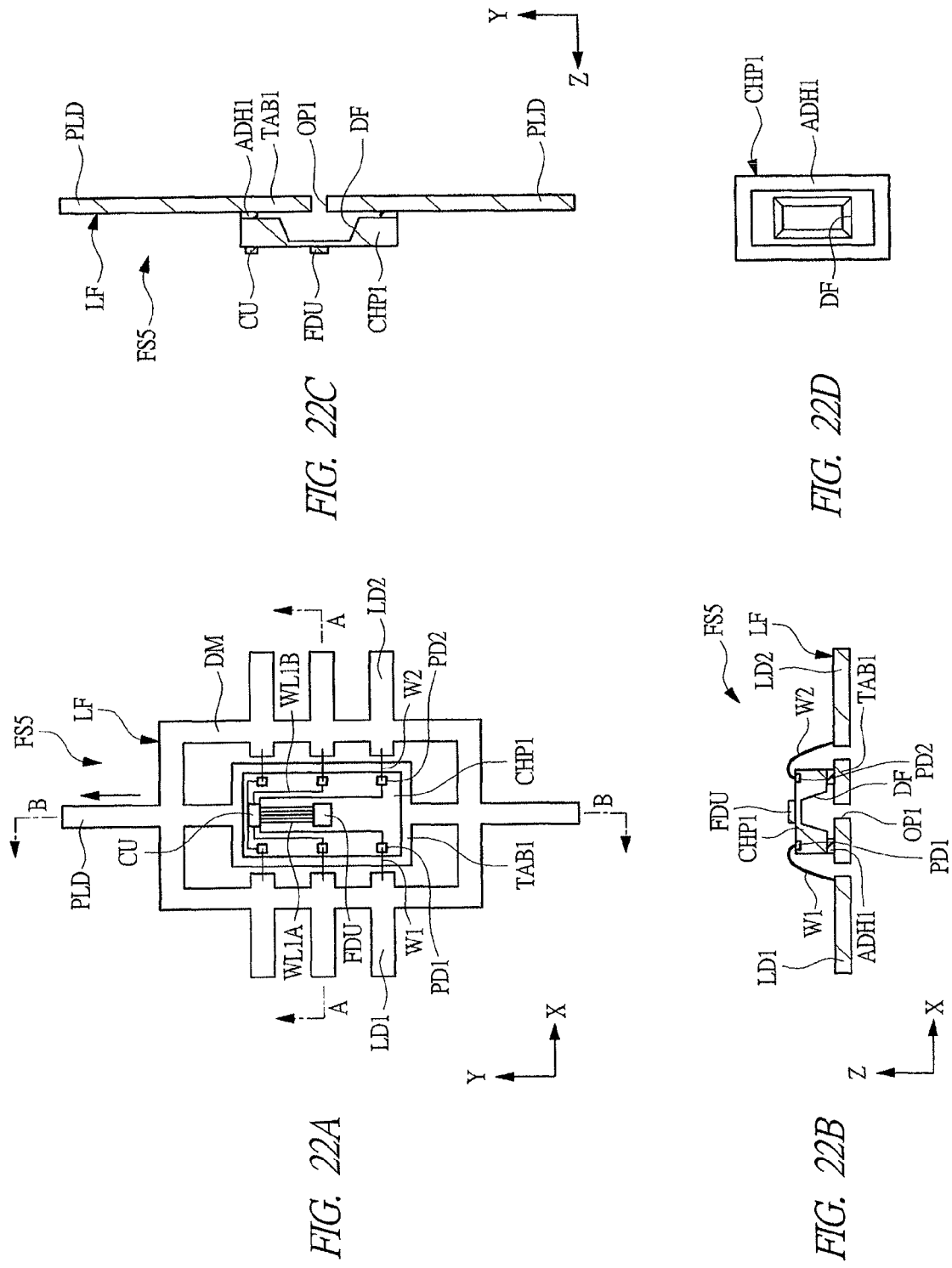
FIG. 22A is a plan view showing the mounting configuration before sealing a flow sensor according to a fifth embodiment.
FIG. 22B is a cross-sectional view taken along the line A-A of FIG. 22A.
FIG. 22C is a cross-sectional view taken along the line B-B of FIG. 22A.
FIG. 22D is a plan view showing a rear surface of the semiconductor chip.

FIGS. 22A to 22D are views showing a mounting configuration of a flow sensor FS5 of the fifth embodiment, and are views showing a configuration before being sealed with resin. Particularly, FIG. 22A is a plan view showing a mounting configuration of the flow sensor FS5 of the fifth embodiment. FIG. 22B is a cross-sectional view taken along the line A-A of FIG. 22A, and FIG. 22C is a cross-sectional view taken along the line B-B of FIG. 22A. Further, FIG. 22D is a plan view showing a rear surface of a semiconductor chip CHP1.

First, as shown in FIG. 22A, the flow sensor FS5 of the fifth embodiment, for example, has a lead frame LF composed of a copper material. This lead frame LF has a chip mounting unit TAB1 in its inside surrounded by a dam bar DM configuring an outer frame body, and the semiconductor chip CHP1 is mounted on the chip mounting unit TAB1.

The semiconductor chip CHP1 is in a rectangular shape, and a flow sensing unit FDU is formed approximately in its center. Wirings WL1A connected to the flow sensing unit FDU are formed on the semiconductor chip CHP1. These wirings WL1A connected to a control unit CU are formed on the semiconductor chip CHP1, and these wirings WL1A are connected to the control unit CU formed on the semiconductor chip CHP1. This control unit CU is formed with an integrated circuit composed of semiconductor elements and wirings such as MISFET (Metal Insulator Semiconductor Field Effect Transistor). Specifically, the control unit CU is formed with the integrated circuit configuring a CPU1, an input circuit 2, and output circuit 3 or a memory 4 and the like, all of which are shown in FIG. 1. The control unit CU is adhered to a plurality of pads PD1 and PD2 formed along a long side of the semiconductor chip CHP1 by wirings WL1B. That is, the flow sensing unit FDU and the control unit CU are connected by the wirings WL1A, and the control unit CU is connected to pads PD1 and pads PD2 by the wirings WL1B. The pads PD1 are connected to leads LD1 formed on a lead frame LF through wires W1 composed of, for example, gold wires. On the other hand, the pads PD2 are connected to leads LD2 formed on the lead frame LF through wires W2 composed of, for example, gold wires. The outermost surface (device forming surface) of the semiconductor chip CHP1 may be formed with a polyimide film designed for the purpose of the buffer function regarding stress with the resin to be bonded, the surface protection function, the insulation protection function, or the like.

The leads LD1 and the leads LD2 are arranged to extend in an X direction orthogonal to a Y direction to which the gas flows, and has a function to perform an input and an output with an external circuit. On the other hand, a projected lead PLD is formed along the Y direction of the lead frame LF. This projected lead PLD is connected to the chip mounting unit TAB1, but is not connected to the pads PD1 and the pads PD2 that are formed on the semiconductor chip CHP1. In other words, the projected lead PLD is different from the leads LD1 and the leads LD2 that function as the input and output terminals.

Here, in the fifth embodiment, the semiconductor chip CHP1 is mounted on the chip mounting unit TAB1 in such a manner that the long side of the rectangular shaped semiconductor chip CHP1 is parallel to the gas flow direction (arrow direction, Y direction). A plurality of pads PD1 and PD2 are arranged to the long side of the semiconductor chip CHP1 along the long side direction. Each of the plurality of pads PD1 and each of the plurality of leads LD1 are connected by a plurality of wires W1 arranged astride the long side of the semiconductor chip CHP1. Similarly, each of the plurality of pads PD2 and each of the plurality of leads LD2 are connected by a plurality of wires W2 arranged astride the long side of the semiconductor chip CHP1. Since the plurality of pads PD1 and PD2 are thus arranged along the long side of the rectangular-shaped semiconductor chip CHP1, a large number of pads PD1 and PD2 can be formed on the semiconductor chip CHP1 as compared with the case where the plurality of pads PD1 and PD2 are arranged in the short side direction of the semiconductor chip CHP1. Particularly, in the fifth embodiment, since the semiconductor chip CHP1 is formed with not only the control unit CU, but also together with the flow sensing unit FDU, the region on the semiconductor chip CHP1 can be effectively utilized by arranging a large number of pads PD1 and PD2 along the long direction of the semiconductor chip CHP1.

Subsequently, as shown in FIG. 22B, the lead frame LF is formed with the chip mounting unit TAB1, and the semiconductor chip CHP1 is mounted on this chip mounting unit TAB1. This semiconductor chip CHP1 is bonded to the chip mounting unit TAB1 by an adhesive ADH1. The rear surface of the semiconductor chip CHP1 is formed with a diaphragm DF (thin plate part), and the surface of the semiconductor chip CHP1 facing the diaphragm DF is formed with the flow sensing unit FDU. On the other hand, the bottom of the chip mounting unit TAB1 existing under the diaphragm. DF is formed with an opening OP1.

Further, as shown in FIG. 22B, the surface (top face) of the semiconductor chip CHP1 is formed with the pads PD1 and the pads PD2 in addition to the flow sensing unit FDU, and these pads PD1 are connected to the leads LD1 formed on the lead frame LF through wires W1. Similarly, the pads PD2 are connected to the leads LD2 formed on the lead frame LF through wires W2.

Further, as shown in FIG. 22C, the lead frame LF is formed with the chip mounting unit TAB1 and the projected lead PLD, and the chip mounting unit TAB1 and the projected lead PLD are integrally formed. On this chip mounting unit TAB1, the semiconductor chip CHP1 is bonded by adhesive ADH1. The rear surface of the semiconductor chip CHP1 is formed with the diaphragm DF (thin plate part), and the surface of the semiconductor chip CHP1 facing the diaphragm DF is formed with flow sensing unit FDU. On the other hand, the bottom of the chip mounting unit TAB1 existing under the diaphragm DF is formed with the opening OP1. Further, the surface of the semiconductor chip CHP1 is formed with the control unit CU to be arranged side by side with the flow sensing unit FDU.

As the adhesive ADH1 that connects the semiconductor chip CHP1 and the chip mounting unit TAB1, for example, a thermoset resin such as epoxy resin and polyethylene resin, and a thermoplastic resin such as polyimide resin and acryl resin can be used.

For example, the bonding of the semiconductor chip CHP1 to the chip mounting unit TAB1, as shown in FIG. 22D, can be performed by applying the adhesive ADH1. FIG. 22D is a plan view showing the rear surface of the semiconductor chip CHP1. As shown in FIG. 22D, the rear surface of the semiconductor chip CHP1 is formed with the diaphragm DF, and the adhesive ADH1 is applied to surround this diaphragm DF. Note that, in FIG. 22C, an example of applying the adhesive ADH1 to surround the diaphragm DF in a square shape is shown, but the embodiment is not limited to this, and, for example, the adhesive ADH1 may be applied to surround the diaphragm DF in an optional shape such as an elliptical shape.

In the flow sensor FS5 of the fifth embodiment, the mounting configuration of the flow sensor FS5 before being sealed with resin is as described above, and the mounting configuration of the flow sensor FS5 after being sealed with the resin will be described below.

Figure 23:
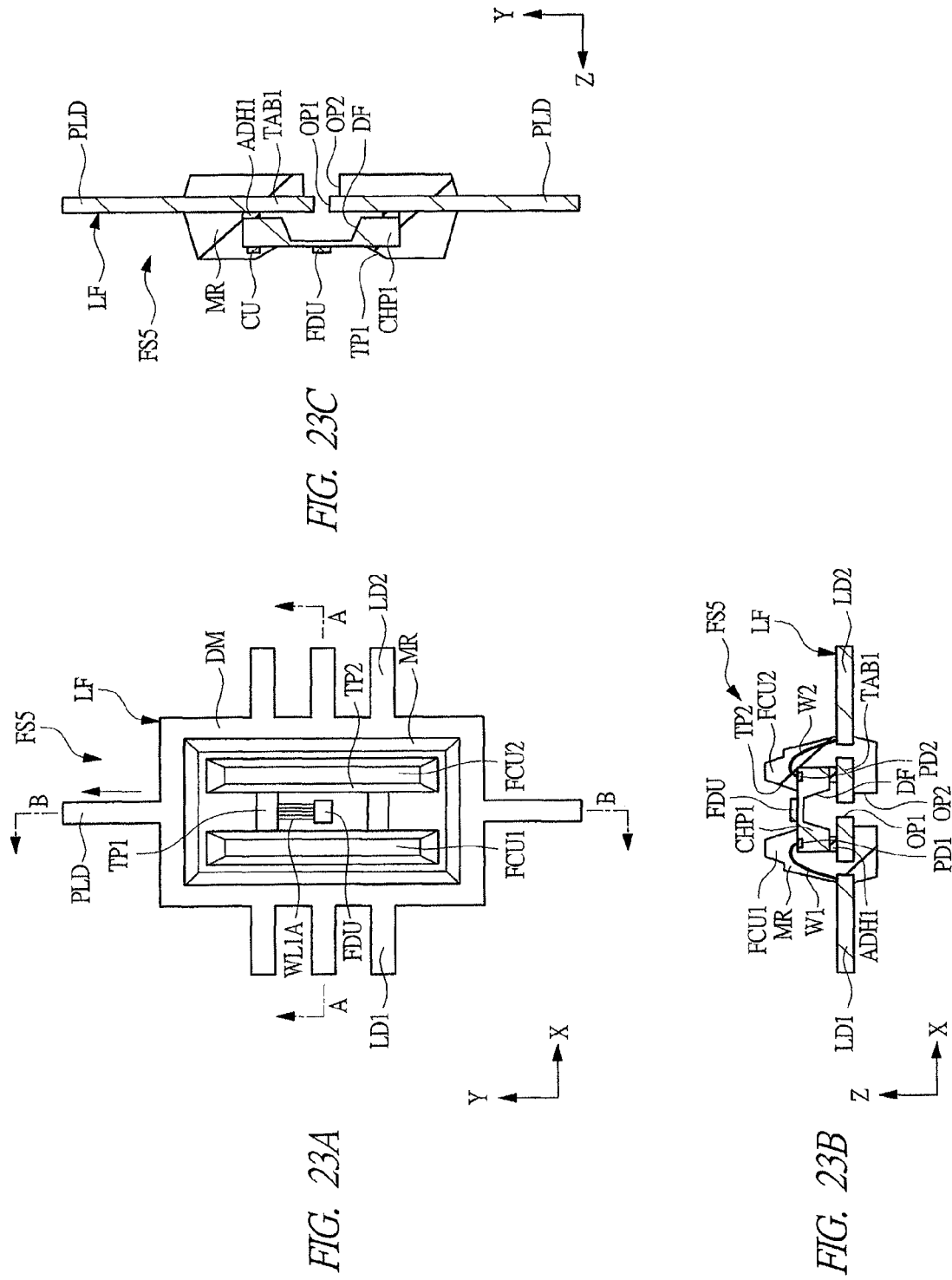
FIG. 23A is a plan view showing the mounting configuration after sealing the flow sensor according to the fifth embodiment.
FIG. 23B is a cross-sectional view taken along the line A-A of FIG. 23A.
FIG. 23C is a cross-sectional view taken along the line B-B of FIG. 23A.

FIGS. 23A to 23C are views showing the mounting configuration of the flow sensor FS5 of the fifth embodiment, and are views showing the configuration after being sealed with resin. Particularly, FIG. 23A is a plan view showing the mounting configuration of the flow sensor FS5 of the fifth embodiment. FIG. 23B is a cross-sectional view taken along the line A-A of FIG. 23A, and FIG. 23C is a cross-sectional view taken along the line B-B of FIG. 23A.

The flow sensor FS5 of the fifth embodiment also has a structure in which, as shown in FIG. 23A, a part of the semiconductor chip CHP1 and the whole of the semiconductor chip CHP2 are covered with the resin MR in a state in which the flow sensing unit FDU formed on the semiconductor chip CHP1 is exposed (the first feature). In other words, in the fifth embodiment, the region of the semiconductor chip CHP1 except for the flow sensing unit FDU and the whole area of the semiconductor chip CHP2 are collectively sealed with the resin MR. This sealing with the resin MR can be performed in a state in which the semiconductor chip CHP1 formed with the flow sensing unit FDU is fixed by a mold. Therefore, while suppressing the displacement of the semiconductor chip CHP1, a part of the semiconductor chip CHP1 and the semiconductor chip CHP2 can be sealed with the resin MR. This means, according to the flow sensor FS5 of the fifth embodiment, that a part of the semiconductor chip CHP1 and the whole region of the semiconductor chip CHP2 can be sealed with the resin MR, while suppressing the displacement of each flow sensor FS3, and also that variations of the position of the flow sensing unit FDU formed on the semiconductor chip CHP1 can be suppressed. As a result, according to the fifth embodiment, because the position of the flow sensing unit FDU detecting the flow rate of gas can be matched with each flow sensor FS5, prominent effects can be obtained where performance variations in detecting the gas flow rate can be suppressed in each flow sensor FS5.

Subsequently, also in the flow sensor FS5 of the fifth embodiment, as shown in FIG. 23A, the height of the resin MR (sealing body) at both sides across the exposed flow sensing unit FDU is higher than the height of the surface of the semiconductor chip CHP1 including the flow sensing unit FDU (the second feature). In other words, the exposed flow sensing unit FDU has its periphery surrounded by the resin MR, and the height of the resin MR that surrounds the flow sensing unit FDU becomes higher than the height of the flow sensing unit FDU. According to such second feature of the fifth embodiment, because the component parts can be prevented from colliding against the exposed flow sensing unit FDU upon mounting and assembling component parts, breakage of the semiconductor chip CHP1 formed with the flow sensing unit FDU can be prevented. That is, the height of the resin MR that clamps the flow sensing unit FDU is higher than the height of the exposed flow sensing unit FDU. For this reason, when the component parts contact the flow sensor, first, the component parts contact the resin MR whose height is high, and therefore, breakage of the semiconductor chip CHP1, which occurs when the exposed surface (XY surface) of the semiconductor chip CHP1 including the flow sensing unit FDU whose height is low contacts the component parts, can be prevented.

Particularly, in the cross-section (FIG. 23C) of the direction parallel to the air flow, there is a feature that the height of the resin MR (sealing body) is higher than the height of the surface of the semiconductor chip CHP1 including the flow sensing unit FDU (the second A feature). In this manner, the air flow flowing above the flow sensing unit FDU can be stabilized, and thus, the flow detection accuracy in the flow sensing unit FDU can be improved. The specific second A feature will be described in detail in the twelfth embodiment to be described later.

Further, when the interface between the semiconductor chip and the resin MR peels off by heating cycle due to the temperature change and the like in an optional cross section in the air flow direction (Y direction), there is a possibility of causing problems that cracks grow from the peeled part to become large cracks or the air flow is disturbed at the peeled part, and then, the disturbed air flow flows into the flow sensing unit FDU, thereby making accurate measurement of the air flow rate difficult. Hence, in the fifth embodiment, for example, as shown in FIG. 23C, the resin MR has a shape partially covering the upper part of the semiconductor chip CHP1 in the cross-section of the direction (Y direction) parallel to the air flow (the second B feature). Consequently, in the cross-section of the direction parallel to the air flow, a contact area between the semiconductor chip CHP1 and the resin MR is increased such that the peeling of the interface between the semiconductor chip CHP1 and the resin MR can be prevented. As a result, according to the fifth embodiment, a problem of cracks growing from the peeled part to become large cracks can be prevented and the disturbance of the air flow above the flow sensing unit FDU can be suppressed; thus, this can lead to the improvement of measurement accuracy of the accurate air flow at the flow sensing unit FDU.

Next, also in the flow sensor FS5 of the fifth embodiment, as shown in FIG. 23A, a pair of air current control units FCU1 and FCU2 clamping the exposed flow sensing unit FDU and having a long shape in the direction parallel to the traveling direction (arrow direction, Y direction) of the gas that flows on the flow sensing unit FDU is formed integrally with the resin MR (sealing body) (the third feature). In this manner, first, the pair of air current control units FCU1 and FCU2 forms the flow paths of both sides of the gas that flows on the upper part of the flow sensing unit FDU. The pair of air current control units FCU1 and FCU2 is formed integrally with the resin MR with very high accuracy by clamping with a die of high dimension accuracy. As a consequence, according to the flow sensor FS5 of the fifth embodiment, a flow of the gas is not disturbed by dimension accuracy of the pair of air current control units FCU1 and FCU2, and the flow rate of the gas can be accurately measured. Furthermore, in the fifth embodiment, as described above, the pair of air current control units FCU1 and FCU2 forms the flow paths of both sides of the gas that flows on the upper part of the flow sensing unit FDU. Hence, the gas can be let flow above the flow sensing unit FDU in a state in which the gas flow path dimension is made narrower. As a result, according to the flow sensor FS5 of the fifth embodiment, particularly even when the flow rate of the gas that flows is small, lowering of the detection accuracy of the gas flow rate can be suppressed.

Further, as shown in FIG. 23A, an interface region between the flow sensing unit FDU exposed from the resin MR (sealing body) and the resin MR (sealing body) is in a tapered shape, and in the interface region, the tapered shape of the interface region orthogonal to the traveling direction (arrow direction, Y direction) of the gas that flows above the flow sensing unit FDU is steeper than the tapered shape of the interface region parallel to the traveling direction of the gas (The fourth feature). That is, the angle of the tapered shape TP2 in the direction (X direction) orthogonal to the flow of the gas of the flow sensing unit FDU is steeper than an tapered shape TP1 in the direction (Y direction) to which the gas flows of the flow sensing unit FDU. Thus, in the fifth embodiment, by reducing the angle of the tapered shape TP1 in the gas flow direction (Y direction), the dimension change of the flow path of the gas flowing in the Y direction can be reduced. This can prevent the gas from separating from the resin MR and can suppress deviations of measurement of the flow rate due to back-flow and eddy-flow of the gas. On the other hand, by increasing the angle of a tapered shape TP2 in the direction (X direction) orthogonal to the gas flow direction, a wall of the gas flow path can be formed, and the flow of the gas to the X direction can be suppressed.

Subsequently, while the flow sensor FS5 of the fifth embodiment also has the fifth feature and the sixth feature, as the premise of describing these features, the structures of FIGS. 23B and 23C will be described. FIG. 23B is a cross-sectional view taken along the line A-A of FIG. 23A, and FIG. 23C is a cross-sectional view taken along the line B-B of FIG. 23A.

As shown in FIG. 23B, the lead frame LF is formed with a chip mounting unit TAB1, and the semiconductor chip CHP1 is bonded on this chip mounting unit TAB1 by the adhesive ADH1. The rear surface of the semiconductor chip CHP1 is formed with the diaphragm DF, and the bottom of the chip mounting unit TAB1 existing under this diaphragm DF is formed with the opening OP1. Further, the rear surface of the lead frame LF is covered with the resin MR, but in the rear surface of the lead frame LF, the resin MR formed on the rear surface of the chip mounting unit TAB1 is formed with an opening OP2. The opening OP1 formed on this chip mounting unit TAB1 communicates with the opening OP2 formed in the resin MR, and the internal space of the diaphragm DF becomes continuous with the external space of the flow sensor FS5 through these openings OP1 and OP2. At this time, the cross-sectional area of the opening OP1 is smaller than the cross-sectional area of the opening OP2. To put it another way, the cross-sectional area of the opening OP1 is larger than the cross-sectional area of the opening OP2.

On the other hand, the surface of the semiconductor chip CHP1 facing the diaphragm DF is formed with the flow sensing unit FDU, and is further formed with the pads PD1 and the PD2. These pads PD1 are connected to the leads LD1 formed on the lead frame LF through the wires W1, and the pads PD2 are connected to the leads LD2 formed on the lead frame LF through the wires W2. In addition, in the flow sensor FS5 of the fifth embodiment, in a state in which the flow sensing unit FDU and its vicinity are exposed, the other region (including the pads PD1 and pads PD2), that is, a part of the semiconductor chip CHP1, the wires W1, the leads D1, the wires W2, and a part of the leads LD2 are collectively sealed with the resin MR. At this time, the interface region between the exposed flow sensing unit FDU and the resin MR are in a tapered shape TP2, and the pair of air current control units FCU1 and FCU2 is formed integrally with the resin MR in such a manner as to clamp the flow sensing unit FDU.

As shown in FIG. 23C, the lead frame LF is formed with the chip mounting unit TAB1, and the semiconductor chip CHP1 is bonded on this chip mounting unit TAB1 by the adhesive ADH1. The rear surface of the semiconductor chip CHP1 is formed with the diaphragm DF, and the bottom of the chip mounting unit TAB1 existing under this diaphragm DF is formed with the opening OP1, and further, the resin MR covering the rear surface of the chip mounting unit TAB1 is formed with the opening OP2. The opening OP1 formed on this chip mounting unit TAB1 communicates with the opening OP2 formed in the resin MR, and the internal space of the diaphragm DF becomes continuous with the external space of the flow sensor FS5 through these openings OP1 and OP2. At this time, the cross-sectional area of the opening OP1 is smaller than the cross-sectional area of the opening OP2. To put it another way, the cross-sectional area of the opening OP1 is larger than the cross-sectional area of the opening OP2.

On the other hand, the surface of the semiconductor chip CHP1 facing the diaphragm DF is formed with the flow sensing unit FDU and a control unit CU, and the resin MR is formed in such a manner as to surround the periphery of the semiconductor chip CHP1. At this time, the interface region between the flow sensing unit FDU and the resin MR is in the tapered shape TP1, and the angle of this tapered shape TP1 is gentler than the angle of the tapered shape TP2 shown in FIG. 23B.

Here, also in the fifth embodiment, to prevent the resin MR from infiltrating into the internal space of the diaphragm DF, for example, it is premised on using a configuration in which the adhesive ADH1 is applied to surround the diaphragm. DF formed on the rear surface of the semiconductor chip CHP1, and to avoid inconvenience due to such configuration, as shown in FIGS. 23B and 23C, the bottom of the chip mounting unit TAB1 existing under the diaphragm DF formed on the rear surface of the semiconductor chip CHP1 is formed with the opening OP1, and further, the resin MR covering the rear surface of the chip mounting unit TAB1 is provided with the opening OP2 (the fifth feature). In this manner, according to the flow sensor FS5 of the fifth embodiment, the internal space of the diaphragm DF communicates with the external space of the flow sensor FS5 through the opening OP1 formed at the bottom of the chip mounting unit TAB1 and the opening OP2 formed in the resin MR. As a result, the pressure of the internal space of the diaphragm DF can be made equal to the pressure of the external space of the flow sensor FS5 so that the stress applied on the diaphragm DF can be suppressed.

Further, also in the flow sensor FS5 of the fifth embodiment, not only the semiconductor chip CHP1 and the leads LD1, but also the semiconductor chip CHP1 and the leads LD2 are connected by the wires W1 and W2 (the sixth feature). In this manner, a solder ball is not used in the fifth embodiment, and therefore, the manufacturing cost can be reduced.

Figure 24:
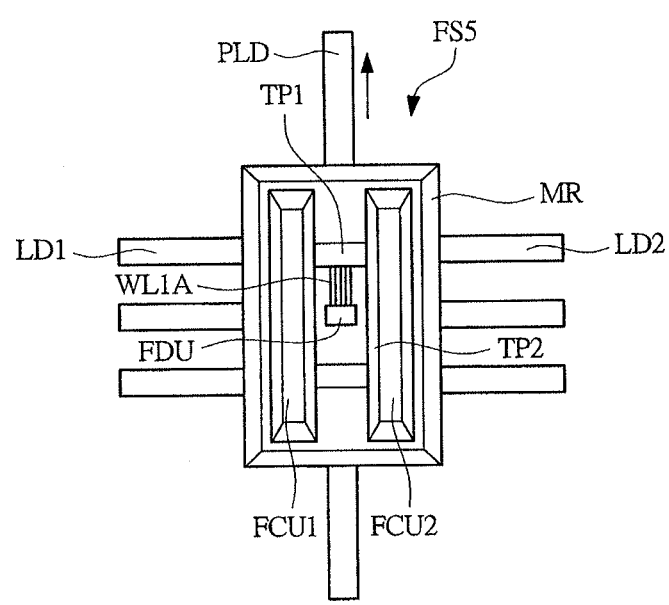
FIG. 24 is a plan view showing the mounting configuration of the flow sensor after removing the dam bar.

While the mounting configuration of the flow sensor FS5 of the fifth embodiment is facilitated in the above-described manner, in the actual flow sensor FS5, a dam bar DM configuring the outer frame body of a lead frame LF is removed after being sealed with the resin MR. FIG. 24 is a plan view showing the mounting configuration of the flow sensor FS5 after removing the dam bar DM. As shown in FIG. 24, by disconnecting the dam bar DM, it is found that a plurality of electric signals can be independently taken out from a plurality of leads LD1 and leads LD2.

Manufacturing Method of Flow Sensor of Fifth Embodiment

The flow sensor FS5 of the fifth embodiment is configured as described above, and its manufacturing method will be described below with reference to FIGS. 25 to 28. FIGS. 25 to 28 show a manufacturing process in the cross-section taken along the line B-B of FIG. 23A.

Figure 25:
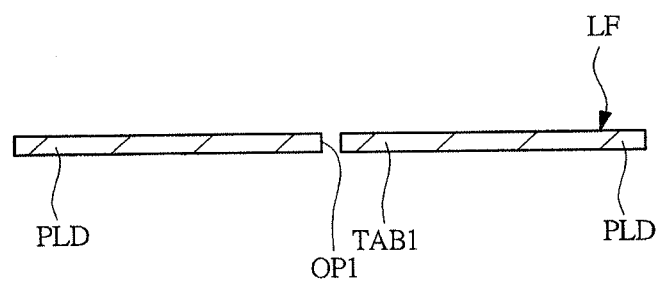
FIG. 25 is a cross-sectional view showing the manufacturing process of the flow sensor according to the fifth embodiment.

First, as shown in FIG. 25, for example, the lead frame LF composed of a copper material is prepared. This lead frame LF is integrally formed with the chip mounting unit TAB1 and a projected lead PLD, and the bottom of the chip mounting unit TAB1 is formed with the opening OP1.

Figure 26:
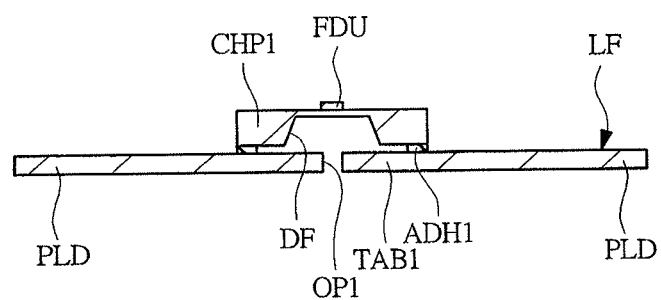
FIG. 26 is a cross-sectional view showing the manufacturing process of a flow sensor continued from FIG. 25.

Subsequently, as shown in FIG. 26, the semiconductor chip CHP1 is mounted on the chip mounting unit TAB1. Specifically, the semiconductor chip CHP1 is bonded on the chip mounting unit TAB1 formed on the lead frame LF by the adhesive ADH1. At this time, the semiconductor chip CHP1 is mounted on the chip mounting unit TAB1 so that the diaphragm DF formed on the semiconductor chip CHP1 communicates with the opening OP1 formed at the bottom of the chip mounting unit TAB1. The semiconductor chip CHP1 is formed with the flow sensing unit FDU, wirings (not shown), and the control unit CU by the ordinary semiconductor manufacturing process. Particularly, the control unit CU is formed with the semiconductor elements (not shown) such as MISFET and wirings (not shown) by the ordinary semiconductor manufacturing process. The diaphragm. DF is formed on the position of the rear surface of the semiconductor chip CHP1 facing the flow sensing unit FDU that is formed on the surface of the semiconductor chip CHP1, for example, by anisotropic etching.

Next, although not illustrated, the pads PD1 formed on the semiconductor chip CHP1 and the leads LD1 formed on the lead frame LF are connected by the wires W1 (Wire Bonding). Similarly, the pads PD2 formed on the semiconductor chip CHP1 are connected to the leads LD2 by the wires W2. The wires W1 to W2 are formed of, for example, gold wires.

Figure 27:
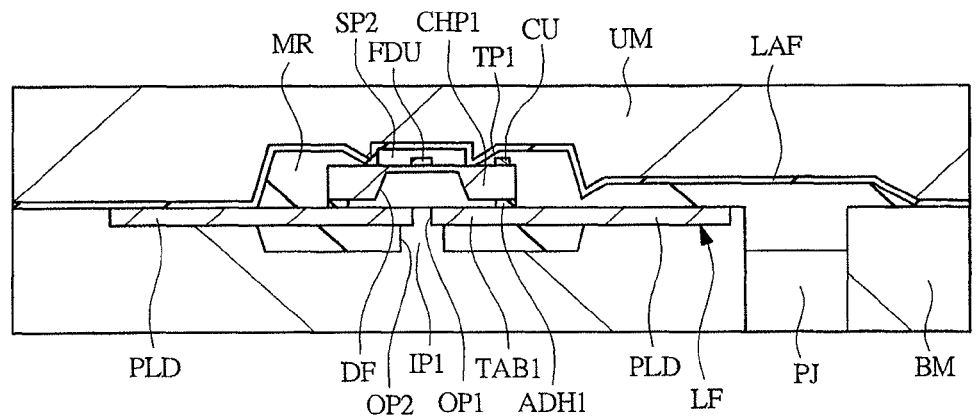
FIG. 27 is a cross-sectional view showing the manufacturing process of a flow sensor continued from FIG. 26.

After that, as shown in FIG. 27, the surface of the semiconductor chip CHP1 excluding the flow sensing unit FDU and its vicinity is sealed with the resin MR (Die Process). Specifically, as shown in FIG. 27, the lead frame LF mounting the semiconductor chip CHP1 is clamped by an upper die UM and a lower die BM interposing a first space. After that, the resin MR is poured into this first space under heating by using a plunger PJ, whereby the surface of the semiconductor chip CHP1 excluding the flow sensing unit FDU and its vicinity is sealed with the resin MR. At this time, as shown in FIG. 27, since the internal space of the diaphragm DF is isolated from the first space by the adhesive ADH1, the infiltration of the resin MR into the internal space of the diaphragm DF can be prevented even upon filling the first space with the resin MR.

Further, in the fifth embodiment, since the sealing with the resin MR can be performed in a state in which the semiconductor chip CHP1 formed with the flow sensing unit FDU is fixed by the mold, a part of the semiconductor chip CHP1 can be sealed with the resin MR, while suppressing the displacement of the semiconductor chip CHP1. This means that, according to the manufacturing method of the flow sensor of the fifth embodiment, a part of the semiconductor chip CHP1 can be sealed with the resin MR, while suppressing the displacement of each flow sensor, and also that variations in the position of the flow sensing unit FDU formed on the semiconductor chip CHP1 can be suppressed. As a result, according to the fifth embodiment, the position of the flow sensing unit FDU detecting the flow rate of the gas can be matched with each flow sensor. Hence, prominent effects can be obtained where performance variations in detecting the flow rate of the gas in each flow sensor can be suppressed.

Here, a feature of the manufacturing method of the flow sensor of the fifth embodiment lies in that the lead frame LF mounting the semiconductor chip CHP1 is clamped by the upper die UM and the lower die BM so as to surround the flow sensing unit FDU formed on the semiconductor chip CHP1 by the second space SP2 isolated from the first space. In this manner, according to the fifth embodiment, while exposing the flow sensing unit FDU and its vicinity that are formed on the semiconductor chip CHP1, the other surface region of the semiconductor chip CHP1 can be sealed.

Further, a feature of the manufacturing method of the flow sensor of the fifth embodiment lies in that, upon clamping the lead frame LF mounting the semiconductor chip CHP1 by the upper die UM and the lower die BM, an elastic film LAF is interposed between the lead frame LF mounting the semiconductor chip CHP1 and the upper die UM. In this manner, for example, when the thickness of the semiconductor chip CHP1 is thinner than an average thickness, a gap occurs in the case that the lead frame LF mounting the semiconductor chip CHP1 is clamped by the upper die UM and the lower die BM; but since this gap can be filled up with the elastic film LAF, the leakage of the resin onto the semiconductor chip CHP1 can be prevented. On the other hand, when the thickness of the semiconductor chip CHP1 is thicker than the average thickness, in the case that the lead frame LF mounting the semiconductor chip CHP1 is clamped by the upper die UM and the lower die BM, since the elastic film LAF is soft, a dimension in the thickness direction of the elastic film LAF changes so as to absorb the thickness of the semiconductor chip CHP1. In this manner, even when the thickness of the semiconductor chip CHP1 is thicker than the average thickness, a force applied to the semiconductor chip CHP1 more than necessary can be prevented. As a result, breakage of the semiconductor chip CHP1 can be prevented.

Here, also in the manufacturing method using the elastic film LAF described above, when the semiconductor chip CHP1 is clamped by the die through the elastic film LAF, there is a possibility of creating a problem that a clamp load is applied to the flow sensing unit FDU and the thin diaphragm DF on the semiconductor chip CHP1, thereby breaking the flow sensing unit FDU and the thin diaphragm DF.

Hence, in the fifth embodiment, as shown in FIG. 27, to prevent such breakage of the flow sensing unit FDU and the thin diaphragm DF, a manufacturing method is used, in which the second space SP2 is provided on the upper die UM including a projected area of the flow sensing unit FDU formed on the semiconductor chip CHP1, and the elastic film LAF is absorbed into the second space SP2 of the upper die UM. Thus, according to the fifth embodiment, by the manufacturing method using a die structure and the elastic film LAF, the die can be clamped without bringing the flow sensing unit FDU formed on the semiconductor chip CHP1 into contact with the elastic film. LAF, so that breakage of the flow sensing unit FDU and the thin diaphragm DF can be prevented.

As the elastic film LAF, for example, high-polymer materials such as Teflon (Registered Trademark) and a fluorine resin can be used.

Further, the feature of the manufacturing method of the flow sensor of the fifth embodiment lies in using a configuration in which a partial die IP1 formed on the lower die BM is inserted onto a pedestal part larger in cross-sectional area than an insert part. In this case, as shown in FIG. 27, the insert part of the partial die IP1 is inserted into the opening OP1, and the pedestal part of the partial die IP1 is adhered to the bottom of the chip mounting unit TAB1. As a result, even when a slight gap occurs between the insert part of the partial die IP1 and the opening OP1, the pedestal part is firmly pressed against the rear surface of the chip mounting unit TAB1 so that the infiltration of the resin MR into the opening OP1 can be prevented. In other words, in the fifth embodiment, the partial die IP1 is configured such that the insert part is provided on the pedestal part larger in cross-sectional area than the insert part, and therefore, by a combination of a characteristic point that the resin MR does not come down to the opening OP1 due to the pedestal part and a characteristic point that a stepped part formed between the pedestal part and the insert part is pressed against the chip mounting unit TAB1, the resin MR can be effectively prevented from infiltrating into the internal space of the diaphragm DF through the opening OP1.

Figure 28:
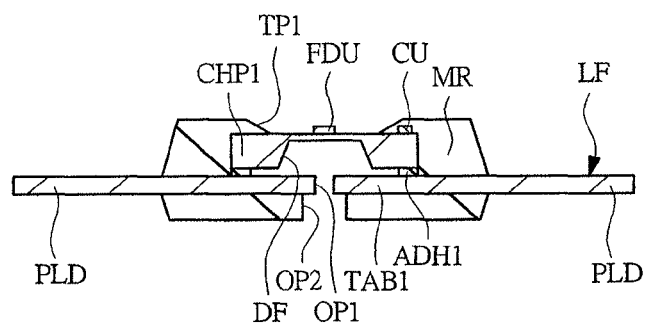
FIG. 28 is a cross-sectional view showing the manufacturing process of a flow sensor continued from FIG. 27.

After that, as shown in FIG. 28, at the stage of the resin MR having cured, the lead frame LF mounting the semiconductor chip CHP1 is dismounted from the upper die UM and the lower die BM. In this manner, the flow sensor FS5 of the fifth embodiment can be manufactured. In the flow sensor FS5 manufactured here, as a result of using the lower die BM formed with the partial die IP1 in the resin sealing process, as shown in FIG. 28, the opening OP1 is formed at the bottom of the chip mounting unit TAB1, and the opening OP2 communicating with this opening OP1 is formed in the resin MR. This opening OP2 is generated as a result of forming the pedestal part in the partial die IP1, and the cross-sectional area of this opening OP2 becomes larger than the cross-sectional area of the opening OP1. Thus, according to the flow sensor FS5 of the fifth embodiment, the internal space of the diaphragm DF communicates with the external space of the flow sensor FS5 through the opening OP1 formed at the bottom of the chip mounting unit TAB1 and the opening OP2 formed in the resin MR. As a result, the pressure of the internal space of the diaphragm DF can be made equal to the pressure of the external space of the flow sensor FS5, so that the stress applied on the diaphragm DF can be suppressed.

Sixth Embodiment

In the fifth embodiment, an example of a pair of air current control units FCU1 and FCU2 integrally formed with the resin MR (sealing body) has been described, in which the pair of air current control units FCU1 and FCU2 clamps an exposed flow sensing unit FDU and has a rectangular shape in the direction parallel to the traveling direction of the gas flowing on a flow sensing unit FDU. In the sixth embodiment, the flow sensor not provided with the air current control units FCU1 and FCU2 will be described.

Figure 29:
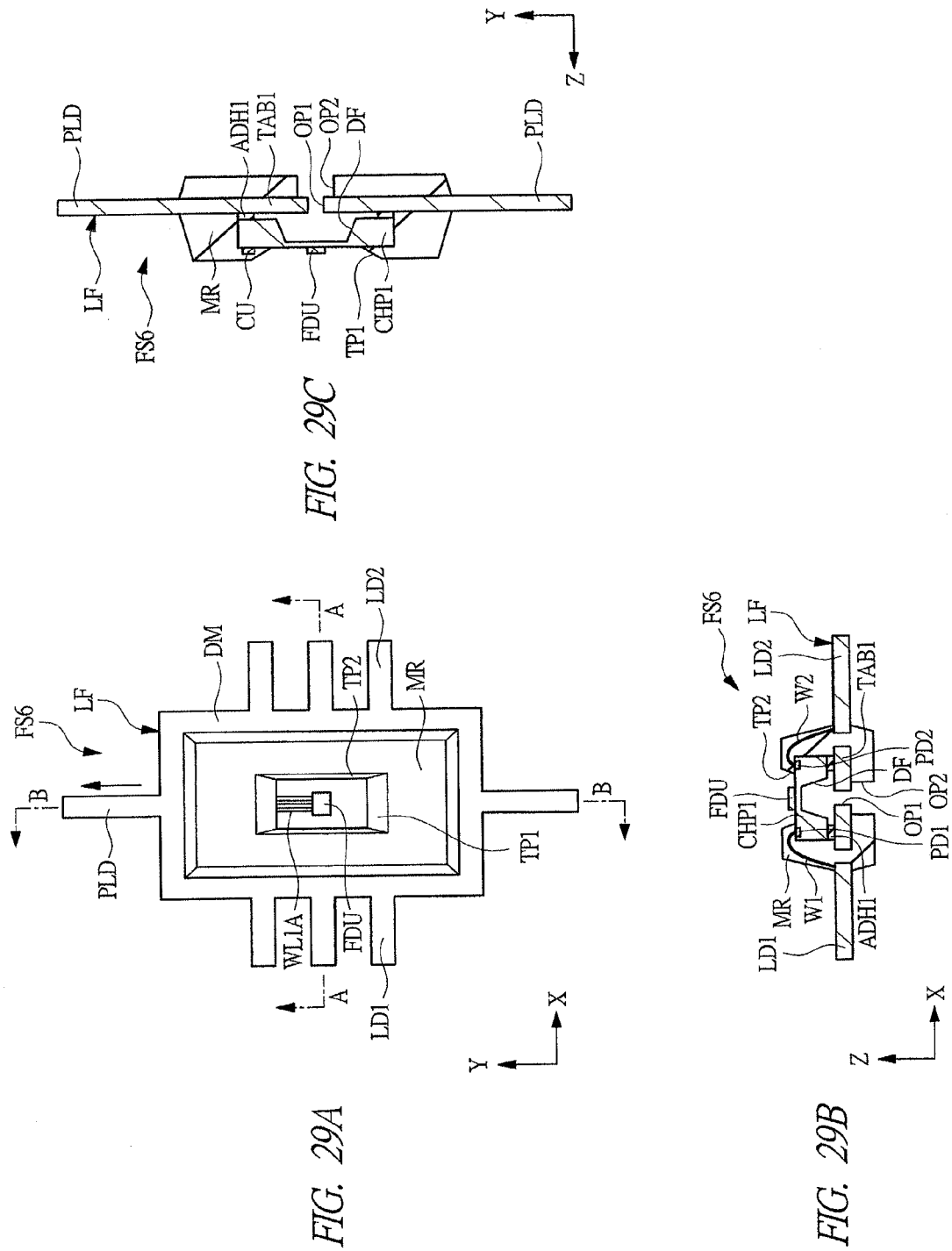
FIG. 29A is a plan view showing a mounting configuration after sealing a flow sensor according to a sixth embodiment.
FIG. 29B is a cross-sectional view taken along the line A-A of FIG. 29A.
FIG. 29C is a cross-sectional view taken along the line B-B of FIG. 29A.

FIGS. 29A to 29C are views showing the mounting configuration of the flow sensor FS6 of the sixth embodiment, and are views showing the configuration after being sealed with resin. Particularly, FIG. 29A is a plan view showing the mounting configuration of the flow sensor FS6 of the sixth embodiment. FIG. 29B is a cross-sectional view taken along the line A-A of FIG. 29A, and FIG. 29C is a cross-sectional view taken along the line B-B of FIG. 29A.

The mounting configuration of the flow sensor FS6 of the sixth embodiment is the same as the mounting configuration of the flow sensor FS5 of the fifth embodiment except that the air current control units FCU1 and FCU2 are not provided. Consequently, also in the flow sensor FS6 of the sixth embodiment, the first feature to the second feature and the fourth feature to the sixth feature as described in the fifth embodiment are provided. The outermost surface (device forming surface) of a semiconductor chip CHP1 may be formed with a polyimide film designed for the purpose of the buffer function regarding stress with the resin to be bonded, the surface protection function, the insulation protection function, or the like.

Specifically, the flow sensor FS6 of the sixth embodiment also has a structure, in which, as shown in FIG. 29A, a part of a semiconductor chip CHP1 is covered with resin MR in a state in which a flow sensing unit FDU formed on the semiconductor chip CHP1 is exposed (the first feature). In other words, in the sixth embodiment, the region of the semiconductor chip CHP1 except for the flow sensing unit FDU is collectively sealed with the resin MR. This sealing with the resin MR can be performed in a state in which the semiconductor chip CHP1 formed with the flow sensing unit FDU is fixed by a mold. Therefore, a part of the semiconductor chip CHP1 can be sealed with the resin MR, while suppressing the displacement of the semiconductor chip CHP1. This means that, according to the flow sensor FS6 of the sixth embodiment, a part of the semiconductor chip CHP1 can be sealed with the resin MR, while suppressing the displacement of each flow sensor FS6, and also that variations of the position of the flow sensing unit FDU formed on the semiconductor chip CHP1 can be suppressed. As a result, according to the sixth embodiment, because the position of the flow sensing unit FDU detecting a flow rate of gas can be matched with each flow sensor FS6, prominent effects can be obtained where performance variations in detecting the gas flow rate can be suppressed in each flow sensor FS6.

Subsequently, also in the flow sensor FS6 of the sixth embodiment, as shown in FIG. 29A, the height of the resin MR (sealing body) at both sides across the exposed flow sensing unit FDU is higher than the height of the surface of the semiconductor chip CHP1 including the flow sensing unit FDU (the second feature). In other words, the exposed flow sensing unit FDU has its periphery surrounded by the resin MR, and the height of the resin MR that surrounds the flow sensing unit FDU becomes higher than the height of the flow sensing unit FDU. According to such second feature of the sixth embodiment, because the component parts can be prevented from colliding against the exposed flow sensing unit FDU upon mounting and assembling component parts, breakage of the semiconductor chip CHP1 formed with the flow sensing unit FDU can be prevented. That is, the height of the resin MR clamping the flow sensing unit FDU is higher than the height of the exposed flow sensing unit FDU. For this reason, when the component parts contact the flow sensor, first, the component parts contact the resin MR whose height is high, and therefore, breakage of the semiconductor chip CHP1, which occurs when the exposed surface (XY surface) of the semiconductor chip CHP1 including the flow sensing unit FDU whose height is low contacts the component parts, can be prevented.

Particularly, in the cross-section (FIG. 29C) of the direction parallel to the air flow, there is a feature that the height of the resin MR (sealing body) is higher than the height of the surface of the semiconductor chip CHP1 including the flow sensing unit FDU (the second A feature). In this manner, the air flow flowing above the flow sensing unit FDU can be stabilized, and thus, the flow detection accuracy in the flow sensing unit FDU can be improved. The specific second A feature will be described in detail in the twelfth embodiment to be described later.

Further, when the interface between the semiconductor chip CHP1 and the resin MR peels off by heating cycle due to the temperature change and the like in an optional cross section in the air flow direction (Y direction), there is a possibility of causing problems that cracks grow from the peeled part to become large cracks or the air flow is disturbed at the peeled part, and then, the disturbed air flow flows into the flow sensing unit FDU, thereby making accurate measurement of the air flow rate difficult. Hence, in the sixth embodiment, for example, as shown in FIG. 29C, the resin MR has a shape partially covering the upper part of the semiconductor chip CHP1 in the cross-section of the direction (Y direction) parallel to the air flow (the second B feature). Consequently, in the cross-section of the direction parallel to the air flow, a contact area between the semiconductor chip CHP1 and the resin MR is increased such that the peeling of the interface between the semiconductor chip CHP1 and the resin MR can be prevented. As a result, according to the sixth embodiment, a problem of cracks growing from the peeled part to become large cracks can be prevented and the disturbance of the air flow on the upper part of the flow sensing unit FDU can be suppressed; and this can thus lead to the improvement of measurement accuracy of the accurate air flow at the flow sensing unit FDU.

Further, also in the flow sensor FS6 of the sixth embodiment, as shown in FIG. 29A, the interface region between the flow sensing unit FDU exposed from the resin MR (sealing body) and the resin MR (sealing body) is in a tapered shape, and in the interface region, the tapered shape of the interface region orthogonal to the traveling direction (arrow direction, Y direction) of the gas that flows above the flow sensing unit FDU is steeper than the tapered shape of the interface region parallel to the traveling direction of the gas (the fourth feature). That is, the angle of the tapered shape TP2 in the direction (X direction) orthogonal to the flow of the gas of the flow sensing unit FDU is steeper than the angle of the tapered shape TP1 in the direction (Y direction) to which the gas flows of the flow sensing unit FDU. Thus, in the sixth embodiment, by reducing the angle of the tapered shape TP1 in the gas flow direction (Y direction), the dimension change of the flow path of the gas flowing in the Y direction can be reduced. This can prevent the gas from separating from the resin MR and can suppress deviations of measurement of the flow rate due to back-flow and eddy-flow of the gas. On the other hand, by increasing the angle of a tapered shape TP2 in the direction (X direction) orthogonal to the gas flow direction, the wall of the gas flow path can be formed, and the flow of the gas to the X direction can be suppressed.

Further, also in the sixth embodiment, to prevent the resin MR from infiltrating into the internal space of the diaphragm DF, for example, it is premised on using a configuration in which the adhesive ADH1 is applied to surround the diaphragm DF formed on the rear surface of the semiconductor chip CHP1, and to avoid inconvenience due to such configuration, as shown in FIGS. 29B and 29C, the bottom of a chip mounting unit TAB1 existing under the diaphragm DF formed on the rear surface of the semiconductor chip CHP1 is formed with an opening OP1, and further, the resin MR covering the rear surface of the chip mounting unit TAB1 is formed with an opening OP2 (the fifth feature). Thereby, according to the flow sensor FS6 of the sixth embodiment, the internal space of a diaphragm DF communicates with the external space of the flow sensor FS6 through the opening OP1 formed at the bottom of the groove of the chip mounting unit TAB1 and the opening OP2 formed in the resin MR. As a result, the pressure of the internal space of the diaphragm DF can be made equal to the pressure of the external space of the flow sensor FS6 so that the stress applied on the diaphragm DF can be suppressed.

Further, also in the flow sensor FS6 of the sixth embodiment, the semiconductor chip CHP1 and the leads LD1 are connected by wires W1, and the semiconductor chip CHP1 and the leads LD2 are connected by wires W2 (the sixth feature). In this manner, in the sixth embodiment, a solder ball is not used, and therefore, the manufacturing cost of the flow sensor can be reduced.

Figure 30:
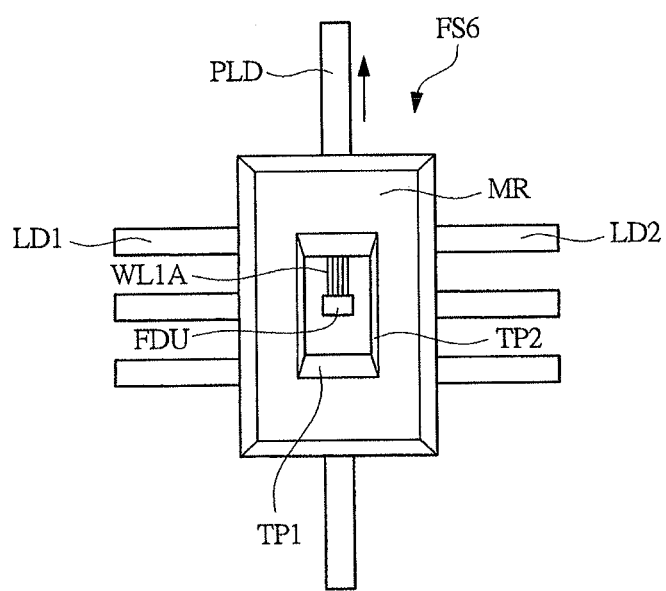
FIG. 30 is a plan view showing the mounting configuration of the flow sensor after removing the dam bar.

In the above-described manner, while the mounting configuration of the flow sensor FS6 of the sixth embodiment is facilitated, in the actual flow sensor FS6, a dam bar DM configuring the outer frame body of a lead frame LF is removed after being sealed with the resin MR. FIG. 30 is a plan view showing the mounting configuration of the flow sensor FS6 after the dam bar DM is removed. As shown in FIG. 30, it is understood that a plurality of electric signals can be independently taken out from a plurality of leads LD1 and leads LD2 by disconnecting the dam bar DM.

Seventh Embodiment

In the first embodiment to the second embodiment, a configuration has been described, in which the internal space of the diaphragm DF is made to communicate with the external spaces of the flow sensors FS1 to FS2 by providing the opening OP1 for the wire board WR. Further, in the third embodiment to the sixth embodiment, a configuration has been described, in which the internal space of the diaphragm DF is made to communicate with the external space of the flow sensors FS3 to FS6 through the opening OP1 formed in the chip mounting unit TAB1 and the opening OP2 formed in the resin MR. In a seventh embodiment, a configuration will be described, in which the internal space of the diaphragm is made to communicate with the external space of the flow sensor by using another means different from these means.

Figure 31B:
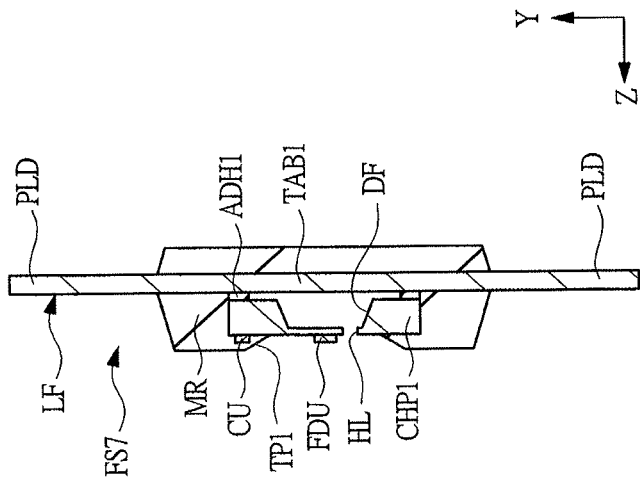
FIG. 31B is a cross-sectional view taken along the line A-A of FIG. 31A.
Figure 31A:
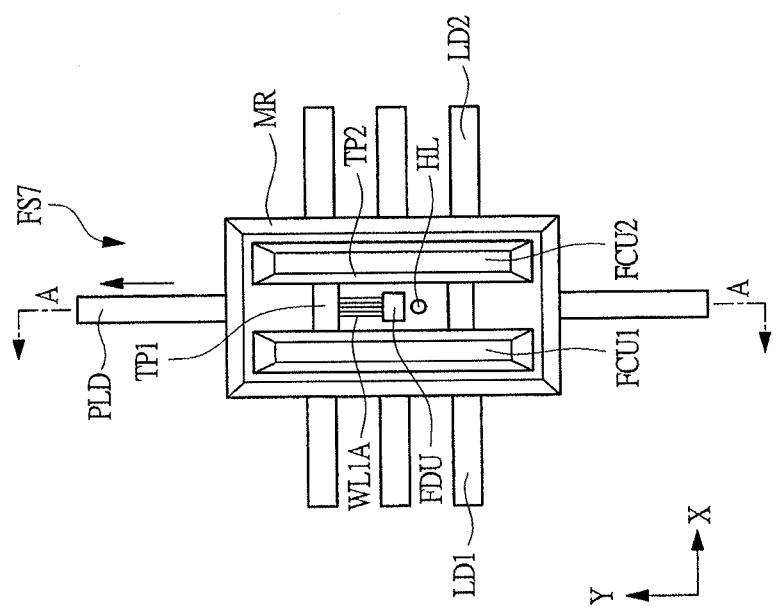
FIG. 31A is a plan view showing a mounting configuration after sealing a flow sensor according to a seventh embodiment.

FIGS. 31A and 31B are views showing a mounting configuration of a flow sensor FS7 of the seventh embodiment. Particularly, FIG. 31A is a plan view showing amounting configuration of the flow sensor FS7 according to the seventh embodiment, and FIG. 31B is a cross-sectional view taken along the line A-A of FIG. 31A. The mounting configuration of the flow sensor FS7 of the seventh embodiment shown in FIGS. 31A and 31B is almost the same as that of the flow sensor FS5 of the fifth embodiment shown in FIGS. 23A to 23C, and therefore, different points therebetween will be described.

As shown in FIG. 31A, in the flow sensor FS7 of the seventh embodiment, a hole HL is formed in the vicinity of a flow sensing unit FDU exposed from resin MR. In other words, the flow sensor FS7 of the seventh embodiment is characterized in that the surface of a semiconductor chip exposed from the resin MR is formed with the hole HL.

The configuration of this hole HL will be described with reference to FIG. 31B. As shown in FIG. 31B, the flow sensor FS7 of the seventh embodiment has a chip mounting unit TAB1 integrally formed with a projected lead PLD. In the seventh embodiment, this chip mounting unit TAB1 is neither formed with an opening OP1, nor the resin MR covering the bottom of the chip mounting unit TAB1 is formed with an opening OP2.

On the other hand, a semiconductor chip CHP1 is mounted on the chip mounting TAB1 by an adhesive ADH1, and the rear surface of this semiconductor chip CHP1 is formed with a diaphragm DF. The surface of the semiconductor chip CHP1 facing the diaphragm DF is formed with a flow sensing unit FDU, and the lateral side of this flow sensing unit FDU is formed with a control unit CU. With the surface of the semiconductor chip CHP1 kept in a state in which the flow sensing unit FDU and its vicinity are exposed, the other region thereof is covered with the resin MR. At this time, the surface of the semiconductor chip CHP1 exposed from the resin MR is formed with the hole HL. This hole HL is formed so as to penetrate through the diaphragm DF formed on the rear surface of the semiconductor chip CHP1 from the surface of the semiconductor chip CHP1. Consequently, according to the flow sensor FS7 of the seventh embodiment, the internal space of the diaphragm DF communicates with the external space of the flow sensor FS7 through this hole HL. As a result, the pressure of the internal space of the diaphragm DF can be made equal to the pressure of the external space of the flow sensor FS7 so that the stress applied on the diaphragm DF can be suppressed.

As described above, the flow sensor FS7 of the seventh embodiment is characterized in that the internal space of the diaphragm DF is made to communicate with the external space of the flow sensor FS7 by forming the hole HL that penetrates the rear surface of the semiconductor chip CHP1 formed with the diaphragm DF from the surface of the semiconductor chip CHP1 being exposed from the resin MR.

In the seventh embodiment, a configuration example of providing the hole HL for the flow sensor FS5 of the fifth embodiment has been described, but the technological idea of the seventh embodiment is not limited to this, and for example, the same idea can be applied to the flow sensors FS1 to FS4 and FS6 of the first embodiment to the fourth embodiment and the sixth embodiment.

Eighth Embodiment

In an eighth embodiment, another configuration example of making the internal space of the diaphragm communicate with the external space of the flow sensor will be described.

Figure 32A:
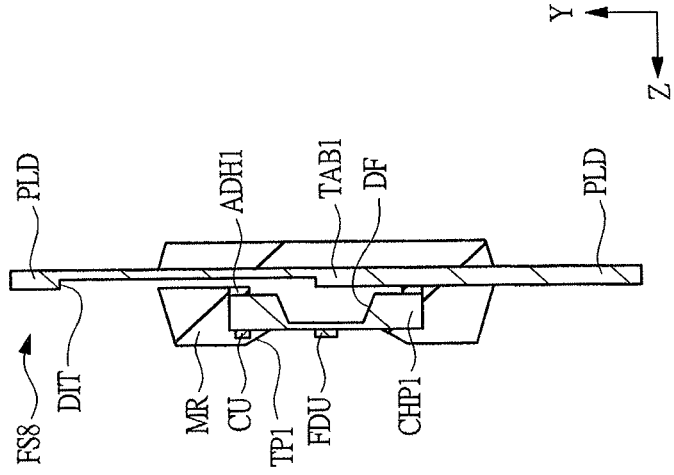
FIG. 32A is a plan view showing the mounting configuration after sealing the flow sensor according to an eighth embodiment.
Figure 32B:
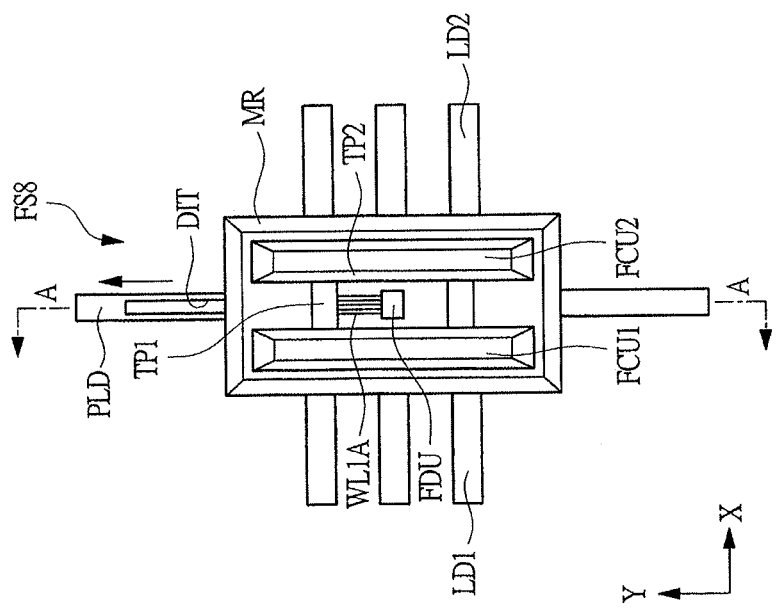
FIG. 32B is a cross-sectional view taken along the line A-A of FIG. 32A.

FIGS. 32A to 32C are views showing a mounting configuration of a flow sensor FS8 according to the eighth embodiment. Particularly, FIG. 32A is a plan view showing the mounting configuration of the flow sensor FS8 of the eighth embodiment, and FIG. 32B is a cross-sectional view taken along the line A-A of FIG. 32A. The mounting configuration of the flow sensor FS8 of the eighth embodiment shown in FIGS. 32A and 32B is almost the same as that of the flow sensor FS5 of the fifth embodiment as shown in FIGS. 23A to 23C, and therefore, different points therebetween will be described.

As shown in FIG. 32A, in the flow sensor FS8 of the eighth embodiment, a projected lead PLD is formed with a groove DIT. In other words, the flow sensor FS8 of the eighth embodiment is characterized in that the projected lead PLD is formed with the groove DIT.

The configuration of the groove DIT formed on this projected lead PLD will be described with reference to FIG. 32B. As shown in FIG. 32B, the flow sensor FS8 of the eighth embodiment has a chip mounting unit TAB1 integrally formed with the projected lead PLD. In the eighth embodiment, this chip mounting unit TAB1 is neither formed with an opening OP1, nor the resin MR covering the bottom of the chip mounting unit TAB1 is formed with an opening OP2.

On the other hand, a semiconductor chip CHP1 is mounted on the chip mounting unit TAB1 by an adhesive ADH1, and the rear surface of this semiconductor chip CHP1 is formed with a diaphragm DF. The surface of the semiconductor chip CHP1 facing the diaphragm DF is formed with a flow sensing unit FDU, and the lateral side of this flow sensing unit FDU is formed with a control unit CU. Having the surface of the semiconductor chip CHP1 kept in a state in which the flow sensing unit FDU and its vicinity are exposed, the other region thereof is covered with the resin MR.

At this time, in the eighth embodiment, the groove DIT formed on the projected PLD extends to the chip mounting unit TAB1, and reaches to the chip mounting unit TAB1 existing under the region formed with the diaphragm DF. Consequently, according to the flow sensor FS8 of the eighth embodiment, the internal space of the diaphragm DF communicates with the external space of the flow sensor FS8 through this groove DIT. As a result, the pressure of the internal space of the diaphragm DF can be made equal to the pressure of the external space of the flow sensor FS8 so that the stress applied on the diaphragm DF can be suppressed.

Thus, the flow sensor FS8 of the eighth embodiment is characterized in that the internal space of the diaphragm is made to communicate with the external space of the flow sensor FS8 by forming the groove DIT from the projected PLD to the chip mounting unit TAB1 existing under the region formed with the diaphragm DF.

In the eighth embodiment, a configuration example of providing the groove DIT for the flow sensor FS5 of the fifth embodiment has been described, but the technological idea of the eighth embodiment is not limited to this; for example, the same idea can be applied to the flow sensors FS1 to FS4 and FS6 of the first embodiment to the fourth embodiment and the sixth embodiment.

Ninth Embodiment

In a ninth embodiment, a flow sensor module in which a flow sensor is embedded will be described. FIGS. 33A to 33C are views showing a mounting configuration of the flow sensor module according to the ninth embodiment. Particularly, FIG. 33A is a plan view showing the mounting configuration of the flow sensor module FSM1 according to the ninth embodiment. FIG. 33B is a cross-sectional view taken along the line A-A of FIG. 33A, and FIG. 33C is a cross-sectional view taken along the line B-B of FIG. 33A.

First, as shown in FIG. 33A, the flow sensor module FSM1 of the ninth embodiment has a structural body composed of a rectangular shaped resin MR2, and a gas flow path unit PAS is formed by a groove that is formed in the resin MR2 configuring this structural body. The flow sensor FS5 is embedded into the resin MR2 so as to communicate with the gas flow path unit PAS. Here, a pair of air current control units FCU1 and FCU2 configuring the flow sensor FS5, a flow sensing unit FDU, and a part of wirings WL1A are exposed from the resin MR2. The resin MR2, for example, can be composed of a thermoset resin such as epoxy resin and phenolic resin, and thermoplastic resin such as polycarbonate and polyethylene terephthalate. These resins may be filled with filler such as glass and mica.

In the flow sensor module FSM1 of the ninth embodiment, a gas flows through a gas flow path unit PAS along an arrow direction, and the gas passes on the flow sensor FS5 provided so as to communicate with the gas flow path unit PAS, and after that, the gas is exhausted from un unillustrated outlet.

At this time, the flow sensor FS5 is, as shown in FIG. 33A, integrally formed with a pair of air current control units FCU1 and FCU2 with the resin MR2 (sealing body), the pair of air current control units FCU1 and FCU2 clamping the exposed flow sensing unit FDU, and having a long shape in the direction parallel to the traveling direction of the gas flowing above the flow sensing unit FDU. Thus, first, the pair of air current control units FCU1 and FCU2 forms the flow paths of both sides of the gas that flows above the flow sensing unit FDU. The pair of air current control units FCU1 and FCU2 is formed integrally with the resin MR with very high accuracy by clamping with a die of high dimension accuracy. As a consequence, according to the flow sensor FS5, a flow of the gas is not disturbed by dimension accuracy of the pair of air current control units FCU1 and FCU2, and the flow rate of the gas can be accurately measured. Furthermore, the pair of air current control units FCU1 and FCU2 forms the flow paths of both sides of the gas that flows above the flow sensing unit FDU. Hence, the gas can be let flow above the flow sensing unit FDU in a state in which the flow path dimension of the gas is made narrower. As a result, according to the flow sensor FS5, particularly even when the flow rate of the gas that flows is small, lowering of the detection accuracy of the gas flow rate can be suppressed.

Further, in the flow sensor FS5, as shown in FIG. 33A, an interface region between the flow sensing unit FDU exposed from the resin MR (sealing body) and the resin MR (sealing body) is in a tapered shape, and in the interface region, the tapered shape of the interface region orthogonal to the traveling direction (arrow direction, Y direction) of the gas that flows above the flow sensing unit FDU is steeper than the tapered shape of the interface region parallel to the traveling direction of the gas. That is, the angle of the tapered shape TP2 in the direction (X direction) orthogonal to the flow of the gas of the flow sensing unit FDU is steeper than the tapered shape TP1 in the direction (Y direction) to which the gas flows of the flow sensing unit FDU. Thus, in the flow sensor FS5, by reducing the angle of the tapered shape TP1 in the gas flow direction (Y direction), the dimension change of the flow path of the gas flowing in the Y direction can be reduced. This can prevent the gas from peeling from the resin MR and can suppress deviations of measurement of the flow rate due to back-flow and eddy-flow of the gas. On the other hand, by increasing the angle of the tapered shape in the direction (X direction) orthogonal to the gas flow direction, the wall of the gas flow path can be formed, and the flow of the gas to the X direction can be suppressed.

Next, as shown in FIG. 33B, the flow sensor FS5 is formed so as to be embedded into the resin MR2 formed with the gas flow path unit PAS, and the leads LD1 and the leads LD2 formed on the flow sensor FS5 are bent to project from under the resin MR2. A cover CAP is formed on the upper part of the resin MR2 formed with the gas flow path unit PAS. This cover CAP can be composed of, for example, a metallic material such as an aluminum alloy, a thermoset resin such as epoxy resin and phenol resin, thermoplastic resin such as polycarbonate and polyethylene terephthalate. These resins may contain filler such as glass and mica.

The rear surface of the semiconductor chip CHP1 configuring the flow sensor FS5 is formed with a diaphragm DF, and the chip mounting unit TAB1 that overlaps with this diaphragm DF when viewed in plan view is formed with an opening OP1. The resin MR covering the rear surface of the chip mounting unit TAB1 is formed with an opening OP2, and the opening OP1 communicates with the opening OP2. Further, the resin MR2 is formed so as to cover the rear surface of the resin MR that is formed with the opening OP2. This resin MR2 is formed with an opening OP3. This opening OP3 communicates with the opening OP2. Consequently, the opening OP1 formed in the chip mounting TAB1, the opening OP2 formed in the resin MR, and the opening OP3 formed in the resin MR2 are made to communicate with one another, and as a result, the internal space of the diaphragm DF communicates with the external space of the flow sensor module FSM1 through the opening OP1, the opening OP2, and the opening OP3. At this time, the cross-sectional area of the opening OP1 is smaller than the cross-sectional area of the opening OP2, and the cross-sectional area of the opening OP2 is smaller than the cross-sectional area of the opening OP3.

Subsequently, as shown in FIG. 33C, a projected lead PLD is projected from the flow sensor FS5 that is embedded into the resin MR2 formed with the gas flow path unit PAS, and this projected lead PLD is bent to be processed into a gull-wing shape.

The mounting configuration of the flow sensor FSM1 according to the ninth embodiment thus configured is as follows. That is, the flow sensor module FSM1 of the ninth embodiment includes: the flow sensor FS5 that seals the semiconductor chip CHP1 with the resin MR, while exposing the flow sensing unit FDU, the semiconductor chip CHP1 having the flow sensing unit FDU formed on the main surface of a semiconductor substrate and the diaphragm DF formed in the region facing the flow sensing unit FDU of the rear surface opposite to the main surface of the semiconductor substrate; and the gas flow path unit PAS that guides the gas to the flow sensing unit FDU of the flow sensor FS5. At this time, the flow sensor module FSM1 is formed so as to cover the more outside of the resin MR that seals the flow sensor FS5, and has the resin MR2 that is formed so as to expose the flow sensing unit FDU. The gas flow path unit PAS is composed of a groove formed on the surface of the resin MR2, and the gas flow path unit PAS composed of the groove formed on the surface of the resin MR2 is formed so as to be joined to the flow sensing unit FDU of the flow sensor FS5, and the gas thus passes through the gas flow path unit PAS, and is guided to the flow sensing unit FDU of the flow sensor FS5.

The flow sensor module FSM1 of the ninth embodiment is, for example, configured by the component parts including the gas flow path unit PAS and the flow sensor FS5, and as shown in FIG. 33B, can install the cover CAP that forms the gas flow path unit PAS by combining the groove formed in the resin MR2, and can provide a screw mounting hole and the like for connecting the flow sensor module FSM1 to external equipment by a screw.

In the ninth embodiment, for example, an example of forming the gas flow path unit PAS by the groove formed in the resin MR2 is described, but the embodiment is not limited to this, and the gas flow path unit PAS may be formed by applying a grooving process on the cover CAP.

Figure 34:
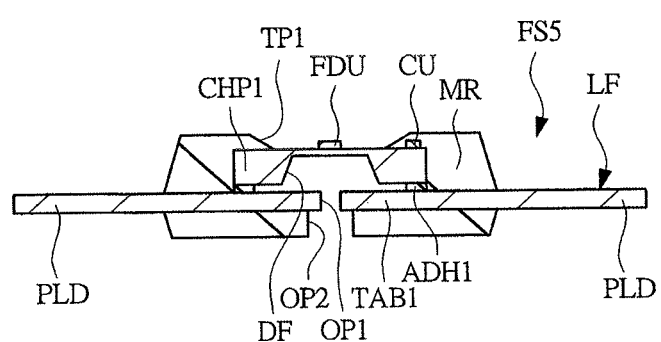
FIG. 34 is a plan view showing the mounting configuration of the flow sensor module according to the ninth embodiment.
Figure 35:
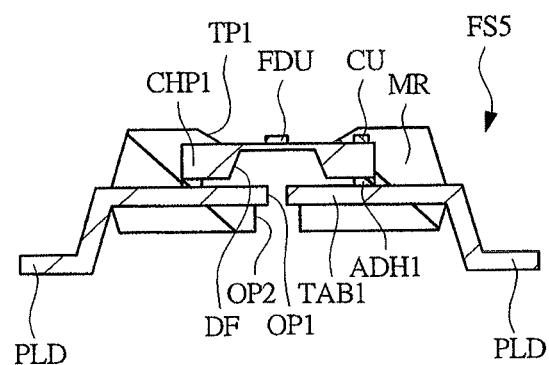
FIG. 35 is a cross-sectional view showing the manufacturing process of a flow sensor module continued from FIG. 34.
Figure 36:
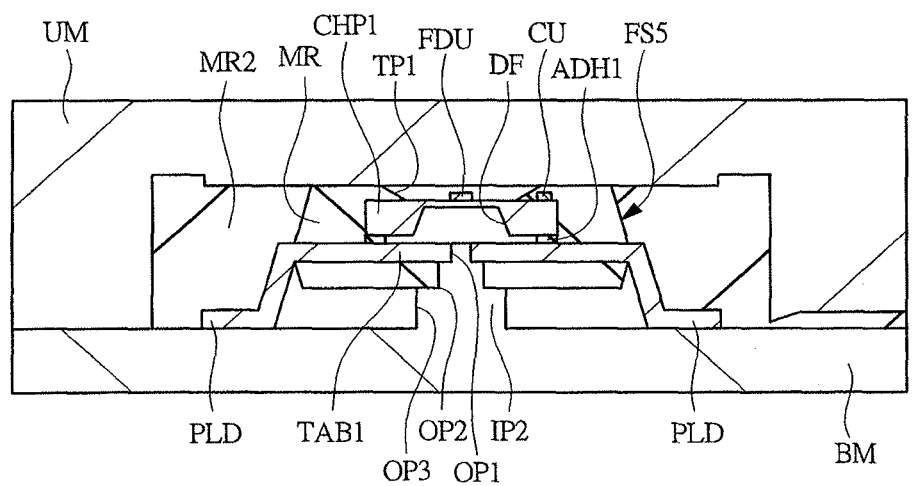
FIG. 36 is a cross-sectional view showing the manufacturing process of a flow sensor module continued from FIG. 35.

The flow sensor module FSM1 of the ninth embodiment is thus configured, and its manufacturing method will be described with reference to FIGS. 34 to 36. FIGS. 34 to 36 show the manufacturing process in the cross-section taken along the line B-B of FIG. 33A.

First, as shown in FIG. 34, the flow sensor FS5 is manufactured. The flow sensor FS5, for example, can be manufactured by the method described in the fifth embodiment. Subsequently, as shown in FIG. 35, the projected lead PLD projected from the resin MR is subjected to a bending process. In other words, as shown in FIG. 35, the projected lead PLD projected from the resin MR is subjected to the bending process in a gull-wing shape.

After that, as shown in FIG. 36, the flow sensor FS5 in which the projected lead PLD is subjected to the bending process is clamped by an upper die UM and a lower die BM interposing a space. After that, resin MR2 is poured into this space under heating so that the flow sensor FS5 is further sealed with the resin MR2. At this time, as shown in FIG. 36, the height of the flow sensing unit FDU formed on the surface of the semiconductor chip CHP1 is lower than the height of the resin MR that clamps the flow sensing unit FDU. Therefore, when the flow sensor FS5 is clamped by the upper die UM and the lower die BM, the under surface of the upper die UM contacts the upper surface of the resin MR of the flow sensor FS5, but does not contact the flow sensing unit FDU formed at a position lower than the upper surface of this resin MR. That is, a gap is formed between the exposed flow sensing unit FDU and the upper die UM. For this reason, even when the flow sensor FS5 is further sealed with the resin MR2, the flow sensing unit FDU formed on the semiconductor chip CHP1 can maintain a state of being exposed.

Here, a feature of the ninth embodiment lies in the application of the bending process to the projected lead PLD that is projected from the flow sensor FS5. In this manner, when the flow sensor FS5 is clamped by the upper die UM and the lower die BM, the projected lead PLD subjected to the bending process is pressed against the lower die BM and the flow sensor FS5 is fixed between the upper die UM and the lower die BM by this projected lead PLD pressed against the lower die BM. That is, the projected lead PLD subjected to the bending process has a function to securely fix the flow sensor FS5 to a prescribed position (Positioning Function). As a result, the sealing with the resin MR2 can be performed in a state in which the flow sensor FS5 is fixed at the prescribed position.

Further, the feature of the manufacturing method of the flow sensor module of the ninth embodiment lies in the adoption of a configuration in which a partial die IP2 formed in the lower die BM has an insert part provided on a pedestal part being large in cross-sectional area. In this case, as shown in FIG. 36, a first insert part of the partial die IP2 is inserted into the opening OP1, and a second insert part of the partial die IP2 is inserted into the opening OP2. This partial die IP2 is formed with the pedestal part under the second insert part, and this pedestal part is closely adhered to the bottom of the resin MR. As a result, even when a slight gap occurs between the first insert part of the partial die IP2 and the opening OP1 and between the second insert part and the opening OP2, since the pedestal part is firmly pressed against the rear surface of the resin MR, the resin MR can be prevented from infiltrating into the opening OP1 and the opening OP2. In other words, in the ninth embodiment, the partial die IP2 has the second insert part provided on the pedestal part whose cross-sectional area is larger than that of the second insert part. Therefore, by a combination of a characteristic point that the resin MR2 does not come down to the opening OP1 and the opening OP2 due to the pedestal part, and a characteristic point that a stepped part formed between the pedestal part and the second insert part is pressed against the resin MR, the resin MR2 is effectively prevented from infiltrating into the internal space of the diaphragm DF through the opening OP1 and the opening OP2.

After that, at the stage of the resin MR2 having cured, the flow sensor module sealing the flow sensor FS5 by the resin MR2 is removed from the upper die UM and the lower die BM. In this manner, the flow sensor module of the ninth embodiment can be manufactured. In the flow sensor module manufactured here, as a result of using the lower die BM formed with the partial die IP2 at the resin sealing process, as shown in FIG. 36, the bottom of the chip mounting unit TAB1 is formed with the opening OP1, and the opening OP2 communicating with this opening OP1 is formed in the resin MR, and further, an opening OP3 communicating with the opening OP2 is formed in resin MR2. This opening OP3 is generated as a result of forming the pedestal part in the partial die IP2, and a cross-sectional area of this opening OP3 becomes larger than a cross-sectional area of the opening OP2. Thus, according to the flow sensor module according to the ninth embodiment, the internal space of the diaphragm DF communicates with the external space of the flow sensor module through the opening OP1 formed at the bottom of the chip mounting unit TAB1, the opening OP2 formed in the resin MR, and the opening OP3 formed in the resin MR2. As a result, the pressure of the internal space of the diaphragm DF can be made equal to the pressure of the external space of the flow sensor module so that the stress applied on the diaphragm DF can be suppressed.

In the flow sensor module FSM1 of the ninth embodiment, an example of using the flow sensor FS5 described in the fifth embodiment has been described, but the technological idea of the present invention is not limited to this, and can be also extensively applied to the flow sensor module that integrally seals the flow sensors FS1 to FS4 described in the first embodiment to the fourth embodiment and the flow sensors FS6 to FS8 described in the sixth to eighth embodiments with the resin MR2. For example, even the flow sensor module using these flow sensors FS1 to FS4 and FS6 to FS8 can be configured such that the gas flow path unit PAS is formed by the groove formed on the surface of the resin MR2, and this gas flow path unit PAS is formed so as to be joined to the flow sensing units FDU of the flow sensors FS1 to FS4 and FS6 to FS8 so that the gas passes through the gas flow path unit PAS so as to be guided to the flow sensing units FDU of the flow sensors FS1 to FS4 and FS6 to FS8.

Here, the flow sensor FS1 and the flow sensor FS2 are configured to use a wiring board WB, and in this case, as shown in FIG. 5B and FIG. 11B, the rear surface of the wiring board WB is not formed with the resin MR. Consequently, in the flow sensor module using the flow sensor FS1 and the flow sensor FS2 thus configured, the rear surface of the wiring board WB is directly formed with the resin MR2, and this resin MR2 is formed with the opening OP3. Hence, the rear surface of the semiconductor chip CHP1 configuring the flow sensors FS1 to FS2 is formed with the diaphragm DF, and the wiring board WB that overlaps with this diaphragm DF when viewed in plan view is formed with the opening OP1. Further, the resin MR2 covering the rear surface of the wiring board WB is formed with the opening OP3, and the opening OP1 communicates with the opening OP3. In this manner, the internal space of the diaphragm DF communicates with the external space of the flow sensor module through the opening OP1 and the opening OP3. At this time, the cross-sectional area of the opening OP1 becomes smaller than the cross-sectional area of the opening OP3.

Tenth Embodiment

In a tenth embodiment, a modified example of the flow sensor module FSM1 described in the ninth embodiment will be described.

FIGS. 37A to 37C are views showing the mounting configuration of a flow sensor module FSM2 according to the tenth embodiment. Particularly, FIG. 37A is a plan view showing the mounting configuration of the flow sensor module FSM2 of the tenth embodiment. FIG. 37B is a cross-sectional view taken along the line A-A of FIG. 37A, FIG. 37C is a cross-sectional view taken along the line B-B of FIG. 37A. The mounting configuration of the flow sensor module FSM2 of the tenth embodiment shown in FIGS. 37A to 37C is almost the same as that of the flow sensor module FSM1 of the ninth embodiment shown in FIGS. 33A to 33C, and therefore, different points therebetween will be described.

In the ninth embodiment, as shown in FIG. 33B, the flow sensor FS5 is formed so as to be embedded into the resin MR2 formed with the gas flow path unit PAS, and the leads LD1 and the leads LD2 formed in the flow sensor FS5 are bent to project from below the resin MR2.

In contrast to this, in the tenth embodiment, as shown in FIG. 37B, the flow sensor FS5 is formed so as to be embedded into the resin MR2 formed with the gas flow path unit PAS, and the leads LD1 and the leads LD2 formed in the flow sensor FS5 are bent to project from above the resin MR2. The technological idea of the present invention can be applied to even the flow sensor module FSM2 thus configured in the tenth embodiment.

Eleventh Embodiment

In an eleventh embodiment, a modified example of the flow sensor module FSM1 described in the ninth embodiment will be described.

FIGS. 38A to 38C are views showing the mounting configuration of a flow sensor module FSM3 according to the eleventh embodiment. Particularly, FIG. 38A is a plan view showing the mounting configuration of the flow sensor module FSM3 of the eleventh embodiment. FIG. 38B is a cross-sectional view taken along the line A-A of FIG. 38A, and FIG. 38C is a cross-sectional view taken along the line B-B of FIG. 38A. The mounting configuration of the flow sensor module FSM3 of the eleventh embodiment shown in FIGS. 38A to 38C is almost the same as that of the flow sensor module FSM1 of the ninth embodiment shown in FIGS. 33A to 33C, and therefore, different points therebetween will be described.

In the ninth embodiment, as shown in FIG. 33B, more resin MR2 is formed so as to cover the bottom of the resin MR configuring the flow sensor FS5. In contrast to this, in the flow sensor module FSM3 of the eleventh embodiment, the bottom of the resin MR configuring the flow sensor FS5 is not covered with the resin MR2, and the bottom of the resin MR is flush with the bottom of the resin MR2. The flow sensor module FSM3 thus configured of the eleventh embodiment can be also applied with the technological idea of the present invention. Particularly, in the flow sensor module FSM3 of the eleventh embodiment, since the resin MR2 is not formed so as to cover the bottom of the resin MR, a used amount of the resin MR2 can be reduced. As a result, according to the flow sensor module FSM3 of the eleventh embodiment, cost reduction by reduction of the amount of using the resin MR2 and weight saving of the flow sensor module FSM3 can be achieved.

Twelfth Embodiment

One of the features of the flow sensor in the present invention, for example, lies in that the height of the resin MR (sealing body) is higher than the height of the surface of a semiconductor chip CHP1 including a flow sensing unit FDU in the cross-section of the direction parallel to the air flow (the second A feature) as shown FIG. 13C, 20C, 23C or 29C etc. As a result, the air flow that flows on the upper part of the flow sensing unit FDU can be stabilized, and as a result, flow detection accuracy in the flow sensing unit FDU can be improved. Further, in the flow sensor of the present invention, the resin MR has a shape to partially cover the upper part of the semiconductor chip CHP1 in the cross-section of the direction (Y direction) parallel to the air flow (the second B feature). As a result, a contact area between the semiconductor chip CHP1 and the resin MR is increased in the cross-section of the direction parallel to the air flow, and thus, the peeling of the interface between the semiconductor chip CHP1 and the resin MR can be prevented. In the above-described manner, the flow sensor of the present invention is provided with the second A feature and the second B feature as described above, and therefore, a problem of cracks growing from the peeled part to become large cracks can be prevented. At the same time, because the disturbance of the air flow above the flow sensing unit FDU can be suppressed, measurement accuracy of the correct air flow at the flow sensing unit FDU can be improved.

Figure 39:
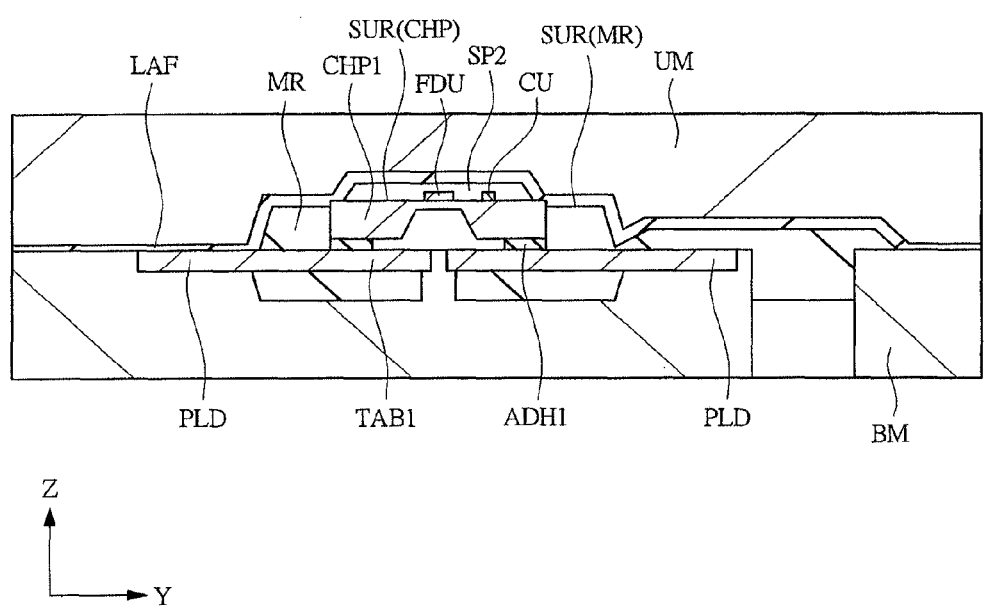
FIG. 39 is a cross-sectional view showing a process in which a lead frame mounting the semiconductor chip by a die arranged with an elastic film is clamped and sealed with resin.

For example, as a technology of sealing the semiconductor chip configuring the flow sensor by the resin, as shown in FIG. 39, the method for clamping the component parts such as the semiconductor chip and the like by the die disposed with an elastic film (release film) and sealing the same by the resin is considered. According to this method, there is the advantage that variations of mounting dimension of the component parts such as the semiconductor chip and a lead frame can be absorbed by dimension change of the release film in the thickness direction.

Specifically, FIG. 39 is a cross-sectional view showing a process in which, as the method described above, the resin MR is injected into a space formed between the upper die UM and the lower die BM in a state in which the component parts such as the semiconductor chip CHP1 mounted on a chip mounting unit TAB1 of the lead frame are clamped by the lower die BM and the upper die UM disposed with an elastic film LAF (release film). Particularly, FIG. 39 shows a cross-sectional view of the air (gas) flow direction of the flow sensor. As shown in FIG. 39, an end part of the semiconductor chip CHP1 is pressed down by the upper die UM through the elastic film LAF, and as a result, the semiconductor chip CHP1 is fixed by the upper die UM. At this time, the elastic film LAF clamped by an upper surface SUR(CHP) of the semiconductor chip CHP1 and the upper die UM with the pressure to press down from the upper die UM is compressed in the thickness direction so that the thickness dimension of the elastic film LAF is reduced. On the other hand, since the upper die UM forms a space without pressing down the semiconductor chip CHP1 in the region adjacent to the semiconductor chip CHP1, the elastic film LAF existing in this space is not compressed in the thickness direction. As a result, as shown in FIG. 39, the thickness of the elastic film LAF clamped by the semiconductor chip CHP1 and the upper die UM becomes thinner than the thickness of the elastic film LAF disposed in the space. Further, as a result of the resin MR being injected into this space, the position of the upper surface SUR(MR) of the resin MR becomes lower than the position of the upper surface SUR(CHP) of the semiconductor chip CHP1. Thus, when the semiconductor chip CHP1 is sealed with the resin MR by the manufacturing method shown in FIG. 39, the flow sensor is manufactured in which the position of the upper surface SUR(MR) of the resin MR is lower than the position of the upper surface SUR(CHP) of the semiconductor chip CHP1. In this case, since the disturbance of the air occurs above the flow sensing unit FDU, a problem arises that the measurement of the air flow rate at the flow sensing unit FDU becomes unstable. The mechanism thereof will be described hereinafter.

Figure 40:
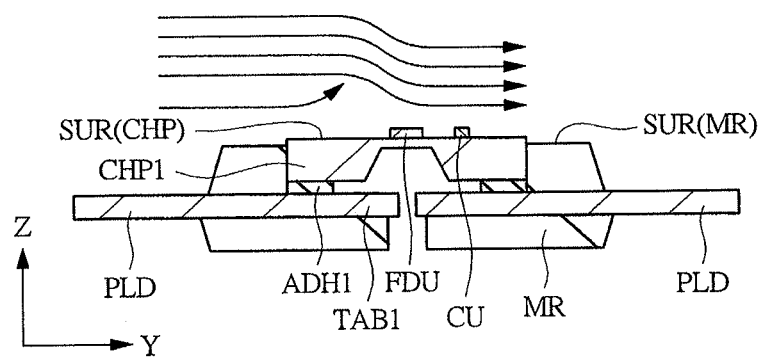
FIG. 40 is a view showing a cross-sectional structure in the gas flow direction of the flow sensor sealed with the sealing process of FIG. 39.

FIG. 40 is a view showing a cross-sectional structure in the air (gas) flow direction of the flow sensor manufactured by the manufacturing method of FIG. 39. As shown in FIG. 40, the semiconductor chip CHP1 is mounted on the chip mounting unit TAB1 by adhesive ADH1, and the upper surface SUR(CHP) of this semiconductor chip CHP1 is exposed from the resin MR. That is, the flow sensing unit FDU and a control unit CU formed on the upper surface SUR(CHP) of the semiconductor chip CHP1 are exposed from the resin MR, and at the same time, the position of the upper surface SUR(CHP) of the semiconductor chip CHP1 becomes higher than the position of the upper surface SUR(MR) of the resin MR. In the flow sensor thus configured, a case of the gas (air) flowing above the flow sensing unit FDU is assumed. FIG. 40 shows a state in which the gas (air) flows from the left side to the right side of the plane of the figure.

As shown in FIG. 40, the gas (air) flowing from the left side to the right side of the plane of the figure first passes through above the resin MR of the flow sensor. When the gas (air) flows in the direction to the upper part of the semiconductor chip CHP1 from the upper part of the resin MR, since the upper surface SUR(MR) of the resin MR is located at a position lower than the upper surface SUR(CHP) of the semiconductor chip CHP1, the air (gas) collides against a projected lateral side of the semiconductor chip CHP1 from the upper surface SUR(MR) of the resin MR having a low height. Therefore, the gas (air) flow is disturbed, and the gas (air) flows to the upper direction of the semiconductor chip CHP1, while greatly changing. After that, the gas (air) flowing to the upper part of the semiconductor chip CHP1 flows again in the direction parallel to the upper surface SUR(CHP) of the semiconductor chip CHP1. Thus, when the surface SUR(MR) of the resin MR is lower than the upper surface SUR(CHP) of the semiconductor chip CHP1, the gas (air) flow is greatly disturbed by the influences of the lateral side of the semiconductor chip CHP1 that is projected from the resin MR. Then, in the upper stream of the flow sensing unit FDU, the gas (air) flow direction is greatly changed to unstabilize the flow rate, resulting in unstabilized flow detection accuracy at the flow sensing unit FDU.

In contrast to this, according to the present invention described in the first to sixth embodiments, the height of the resin MR (sealing body) is higher than the height of the surface of the semiconductor chip CHP1 including the flow sensing unit FDU in the cross-section of the direction parallel to the air flow (the second A feature), and the resin MR partially covers the upper part of the semiconductor chip CHP1 in the cross-direction of the direction (Y direction) parallel to the air flow (the second B feature). Thereby, the air flow that flows above the flow sensing unit FDU can be stabilized, and as a result, flow detection accuracy at the flow sensing unit FDU can be improved. Specific description thereof will be made as follows.

Figure 41:
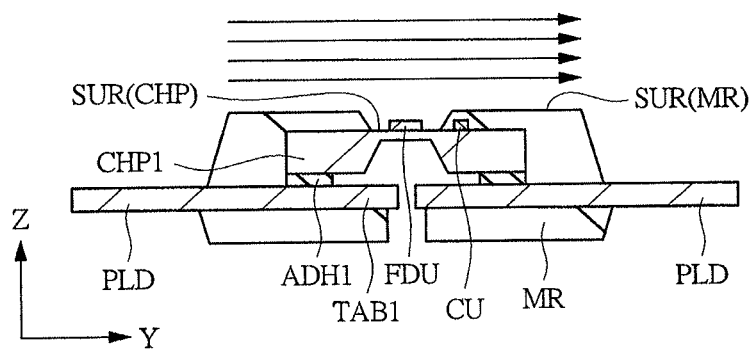
FIG. 41 is a view showing a cross-sectional structure in the gas flow direction of a flow sensor according to a twelfth embodiment.

FIG. 41, for example, is a view showing the cross-sectional structure in the air (gas) flow direction of the flow sensor manufactured by the manufacturing method of the present invention described in the first to sixth embodiments. As shown in FIG. 41, the semiconductor chip CHP1 is mounted on the chip mounting unit TAB1 by the adhesive ADH1, and the end part (a part of the semiconductor chip CHP1) of the upper surface SUR(CHP) of the semiconductor chip CHP1 is covered with the resin MR. That is, although the flow sensing unit FDU formed on the upper surface SUR(CHP) of the semiconductor chip CHP1 is exposed from the resin MR, an end part of the semiconductor chip CHP1 except for the flow sensing unit FDU is covered with the resin MR. Consequently, the position of the upper surface SUR(CHP) of the semiconductor chip CHP1 becomes lower than the position of the upper surface SUR(MR) of the resin MR. In the flow sensor thus configured, the gas (air) flowing above the flow sensing unit FDU is considered. FIG. 41 shows a state in which the gas (air) flows from the left side to the right side of the plane of the figure.

As shown in FIG. 41, the gas (air) that flows from the left side to the right side of the plane of the figure first passes through above the resin MR of the flow sensor. When the gas (air) flows in a direction to the upper part of the semiconductor chip CHP1 from the upper part of the resin MR, in the present invention, since the upper surface SUR(MR) of the resin MR is located at the position higher than the upper surface SUR(CHP) of the semiconductor chip CHP1, the air (gas) smoothly flows to the upper part of the semiconductor chip CHP1 without changing the flow and without being interrupted by the lateral side of the semiconductor chip CHP1. That is, in the present invention, since the upper surface SUR(MR) of the resin MR is located at the position higher than the upper surface SUR(CHP) of the semiconductor chip CHP1, the lateral side of the semiconductor chip CHP1 is not projected. Thus, the gas (air) stably and smoothly flows above the flow sensing unit FDU without disturbing the gas (air) flow that flows above the flow sensing unit FDU. Thus, when the upper surface SUR(MR) of the resin MR is higher than the upper surface SUR(CHP) of the semiconductor chip CHP1, since the gas (air) flow smoothly flows without disturbance, the gas (air) flow on the upper part of the flow sensing unit FDU is stabilized, and as a result, flow detection accuracy at the flow sensing unit FDU can be improved. In the above-described manner, when a configuration in which both of the second A feature and the second B feature are provided is used, the air flow that flows above the flow sensing unit FDU can be stabilized, and as a result, the advantages of not only improving flow detection accuracy in the flow sensing unit FDU, but also preventing the interface between the semiconductor chip and the resin MR from being peeled off due to the increase of the contact area between the semiconductor chip CHP1 and the resin MR can be obtained.

Here, particularly, when the present inventors have investigated to preferentially consider the stabilization of the air flow that flows on the upper part of the flow sensing unit FDU to improve flow detection accuracy in the flow sensing unit FDU, the technological idea shown below has been obtained, and therefore, this technological idea will be described further below.

Specifically, in the cross-section of the flow sensor in the gas (air) flow direction shown in the third to sixth embodiments, the present inventors have investigated an air flow in the flow sensing unit FDU by fluid analysis in the case where a ratio of a height dimension H1 from the upper surface SUR(CHP) of the semiconductor chip CHP1 to the height of the upper surface SUR(MR) of the resin MR to a dimension L1 of the exposed semiconductor chip CHP1 is changed. This flow analysis uses FLOW-3D (made by FLOW SCIENCE, Inc.), and uses a shape shown in FIGS. 42A to 42C as an analytic model. FIGS. 42A to 42C are views showing a configuration of the flow analytic model. FIG. 42A is a plan view of the structure of the flow analytic model seen from above, and FIG. 42B is a cross-sectional view taken along the line A-A of FIG. 42A. FIG. 42C is a cross-section taken along the line B-B of FIG. 42A. In FIGS. 42A to 42C, the semiconductor chip CHP1 is disposed in the central part of the shape. The resin MR is formed so as to cover the end part of the semiconductor chip CHP1, and the position of the upper surface SUR(MR) of the resin MR is higher than the position of the upper surface SUR(CHP) of the semiconductor chip CHP1. At this time, the height from the upper surface SUR(CHP) of the semiconductor chip CHP1 to the upper surface SUR(MR) of the resin MR is defined as a dimension H1, and the dimension of the exposed semiconductor chip CHP1 is defined as a dimension L1. Further, both side surfaces of the resin MR are defined as a side surface WS1 and a side surface WS2. Here, the gas (air) passes from the left side to the right side of FIG. 42A, and a flow path TR of the gas (air) is as shown in FIGS. 42B and 42C. The height (Z direction) of the flow path TR of the gas in the fluid analytic model is set to 0.5 mm, the width thereof (X direction) is set to 2 mm, and the length thereof (Y direction) is set to 8 mm, and the number of element divisions is set to 40,000. Further, as material property values of the gas (air), density is set to 1.225 kg/m$^3$, viscosity is set to 1.781× 10$^{-5}$ Pa·s, and gas (air) flow rate is set to 0.01 Kg/h. The positive Z direction is taken as an object boundary, and the gas (air) is set to flow in from the negative Y direction and flow out to the positive-Y direction, and an analytic investigation without accompanying heat transmission to a non-compressible fluid is performed. Since the flow sensing unit FDU is small in dimension as compared with the height dimension H1 from the upper surface SUR(CHP) of the semiconductor chip CHP1 to the upper surface SUR(MR) of the resin MR, the flow sensing unit FDU is not modeled in the fluid analytic model of this time. However, for example, the flow sensing unit FDU is assumed to be disposed in the central part of the upper surface SUR(CHP) of the semiconductor chip CHP1.

Under such conditions, a speed of Y direction at a position of 25 μm from Z direction from the upper surface SUR(CHP) of the semiconductor chip CHP1 was calculated in the central part (disposed position of the flow sensing unit FDU) of the upper surface SUR(CHP) of the semiconductor chip CHP1 in the cross-section (YZ plane) of the gas (air) flow direction. A result of that is shown in FIG. 43.

Figure 43:
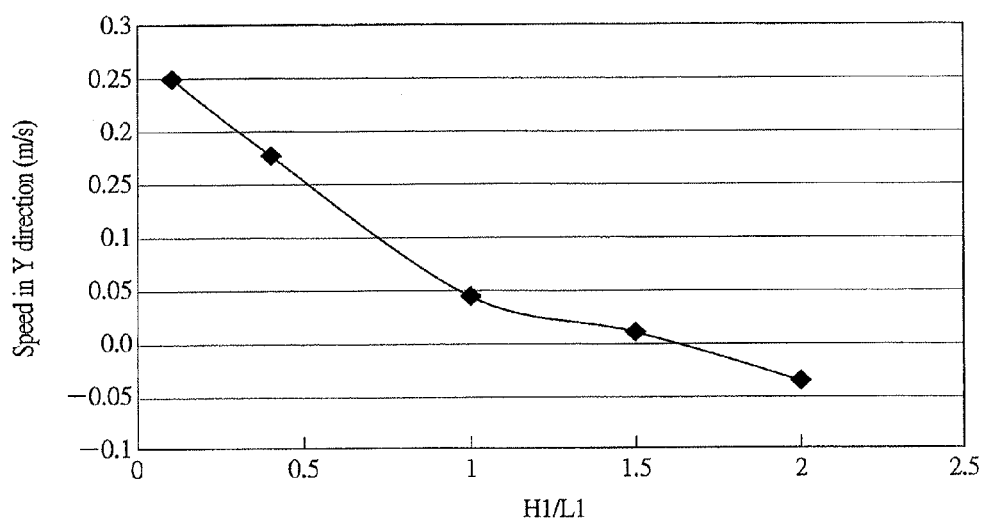
FIG. 43 is a graph showing a calculation result of a speed in a Y direction under a specified condition.

FIG. 43 is a graph showing a result of calculating the speed of Y direction under the above-described conditions. In FIG. 43, a horizontal axis shows a value of ratio (H1/L1) of the height dimension H1 from the upper surface SUR(CHP) of the semiconductor chip CHP1 to the upper surface SUR(MR) of the resin MR to the dimension L1 of the exposed semiconductor chip CHP1, and a vertical axis shows the speed of Y direction. As shown in FIG. 43, it is understood that, when H1/L1 is small, the speed of Y direction shows a positive value, whereas, when H1/L becomes large, the speed of Y direction shows a negative value. This is believed to be as a result that since the air colliding against the side surface WS2 of the resin MR that partially seals (molds) the semiconductor chip CHP1 in the downstream of the gas (air) flow direction reversely flows, the gas reversely flows also in the vicinity of the upper surface SUR(CHP) of the semiconductor chip CHP1. For this reason, it is understood that the value of H1/L1 is desirably not so high when a priority is placed on the viewpoint of sufficiently stabilizing the gas (air) flow on the upper part of the flow sensing unit FDU (semiconductor chip CHP1). To put it another way, when H1/L1 is small, the gas (air) smoothly flows from the side surface WS1 of the resin MR that partially seals (molds) the semiconductor chip CHP1 to the semiconductor chip CHP1 in the upstream side of the gas (air) flow direction, and the back-flow at the side surface WS2 of the resin MR of the downstream side also hardly occurs, and therefore, the gas (air) flow in the vicinity of the upper surface SUR(CHP) of the semiconductor chip CHP1 becomes uniform, and furthermore, accurate flow rate measurement can be conducted due to suppression of the back-flow. That is, as shown in FIG. 43, for example, according to the structure of the flow sensor within a range of 0<H1/L1≤1.5, the speed of Y direction does not become negative, that is, the back-flow at the side surface WS2 of the resin MR of the downstream side also does not occur, and flow measurement accuracy can be stably improved. When the gas (air) flow in the vicinity of the upper surface SUR(CHP) of the semiconductor chip CHP1 can be uniformed, even if the flow rate of the gas (air) is small, correct flow rate measurement can be performed by correcting the flow rate. From the result as described above, in the present invention (twelfth embodiment), it is desirable that the condition of 0<H1/L1≤1.5 is satisfied by H1/L1, which is a ratio of the height dimension H1 from the supper surface SUR(CHP) of the semiconductor chip CHP1 to the upper surface SUR(MR) of the resin MR to the dimension L1 of the exposed semiconductor chip CHP1 in the cross-section of the gas (air) flow direction, from the view point of placing a priority on the stabilization of the air flow that flows above the flow sensing unit FDU.

As a result of the investigation conducted by the present inventors, it is found that a ratio of the height dimension H1 from the upper surface SUR(CHP) of the semiconductor chip CHP1 to the upper surface SUR(MR) of the resin MR to the dimension L1 of the exposed semiconductor chip CHP1 is important for stabilization of the air flow that flows on the upper part of the flow sensing unit FDU, and that this stabilization does not depend on a tapered shape in the interface region between the semiconductor chip CHP1 and the resin MR.

Thirteenth Embodiment

In the twelfth embodiment, an example has been described, in which the height of the resin MR (sealing body) is higher than the height of the surface of the semiconductor chip CHP1 including the flow sensing unit FDU in the cross-section of the direction parallel to the air flow (the second A feature) and the resin MR has a shape to partially cover the upper part of the semiconductor chip CHP1 in the cross-section of the direction (Y direction) parallel to the air flow (the second B feature). However, when the upper part of the semiconductor chip CHP1 is partially covered with the resin MR in the direction parallel to the gas (air) flow in the case where the dimension of the semiconductor chip CHP1 becomes smaller in response to miniaturization and weight-saving of the flow sensor, there is fear that even the flow sensing unit FDU is covered with the resin MR.

At this time, a structure may be adopted in which the upper surface SUR(CHP) of the semiconductor chip CHP1 is not partially covered with the upper surface SUR(MR) of the resin MR. This structure, for example, can be manufactured by the manufacturing method (for example, Japanese Patent Application Laid-Open Publication No. 2004-74713 (Patent Document 7)) shown in FIG. 39. In this case, as shown in FIG. 40, although the flow sensing unit FDU and a control unit CU that are formed on the upper surface SUR(CHP) of the semiconductor chip CHP1 are exposed from the resin MR, the flow sensor is manufactured in which the position of the upper surface SUR(CHP) of the semiconductor chip CHP1 is higher than the position of the upper surface SUR(MR) of the resin MR. In the flow sensor shown in FIG. 40, the gas (air) flows so as to collide against the side surface of the semiconductor chip CHP1 from the upper surface SUR(MR) of the resin MR having a low height, and this gas (air) flows to the upper part of the semiconductor chip CHP1 while greatly changing. After that, the gas (air) having flowed to the upper part of the semiconductor chip CHP1 flows again in the direction (lower part direction) of the semiconductor chip CHP1. Thus, in the upstream of the flow sensing unit FDU, when the direction of the air flow greatly changes, the flow detection accuracy at the flow sensing unit FDU ends up being unstabilized.

Hence, in the thirteenth embodiment, while the height of the resin MR (sealing body) becomes higher than the height of the surface of the semiconductor chip CHP1 including the flow sensing unit FDU in the cross-section of the direction parallel to the air flow, a device is applied to obtain the flow sensor in which the resin MR does not partially cover the upper part of the semiconductor chip CHP1 in the cross-section of the direction (Y direction) parallel to the air flow.

Figure 44:
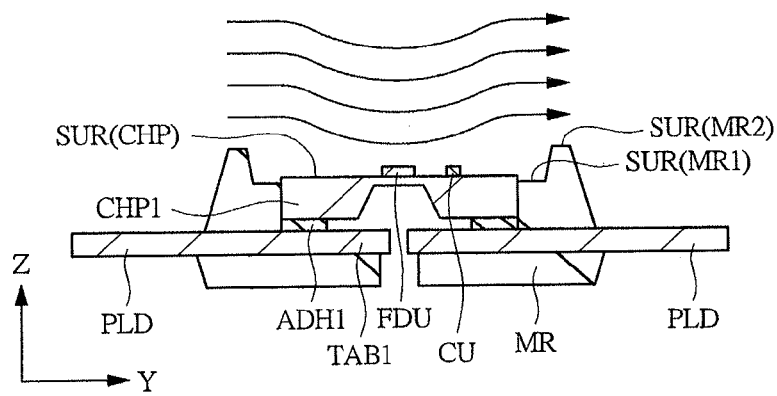
FIG. 44 is a view showing a cross-sectional structure in a gas flow direction of a flow sensor according to a thirteenth embodiment.

FIG. 44 is a view showing a cross-section structure of the flow direction of the air (gas) of the flow sensor of the thirteenth embodiment. As shown in FIG. 44, the semiconductor chip CHP1 is mounted on a chip mounting unit TAB1 by the adhesive ADH1, and the upper surface SUR(CHP) of this semiconductor chip CHP1 is not covered with the resin MR. That is, the upper surface SUR(CHP) of this semiconductor chip CHP1 including the flow sensing unit FDU is exposed from the resin MR. Consequently, even when the dimension of the semiconductor chip CHP1 becomes small in response to miniaturization and weight-saving of the flow sensor, the covering of the resin MR even up to the flow sensing unit FDU can be avoided.

As shown in FIG. 44, in an optional cross-section parallel to the traveling direction of the gas (air) that flows above the exposed flow sensing unit FDU, the upper surface SUR(MR1) of the resin MR is lower than the upper surface SUR(CHP) of the semiconductor chip CHP1 in a first region contacting the semiconductor chip CHP1, and the height of the upper surface SUR(MR2) of the resin MR is higher than the height of the upper surface SUR(CHP) of the semiconductor chip CHP1 at least in a part of a second region apart from the semiconductor chip CHP1 instead of the first region. Thus, according to the flow sensor of the thirteenth embodiment, the gas (air) flow in the upper part of the flow sensing unit FDU can be stabilized, and as a result, flow detection accuracy at the flow sensing unit FDU can be improved.

Specifically, in the flow sensor of the thirteenth embodiment, a case of the gas (air) flowing on the upper part of the flow sensing unit FDU is assumed. FIG. 44 shows a state in which the gas (air) flows from the left side to the right side of the plane of the figure.

As shown in FIG. 44, the gas (air) flowing from the left side of the plane of the figure first passes through the upper part of the resin MR of the flow sensor. When the gas (air) flows to the upper part of the semiconductor chip CHP1 from the upper part of the resin MR, in the present invention, since the upper surface SUR(MR2) of the resin MR is located at a position higher than the upper surface SUR(CHP) of the semiconductor chip CHP1, the gas (air) smoothly flows to the upper part of the semiconductor chip CHP1 without changing the flow and without interrupted by the lateral side of the semiconductor chip CHP1. That is, in the present invention, since the upper surface SUR(MR2) of the resin MR is located at the position higher than the upper surface SUR(CHP) of the semiconductor chip CHP1, the influence that the upper surface SUR(MR1) of the resin MR in the first region contacting the semiconductor chip CHP1 is lower than the upper surface SUR(CHP) of the semiconductor chip CHP1 can be reduced. As a result, the gas (air) stably and smoothly flows on the upper part of the flow sensing unit FDU without disturbing the gas (air) flow that flows on the upper part of the flow sensing unit FDU. Thus, when the upper surface SUR(MR2) of the resin MR is higher than the upper surface SUR(CHP) of the semiconductor chip CHP1, since the gas (air) flow smoothly flows without disturbance, the gas (air) flow above the flow sensing unit FDU is stabilized, and as a result, flow detection accuracy at the flow sensing unit FDU can be improved. For this reason, according to the flow sensor of the thirteenth embodiment, since the resin MR does not cover the semiconductor chip CHP1, even when miniaturization of the semiconductor chip CHP1 is promoted, the flow sensing unit FDU can be prevented from being covered with the resin MR. Further, according to the flow sensor of the thirteenth embodiment, though the upper surface SUR(MR1) of the resin MR becomes lower than the upper surface SUR(CHP) of the semiconductor chip CHP1 in the first region contacting the semiconductor chip CHP1, the upper surface SUR(MR2) of the resin MR becomes higher than the upper surface SUR(CHP) of the semiconductor chip CHP1 in the second region more apart from the semiconductor chip CHP1 than the first region. As a result, the gas (air) flow above the flow sensing unit FDU is stabilized, and as a result, flow detection accuracy at the flow sensing unit FDU can be improved.

Figure 45:
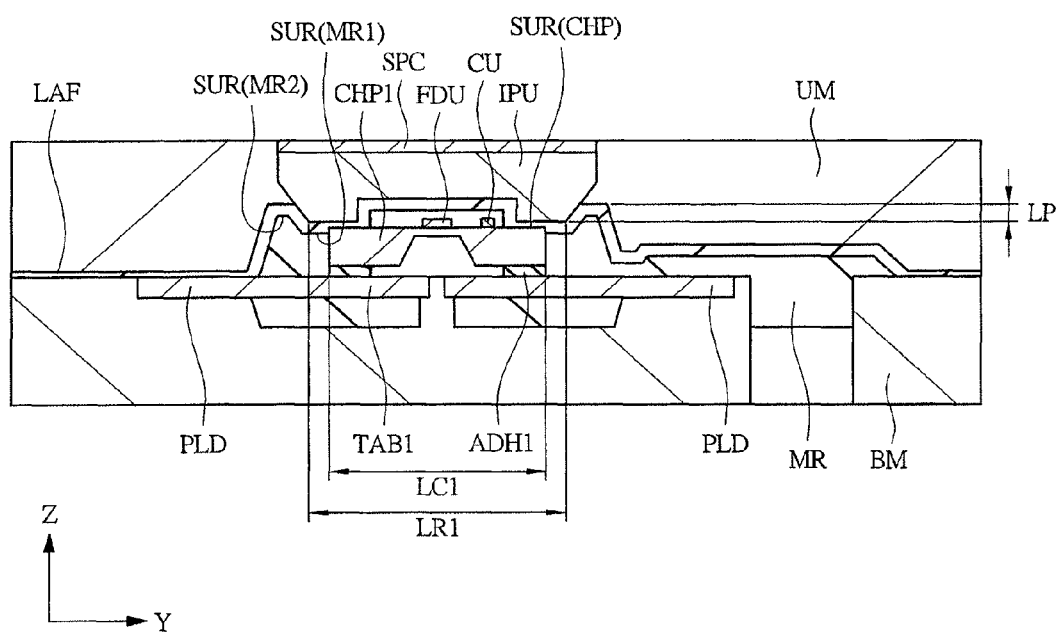
FIG. 45 is a view for explaining about a sealing process in which the flow sensor is manufactured according to the thirteenth embodiment.

A sealing process of manufacturing the flow sensor according to the thirteenth embodiment will be described below. FIG. 45 is a view describing the sealing process of manufacturing the flow sensor of the thirteenth embodiment. As shown in FIG. 45, by making a top end dimension LR1 of a partial die IPU disposed in an upper die UM larger than a dimension LC1 of the semiconductor chip CHP1, the upper part of the semiconductor chip CHP1 is configured not to be partially covered with the resin MR in the cross-section of the gas (air) flow direction. A dimension LP of the projected part of the partial die IPU from the upper die UM can be adjusted by a spacer SPC disposed in the root of the partial die IPU.

Here, in a region clamped by the upper surface SUR(CHP) of the semiconductor chip CHP1 and the partial die IPU disposed in the upper die UM, an elastic film LAF is compressed in the thickness direction so that its thickness is reduced. On the other hand, in the vicinity of the first region contacting the semiconductor chip CHP1, since the elastic film LAF is not compressed, the thickness of the elastic film. LAF becomes larger than a region clamped by the upper surface SUR(CHP) of the semiconductor chip CHP1 and the upper die UM.

In this case, the upper surface SUR(MR) of the resin MR is lower than the upper surface SUR(CHP) of the semiconductor chip CHP1 in the cross-section of the gas (air) flow direction, and there is a possibility of causing a problem that the gas (air) flow is disturbed in the upstream side of the semiconductor chip CHP1.

Hence, in the thirteenth embodiment, a device is applied to prevent the gas (air) flow from being disturbed in the upstream side of the semiconductor chip CHP1. Specifically, although the upper surface SUR(MR1) of the region MR is lower than the upper surface SUR(CHP) of the semiconductor chip CHP1 in the vicinity of the first region contacting the semiconductor chip CHP1, a device is applied in which the upper surface SUR(MR2) of the region MR is higher than the upper surface SUR(MR2) of the semiconductor chip CHP1 in the second region more apart from the semiconductor chip CHP1 than the first region. That is, by projectedly disposing the partial die IPU from the upper die UM by the dimension LP, the elastic film LAF is compressed by the top end of the partial die IPU and the surface SUR(CHP) of the semiconductor chip CHP1 so as to clamp the semiconductor chip CHP1. At this time, since the top end dimension LR1 of the partial die IPU is larger than the dimension LC1 of the semiconductor chip CHP1, although the upper surface SUR (MR1) of the resin MR is lower than the upper surface SUR (CHP) of the semiconductor chip CHP1 depending on the thickness dimension of the elastic film LAF in the vicinity of the first region contacting the semiconductor chip CHP1, the upper surface SUR(MR2) of the resin MR can be made higher than the upper surface SUR(CHP) of the semiconductor chip CHP1 in the second region more apart from the semiconductor chip CHP1 than the first region in accordance with a setting of the projected dimension LP of the partial die IPU.

FIG. 44 shows a schematic illustration of the air flow direction in which the gas (air) flow in the vicinity of the flow sensor thus manufactured is studied by analytical fluid analysis shown in FIG. 42. As shown in FIG. 44, since a major gas (air) flow flowing from a negative Y direction can be prevented from directly colliding against the side surface of the semiconductor chip CHP1 by the flow sensor of the thirteenth embodiment, it is understood that even if the upper part of the semiconductor chip CHP1 is not partially covered with the resin MR, disturbance of the air flow can be prevented.

Further, from the result of FIG. 43, it is desirable that a ratio of the height dimension H1 from the upper surface SUR (CHP) of the semiconductor chip CHP1 to the upper surface SUR(MR2) of the resin MR to the dimension L1 of the exposed semiconductor chip CHP1 satisfies $0 < H1/L1 \leq 1.5$ in the cross-section of the air flow direction.

Here, if the dimension LR1 of the top end of the partial die IPU is made equal to the dimension LC1 of the semiconductor chip CHP1, it is believed that the upper surface of the resin MR can be made higher than the upper surface SUR(CHP) of the semiconductor chip CHP1 from the top end of the semiconductor chip CHP1. In other words, it is believed that the upper surface SUR(MR1) of the resin MR can be prevented from becoming lower than the upper surface SUR(CHP) of the semiconductor chip CHP1 also in the first region contacting the semiconductor chip CHP1.

However, in the actual manufacturing process, variations occur in accuracy of mounting the semiconductor chip CHP1 on the lead frame, and further, variations also occur in the dimension itself of the lead frame as well as the semiconductor chip CHP1. For this reason, even if the dimension LR1 of the top end of the partial die IPU is made equal to the dimension LC1 of the semiconductor chip CHP1, upon clamping, it is difficult to align the dimension LR1 of the top end of the partial die IPU with the dimension LC1 of the semiconductor chip CHP1 without variations.

For this reason, in the thirteenth embodiment, though the upper surface SUR(MR1) of the resin MR becomes lower than the upper surface SUR(CHP) of the semiconductor chip CHP1 in the first region contacting the semiconductor chip CHP1, the upper surface SUR(MR2) of the resin MR is made higher than the upper surface SUR(CHP) of the semiconductor chip CHP1 in the second region more apart from the semiconductor chip CHP1 than the first region in consideration of occurrence of variations as described above.

Note that, while the flow sensor having one-chip structure has been described in the thirteenth embodiment, the technological idea of the present invention is not limited to this, and can be also applied to a flow sensor having a two-chip structure provided with a first semiconductor chip mounting the flow sensing unit FDU and a second semiconductor chip mounting a control circuit unit. Further, in the upper surface of the resin MR separated from the upper surface SUR(MR1) of the resin MR having a lower height than the upper surface of the semiconductor chip CHP1, a height of at least a part of the upper surface of the resin MR may be larger than that of the upper surface SUR(CHP) of the semiconductor chip CHP1.

Further, to improve adhesion properties between the semiconductor chip CHP1 and the resin MR, for example, a polyimide film is formed on the side surface of the semiconductor chip CHP1, and this polyimide film and the resin MR may come into contact each other at the side surface of the semiconductor chip CHP1. At this time, the polyimide film may be formed on the whole side surface of the semiconductor chip CHP1.

Fourteenth Embodiment

In a fourteenth embodiment, an example will be described in which a height of resin MR (sealing body) is higher than a surface of a semiconductor chip CHP1 including a flow sensing unit FDU in a cross-section of a direction parallel to an air flow (second A feature) and a frame body having an opening is mounted on the semiconductor chip CHP1.

Figure 46:
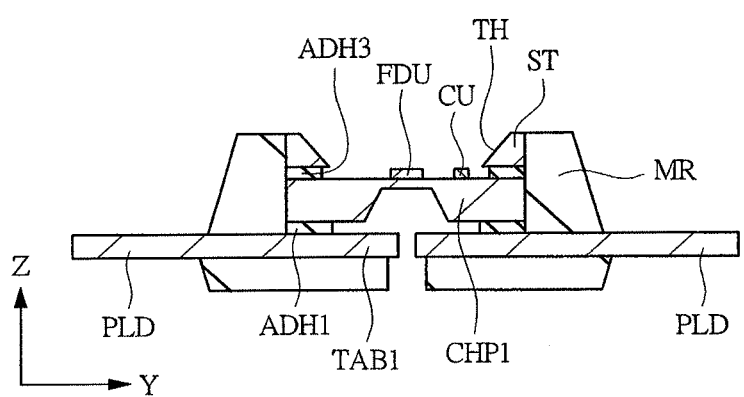
FIG. 46 is a cross-sectional view showing structure of the flow sensor studied by the present inventors.

For example, as a package structure in which another semiconductor chip is stacked further on the upper part of the semiconductor chip CHP1 through the adhesive ADH and is sealed with the resin, there is a technology disclosed in Japanese Patent Application Laid-Open Publication No. 2000-31309 (Patent Document 5). This technology has a structure in which another semiconductor chip is mounted on the semiconductor chip through the adhesive, and by the application of this structure, as shown in FIG. 46, a flow sensor may be assumed in which, in the cross-section of the gas (air) flow direction, a structure having a plate ST composed of a silicon material of the same material as that of the semiconductor chip CHP1 provided with a through-hole TH is bonded on the semiconductor chip CHP1 formed with the flow sensing unit FDU by an adhesive ADH3, and is sealed with the resin. According to this flow sensor, since the plate ST composed of the silicon material is used having the through-hole TH provided therein, a problem of the difficulty to open the through-hole TH in the silicon material that is a brittle material and a problem of the difficulty to handle the plate ST that tends to generate cracks when the thickness of the plate ST of the silicon mater is small are assumed.

Figure 47A:
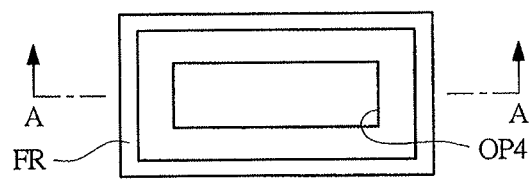
Figure 47B:
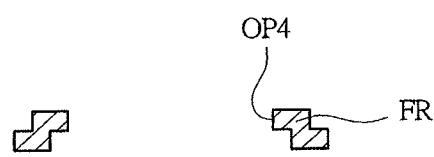

Therefore, the fourteenth embodiment has a feature that a frame body FR is used by replacing the plate ST of the silicon material. FIGS. 47A and 47B are views showing a configuration of the frame body FR. Specifically, FIG. 47A is a plan view showing the configuration of the frame body FR, and FIG. 47B is a cross-sectional view taken along the line A-A of FIG. 47A. As shown in FIGS. 47A and 47B, the frame body FR is in a frame shape having a step, and has an opening OP4 formed in the center of the frame. This frame body FR, for example, is formed by injecting the resin into a die for molding by an injection molding and a transfer molding method using a thermoplastic resin such as PBT, ABS, PC, and nylon and a thermoset resin such as epoxy resin and phenol resin and by press working using a metal material such as an iron alloy, an aluminum alloy or a copper alloy.

Figure 48:
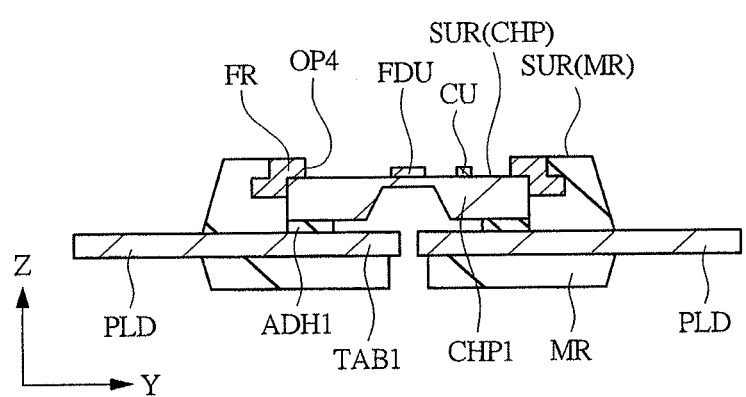
FIG. 48 is a view showing a cross-sectional structure of a flow sensor according to a fourteenth embodiment in a cross-section of a gas flow direction.

FIG. 48 is a view showing a cross-sectional structure of the flow sensor of the fourteenth embodiment in the cross-section of the gas (air) flow direction. Specifically, the flow sensor of the fourteenth embodiment has the semiconductor chip CHP1 bonded on the chip mounting unit TAB1 by the adhesive ADH1, and is configured such that the upper surface SUR (CHP) of this semiconductor chip CHP1 is formed with the flow sensing unit FDU, and the semiconductor chip CHP1 formed with this flow sensing unit FDU is mounting the frame body FR having an opening OP4, and the side surface of the semiconductor chip CHP1 and the side surface of the frame body FR are sealed with the resin MR. At this time, the upper surface SUR(MR) of the resin MR is disposed at a position higher than the upper surface SUR(CHP) of the semiconductor chip CHP1. The flow sensing unit FDU is exposed from the opening OP4 formed in the frame body FR. Further, the frame body FR is fixed to the semiconductor chip CHP1 by a step formed in the frame body FR. In other words, the frame body FR has a wall parallel to the side surface of the semiconductor chip CHP1, and by adhering this wall to the semiconductor chip CHP1, the frame body FR can be disposed to the semiconductor chip CHP1 being aligned with the semiconductor chip CHP1. At this time, the frame body FR may be adhered to or may not be adhered to the semiconductor chip CHP1. Particularly, when the frame body FR is adhered to the semiconductor chip CHP1, the effect of preventing the displacement of the frame body FR can be obtained.

According to the flow sensor thus configured in the fourteenth embodiment, since the upper surface SUR(MR) of the resin MR is higher than the upper surface SUR(CHP) of the semiconductor chip CHP1, the gas (air) flow smoothly flows without disturbance. Hence, the gas (air) flow above the flow sensing unit FDU is stabilized, and as a result, flow detection accuracy at the flow sensing unit FDU can be improved.

Figure 49:
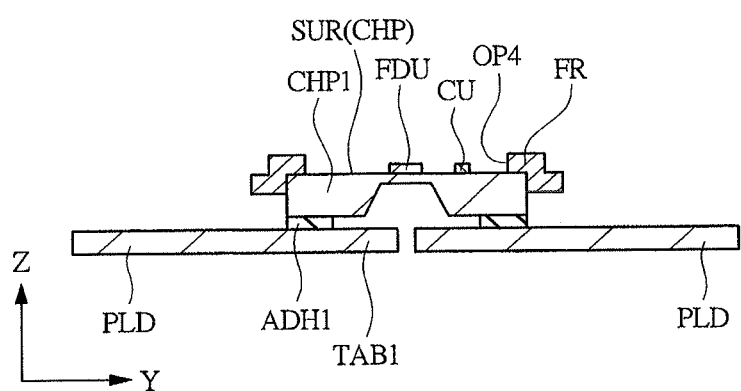
FIG. 49 is a cross-sectional view showing a process of manufacturing the flow sensor of the fourteenth embodiment.

Subsequently, a sealing process for manufacturing the flow sensor of the fourteenth embodiment will be described. First, as shown in FIG. 49, the frame body FR is disposed on the semiconductor chip CHP1 that is mounted on the chip mounting unit TAB1 through the adhesive ADH1. At this time, the frame body FR is in a frame shape having the opening OP4, and the frame body FR is disposed on the semiconductor chip CHP1 so that the flow sensing unit FDU is exposed from the opening OP4 formed in the frame body FR. Here, the frame body FR may be adhered to or may not be adhered to the semiconductor chip CHP1.

Figure 50:
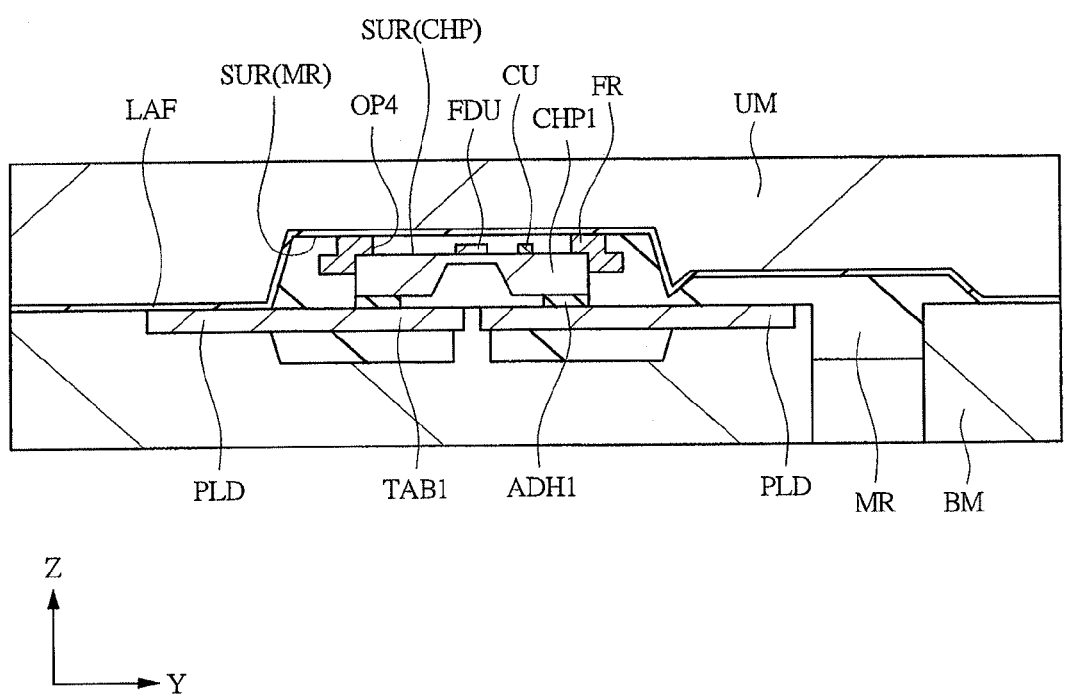
FIG. 50 is a view explaining a sealing process for sealing the flow sensor as a process continued from FIG. 49 according to the fourteenth embodiment.

Next, as shown in FIG. 50, the semiconductor chip CHP1 mounted on a chip mounting unit TAB1 is clamped by a mold, and the resin is filled into a space of the mold. Specifically, as shown in FIG. 50, the semiconductor chip CHP1 mounted on the chip mounting unit TAB1 is clamped by an upper die UM and a lower die BM. Here, the upper die UM is pasted with an elastic film LAF, and the upper die UM is pressed down to the frame body FR provided on the semiconductor chip CHP1 through the elastic film LAF. For this reason, the semiconductor chip CHP1 is pressed down through the elastic film LAF, and therefore, mounting variations of the semiconductor chip CHP1 can be absorbed by the thickness change of the elastic film LAF. Further, since the upper die UM is pressed down by the frame body FR provided on the semiconductor chip CHP1 through the elastic film LAF, the flow sensing unit FDU exposed from the opening OP4 of the frame body FR can be protected from the upper die UM. After that, the sealing process is executed by injecting the resin MR into the space formed inside the mold. Therefore, the flow sensor can be manufactured in a state in which the upper surface SUR (MR) of the resin MR is higher than the upper surface SUR (CHP) of the semiconductor chip CHP1.

Here, since the resin MR is injected into a space inside the die in a state in which the frame body FR is adhered to the semiconductor chip CHP1 by clamping the frame body FR formed with the opening OP4 in its center and the semiconductor chip CHP1 by the upper die UM and the lower die BM, the resin can be prevented from flowing from a gap between the frame body FR formed with the opening OP4 in its center and the semiconductor chip CHP1 to the flow sensing unit FDU even in a structure in which the frame body FR formed with the opening OP4 in its center is not adhered to the semiconductor chip CHP1. However, to facilitate the handling in a process before the sealing process, the frame body FR formed with the opening OP4 in its center and the semiconductor chip CHP1 may be adhered to each other.

Thus, also in the flow sensor of the fourteenth embodiment, the height of the resin MR (sealing body) becomes higher than the height of the surface of the semiconductor chip CHP1 including the flow sensing unit FDU in the cross-section of the direction parallel to the air flow (the second A feature). Hence, according to the flow sensor of the fourteenth embodiment, the gas (air) flow above the flow sensing unit FDU is stabilized, and as a result, flow detection accuracy at the flow sensing unit FDU can be improved. Further, from a viewpoint of stabilizing the gas (air) flow and improving flow detection accuracy at the flow sensing unit FDU, it is desirable that a ratio of the height dimension H1 from the upper surface SUR(CHP) of the semiconductor chip CHP1 to the upper surface SUR(MR) of the resin MR to the dimension L1 of the exposed semiconductor chip CHP1 satisfies $0 < H1/L1 \leq 1.5$ in the cross-section of the gas (air) flow direction. In the fourteenth embodiment, while the flow sensor having one-chip structure has been described as an example, the technological idea of the present invention is not limited to this, and for example, can be also applied to a flow sensor having a two-chip structure provided with a first semiconductor chip mounting a flow sensing unit FDU and a second semiconductor chip mounting a control unit.

Fifteenth Embodiment

In the third embodiment to the sixth embodiment, for example, as shown in FIGS. 13, 20, 23 and 29, a shape has been described in which the height of the upper surface SUR (MR) of the resin MR at the upstream side (positive Y direction) of the gas (air) flow direction with respect to the semiconductor chip CHP1 is almost equal to the height of the upper surface SUR(MR) of the resin MR of the downstream side (negative Y direction) of the air (gas) flow direction.

In such a case, for example, there is a possibility that water, dusts, and the like stay on the upper surface SUR(CHP) of the semiconductor chip CHP1 that is lower in height than the upper surface SUR(MR) of the resin MR, and are not discharged. For this reason, in the fifteenth embodiment, the cross-section of the gas (air) flow direction in a shape such that at least a part of the height of the upper surface SUR(LR) of the resin MR at the downstream side of the gas (air) flow direction with respect to the semiconductor chip CHP1 is lower than the height of the upper surface SUR(UR) of the resin MR of the upstream side of the gas (air) flow direction. Therefore, water, dusts, and so forth can be prevented from staying on the upper surface SUR(CHP) of the semiconductor chip CHP1.

Figure 51A:
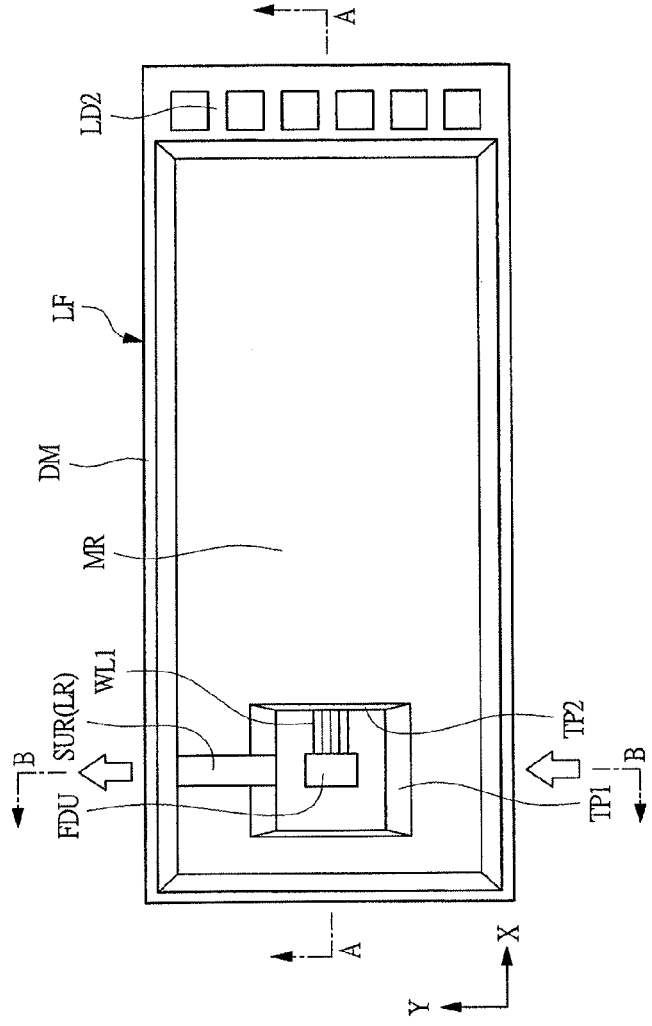
FIG. 51A is a plan view showing amounting configuration after sealing the flow sensor according to a fifteenth embodiment.
Figure 51B:
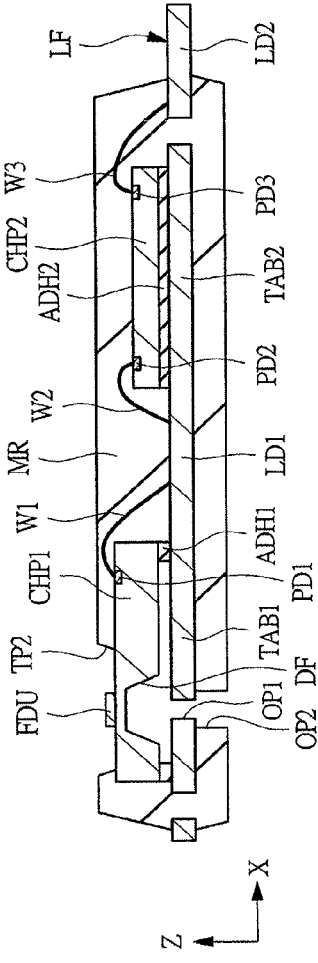
FIG. 51B is a cross-sectional view taken along the line A-A of FIG. 51A.
Figure 51C:
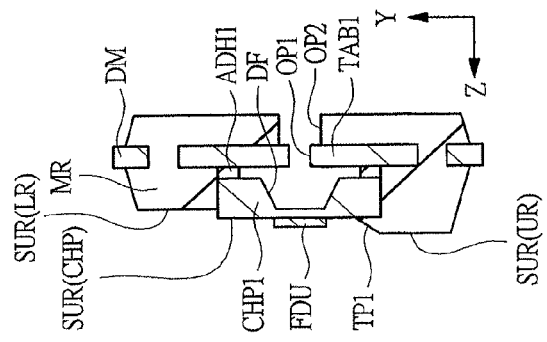
FIG. 51C is a cross-sectional view taken along the line B-B of FIG. 51A.

FIGS. 51A to 51C are views showing the configuration of the flow sensor of the fifteenth embodiment. Specifically, FIG. 51A is a plan view of the flow sensor of the fifteenth embodiment seen from above. FIG. 51B is a cross-sectional view taken along the line A-A of FIG. 51A, and FIG. 51C is a cross-section taken along the line B-B of FIG. 51A.

In FIG. 51C showing the cross-section of the gas (air) flow direction, with respect to the semiconductor chip CHP1, at least a part of the height of the upper surface SUR(LR) of the resin MR of the downstream side is lower than the height of the upper surface SUR(UR) of the resin MR at the upstream side. Particularly, in FIG. 51C, the height of the upper surface SUR(LR) of the resin MR of the downstream side is lower than the height of the upper surface SUR(CHP) of the semiconductor chip CHP1. When such a shape is used, water and dusts that have come from the upstream of the gas (air) flow direction do not stay on the semiconductor chip CHP1 and can be discharged to the downstream side through the upper surface SUR(LR) of the resin MR of the downstream side that is lower in height than the upper surface SUR(UR) of the resin MR of the upstream side.

Here, the upper surface SUR(LR) of the resin MR of the downstream side that is lower than the height of the upper surface SUR(UR) of the resin MR of the upstream side, for example, as shown in FIGS. 52A to 52C, may be lower over the dimension equal to a width of the X direction of the exposed semiconductor chip CHP1; or, as shown in FIGS. 53A to 53C, may be wider in the width of the X direction of the upper surface SUR(LR) of the resin MR low in height of the downstream side in a region close to the semiconductor chip CHP1, and may become narrower in the width of the X direction of the upper surface SUR(LR) of the resin MR being low in height of the downstream side toward the downstream of the gas (air) flow direction.

Further, as shown in FIG. 54, when loop heights of wires (gold wires) W1 are made high, the resin surface can be made partially high to seal the loop parts of these wires W1.

Figure 55:
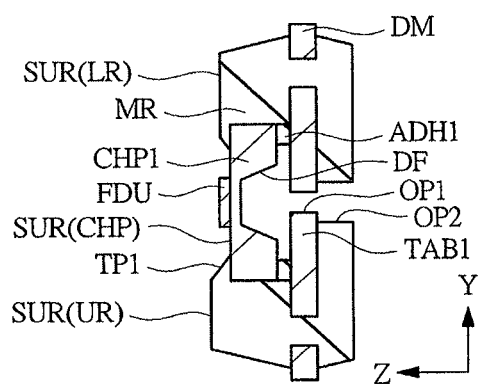
FIG. 55 is a cross-sectional view showing a mounting configuration after sealing the flow sensor according to the fifteenth embodiment.
Figure 56:
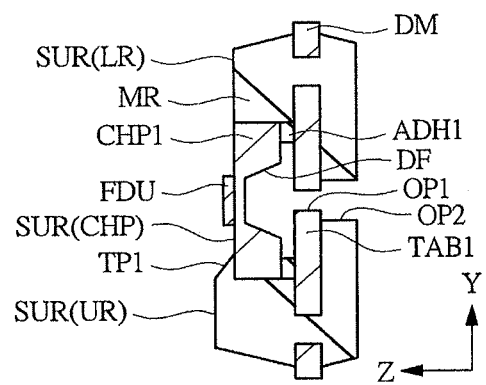
FIG. 56 is a cross-sectional view showing a mounting configuration after sealing the flow sensor according to the fifteenth embodiment.

Next, FIG. 55 is a view showing the cross-section of the gas (air) flow direction in the flow sensor of the fifteenth embodiment. As shown in FIG. 55, to discharge water, dust, and so forth that have come from the upstream side, at least a part of the height of the upper surface SUR(LR) of the resin MR of the downstream side with respect to the semiconductor chip CHP1 may be lower than the height of the upper surface SUR(UR) of the resin MR of the upstream side. Specifically, for example, as shown in FIG. 55, the height of the upper surface SUR(LR) of the resin MR of the downstream side can be configured to be lower than the height of the upper surface SUR(UR) of the resin MR of the upstream side and higher than the upper surface SUR(CHP) of the semiconductor chip CHP1. For example, as shown in FIG. 56, the height of the upper surface SUR(LR) of the resin MR of the downstream side can be also lower than the height of the upper surface SUR(LR) of the resin MR of the upstream side and can be the same height as the semiconductor chip CHP1.

Figure 57A:
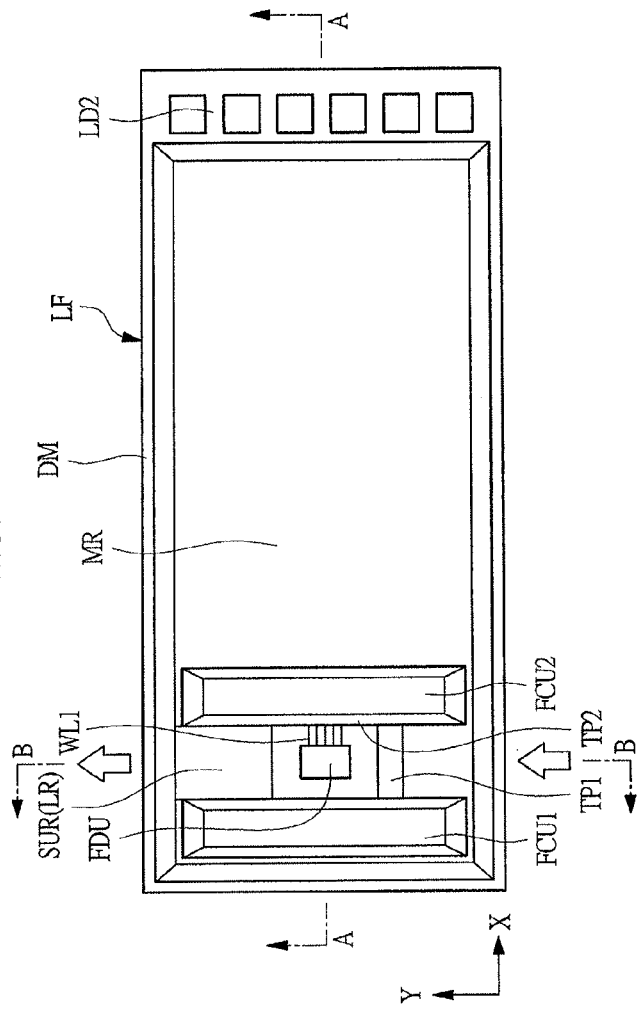
FIG. 57A is a plan view showing a mounting configuration after sealing the flow sensor according to the fifteenth embodiment.
Figure 57B:
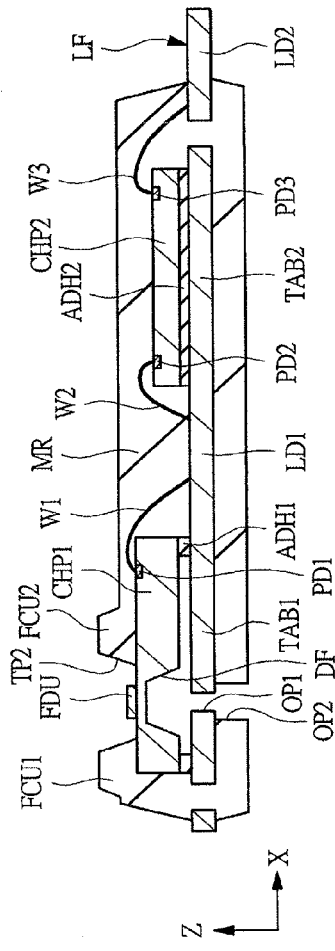
FIG. 57B is a cross-sectional view taken along the line A-A of FIG. 57A.
Figure 57C:
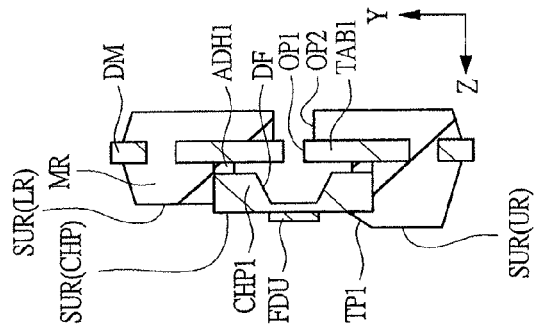
FIG. 57C is a cross-sectional view taken along the line B-B of FIG. 57A.

Further, as shown in FIGS. 57A to 57C, also in a structure in which an air current control unit FCU1 and an air current control unit FCU2 are formed so as to clamp the exposed flow sensing unit FDU, in the cross-section of the gas (air) flow direction, at least a part of the height of the upper surface SUR(LR) of the resin MR of the downstream side with respect to the semiconductor chip CHP1 can be also made lower than the height of the upper surface SUR(UR) of the resin MR of the upstream side.

Figure 58C:
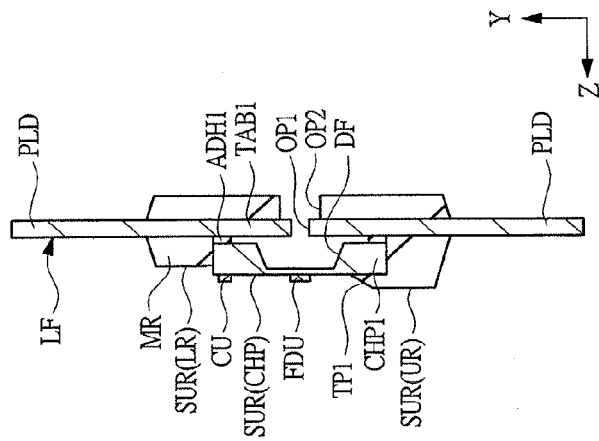
FIG. 58C is a cross-sectional view taken along the line B-B of FIG. 58A.
Figure 58A:
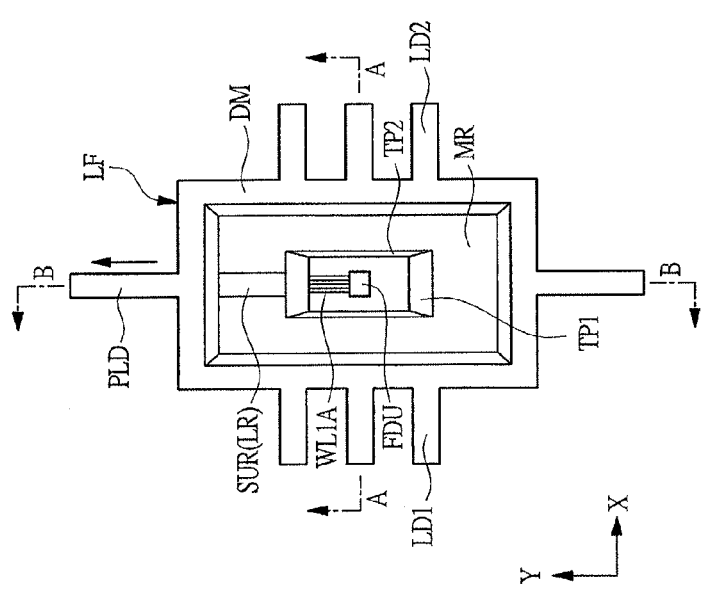
FIG. 58A is a plan view showing a mounting configuration after sealing the flow sensor according to the fifteenth embodiment.
Figure 58B:
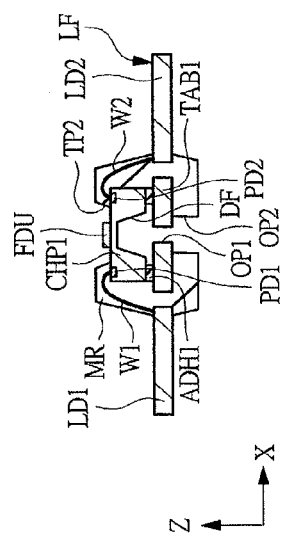
FIG. 58B is a cross-sectional view taken along the line A-A of FIG. 58A.

Further, as shown in FIGS. 58A to 58C, also as for the flow sensor of a one-chip structure, in the cross-section (FIG. 58C) of the gas (air) flow direction, at least a part of the height of the upper surface SUR(LR) of the resin MR of the downstream side with respect to the semiconductor chip CHP1 can be lower than the height of the upper surface SUR(UR) of the resin MR of the upstream side.

Also in FIGS. 58A to 58C, the height of the upper surface SUR(LR) of the resin MR of the downstream side can be also lower than the height of the upper surface SUR(UR) of the resin MR of the upstream side and higher than the upper surface SUR(CHP) of the semiconductor chip CHP1, and the height of the upper surface SUR(LR) of the resin MR of the downstream side can be also lower than the height of the upper surface SUR(UR) of the resin MR of the upstream side and can be the same height of the upper surface SUR(CHP) of the semiconductor chip CHP1.

Further, also in the flow sensor of the one-chip structure, the upper surface SUR(LR) of the resin MR of the downstream side that is lower than the height of the upper surface SUR(UR) of the resin MR of the upstream side, for example, may be low over the dimension equal to the width in the X direction of the exposed semiconductor chip CHP1, and in the region close to the semiconductor chip CHP1, the width of the X direction of the upper surface SUR(LR) of the resin MR low in height of the downstream side may be wide, and the width in the X direction of the upper surface SUR(LR) of the resin MR low in height of the downstream side may become narrower toward the downstream of the gas (air) flow direction. Further, also as for the flow sensor of the one-chip structure, when loop heights of wires W1 is high, the resin surface can be made partially high so as to seal the loop parts of these wires W1.

Here, it is preferable that at least a part of the portion covered with the resin MR is formed with a polyimide film at the upper surface or the side surface of the semiconductor chip CHP1 shown in FIGS. 51A to 58C.

Figure 59:
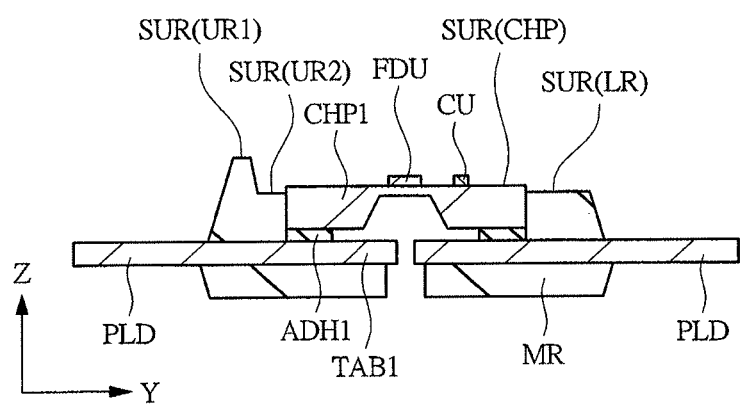
FIG. 59 is a cross-sectional view showing a mounting configuration after sealing the flow sensor according to the fifteenth embodiment.

Further, as shown in FIG. 59, although the upper surface SUR(UR2) of the resin MR of the upstream side is lower than the upper surface SUR(CHP) of the semiconductor chip CHP1 in the vicinity of the first region contacting the semiconductor chip CHP1, also in a structure in which the upper surface SUR(UR1) of the resin MR of the upstream side is higher than the upper surface SUR(MR2) of the semiconductor chip CHP1 in the second region more apart from the semiconductor chip CHP1 than the first region, at least a part of the height of the upper surface SUR(LR) of the resin MR of the downstream side can be lower than the height of the upper surface SUR(UR1) of the resin MR of the upstream side. At this time, for example, the upper surface SUR(CHP) and the side surface of the semiconductor chip CHP1 are formed with a polyimide film, and this polyimide film being brought into contact with the resin MR at the side surface of the semiconductor chip CHP1 is desirable from the view point of preventing the peeling of the resin MR from the semiconductor chip CHP1. The polyimide film may be formed on a part of the side surface or the whole side surface of the semiconductor chip CHP1.

Also in the flow sensor of the fifteenth embodiment, from the view point of stabilizing the gas (air) flow and improving flow detection accuracy at the flow sensing unit FDU, it is desirable that a ratio of the height dimension H1 from the upper surface SUR(CHP) of the semiconductor chip CHP1 to the upper surface SUR(UR) (SUR(UR1)) of the resin MR to the dimension L1 of the exposed semiconductor chip CHP1 satisfies $0<H1/L1\leq 1.5$ in the cross-section of the gas (air) flow direction.

Further, when a back-flow of air due to pulsation of an engine is detected by using the flow sensor of the fifteenth embodiment, to discharge from the upstream side water and dusts that flow back from downstream to upstream, the upper surface SUR(UR) of the resin MR of the upstream side (negative Y direction side) of the air flow can be made lower than the resin surfaces of other regions similarly to the upper surface SUR(LR) of the resin MR disposed on the downstream side of the air flow.

FIGS. 60A to 60C are views showing a configuration example in which the upper surface SUR(UR) of the resin MR of the upstream side (negative Y direction side) of the air flow is made lower than the resin surfaces of other regions similarly to the upper surface SUR(LR) of the resin MR disposed on the downstream side of the air flow. When the height of the upper surface SUR(UR) of the resin MR of the upstream side and the height of the upper surface SUR(LR) of the resin MR of the downstream side are made low in this manner, the heights of these surfaces can be shaped to be lower than the upper heights of other resins MR in the direction orthogonal to the gas (air) flow direction. At this time, even when the height of the upper surface SUR(UR) of the resin MR of the upstream side and the height of the upper surface SUR(LR) of the resin MR of the downstream side may be higher or lower or the same height as the height of the upper surface SUR(CHP) of the semiconductor chip CHP1, and the shape may have a height lower than the height of other resin surfaces at least in the direction orthogonal to the gas (air) flow direction.

In the foregoing, the invention made by the inventors of the present invention has been concretely described based on the embodiments. However, it is needless to say that the present invention is not limited to the foregoing embodiments and various modifications and alterations can be made within the scope of the present invention.

Further, although the flow sensors described in the above-described embodiments have been examples of forming the polyimide film PIQ on the surface (upper surface) of the semiconductor chip CHP1 formed with the flow sensing unit FDU, the technological idea of the present invention is not limited to only this, and the film such as an oxide silicon film ($SiO_2$) using a silicon nitride film ($Si_3N_4$), a polysilicon film, a TEOS ($Si(OC_2H_5)_4$), etc. as a raw material may be formed on the surface of the semiconductor chip CHP1. In this manner, adhesion properties between the resin MR and the semiconductor chip CHP1 are improved so that the peeling can be prevented.

Note that, the silicon nitride film, the polysilicon film, and the silicon oxide film can be formed by a chemical vapor epitaxial method (growth), chemical vapor deposition, or chemical deposition such as a plasma CVD method, a vacuum CVD method, and a normal-pressure CVD method, or physical vapor deposition. These films formed on the semiconductor chip CHP1 can prevent increase of the silicon oxide film formed on silicon (Si) configuring the semiconductor chip CHP1, and can improve adhesion properties between the resin MR and the semiconductor chip CHP1. Note that, these films may be formed on at least a part of the semiconductor chip CHP1 covered with the resin MR.

In addition, in the above-described embodiments, an example of mounting the semiconductor chip CHP on the lead frame LF through the adhesive ADH has been described, but the present invention is not limited to only this, and the semiconductor chip CHP can be also mounted on the lead frame LF through a paste material such as silver paste. Further, a structure is inserted between the semiconductor chip CHP and the lead frame LF, so that the semiconductor chip CHP, the lead frame LF, and the structure can be joined together by using the adhesive ADH or the paste material, and component parts such as a capacitor can be also mounted on the lead frame LF.

Note that, the above-described structure can be formed by filling up the resin into the die for molding by injection molding and the transfer molding by using, for example, a thermoplastic resin such as PBT, ABS, PC, and nylon and a thermoset resin such as epoxy resin and phenol resin. Further, the structure can be pressed by using a metal material such as iron alloy, aluminum alloy or copper alloy, and can be also formed by a glass material.

While the flow sensors described in the above-described embodiments are devices for measuring the flow rate, a specific type of the gas is not limited, and can be widely used to devices for measuring the flow rate of an optional gas such as air, LP gas, carbon dioxide gas ($CO_2$ gas), and chlorofluorocarbon.

Further, in the above described embodiments, though the flow sensor for measuring the flow rate of the gas has been described, the technological idea of the present invention is not limited to this, and can be widely applied to the semiconductor device also that perform resin-sealing in a state in which a part of the semiconductor element such as a temperature sensor is exposed.

INDUSTRIAL APPLICABILITY

The present invention, for example, can be widely applied to the manufacturers who manufacture the semiconductor devices such as the flow sensor.

EXPLANATION OF REFERENCES

1 CPU
2 INPUT CIRCUIT
3 OUTPUT CIRCUIT
4 MEMORY
ADH ADHESIVE
ADH1 ADHESIVE
ADH2 ADHESIVE
ADH3 ADHESIVE
BM LOWER DIE
BMP BUMP ELECTRODE
BR1 DOWNSTREAM RESISTANCE THERMOMETER
BR2 DOWNSTREAM RESISTANCE THERMOMETER
CAP COVER
CHP1 SEMICONDUCTOR CHIP
CHP2 SEMICONDUCTOR CHIP
CU CONTROL UNIT
DF DIAPHRAGM
DIT GROOVE
DM DAM BAR
FCU1 AIR CURRENT CONTROL UNIT
FCU2 AIR CURRENT CONTROL UNIT
FDU FLOW SENSING UNIT
FR FRAME BODY
FS1 FLOW SENSOR
FS2 FLOW SENSOR
FS3 FLOW SENSOR
FS4 FLOW SENSOR
FS5 FLOW SENSOR
FS6 FLOW SENSOR
FS7 FLOW SENSOR
FS8 FLOW SENSOR
FSM1 FLOW SENSOR MODULE
FSM2 FLOW SENSOR MODULE
FSM3 FLOW SENSOR MODULE
FSP FLOW SENSOR
HCB HEATER CONTROL BRIDGE
HL HOLE
HR HEATING RESISTOR
H1 DIMENSION
IP1 PARTIAL DIE
IP2 PARTIAL DIE
IPU PARTIAL DIE
LAF ELASTIC FILM
LC1 DIMENSION
LD1 LEAD
LD2 LEAD
LF LEAD FRAME
LP DIMENSION
LR1 DIMENSION
L1 DIMENSION

MR RESIN
MR2 RESIN
OP1 OPENING
OP2 OPENING
OP3 OPENING
OP4 OPENING
PAS GAS FLOW PATH UNIT
PD1 PAD
PD2 PAD
PD3 PAD
PJ PLUNGER
PLD PROJECTED LEAD
POT POTTING RESIN
PS POWER SUPPLY
Q AIR FLOW
R1 RESISTOR
R2 RESISTOR
RS RESISTOR
R4 RESISTOR
SP2 SPACE
SPC SPACER
SUR(CHP) UPPER SURFACE
SUR(LR) UPPER SURFACE
SUR(MR) UPPER SURFACE
SUR(MR1) UPPER SURFACE
SUR(MR2) UPPER SURFACE
SUR(UR) UPPER SURFACE
SUR(UR1) UPPER SURFACE
SUR(UR2) UPPER SURFACE
TAB1 CHIP MOUNTING UNIT
TAB2 CHIP MOUNTING UNIT
TE1 TERMINAL
TE1 TERMINAL
TE3 TERMINAL
TH THROUGH HOLE
TP1 TAPERED SHAPE
TP2 TAPERED SHAPE
TR FLOW PATH
Tr TRANSISTOR
TSB TEMPERATURE SENSOR BRIDGE
UM UPPER DIE
UR1 UPSTREAM RESISTANCE THERMOMETER
UR2 UPSTREAM RESISTANCE THERMOMETER
Vref1 REFERENCE VOLTAGE
Vref2 REFERENCE VOLTAGE
W1 WIRE
W2 WIRE
W3 WIRE
WB WIRING BOARD
WL1 WIRING
WL1A WIRING
WL1B WIRING
WL2 WIRING
WL3 WIRING
WS1 SIDE SURFACE
WS2 SIDE SURFACE

The invention claimed is:

1. A flow sensor comprising:
(a) a chip mounting unit mounting a semiconductor chip; and
(b) the semiconductor chip mounted on the chip mounting unit, the semiconductor chip having a flow sensing unit formed in a thin plate part;
wherein the semiconductor chip is a flow sensor in which at least a part of the chip mounting unit is sealed with a sealing body containing resin in a state that the flow sensing unit is exposed, and
wherein, in an optional cross-section parallel to a travelling direction of a gas that flows above the exposed flow sensing unit, an upper surface of the resin is lower than an upper surface of the semiconductor chip in a first region in which the sealing body is in contact with the semiconductor chip, and, the upper surface of the resin is higher than the upper surface of the semiconductor chip in at least a part of a second region that is more apart from the semiconductor chip than the first region.

2. The flow sensor according to claim 1,
wherein another semiconductor chip different from the semiconductor chip is further sealed with the sealing body.

3. The flow sensor according to claim 1,
wherein a pair of air current control units clamping the exposed flow sensing unit and having a long shape in a direction parallel to the travelling direction of the gas that flows above the flow sensing unit is integrally formed with the sealing body.

4. The flow sensor according to claim 1,
wherein, when a height dimension from the upper surface of the semiconductor chip to the upper surface of the resin in the second region is defined as H1 and a dimension of the semiconductor chip exposed from the resin is defined as L1 in the direction parallel to the travelling direction of the gas of the semiconductor chip, a relationship of $0 < H1/L1 \leq 1.5$ is satisfied.

5. The flow sensor according to claim 1,
wherein, in the optical cross-section parallel to the travelling direction of the gas that flows above the exposed flow sensing unit, the sealing body does not cover the upper surface of the first semiconductor chip.

6. A flow sensor comprising:
(a) a chip mounting unit mounting a semiconductor chip; and
(b) the semiconductor chip mounted on the chip mounting unit, the semiconductor chip having a flow sensing unit formed in a thin plate part;
wherein the semiconductor chip is a flow sensor in which at least a part of the chip mounting unit is sealed with a sealing body containing resin in a state that the flow sensing unit is exposed, and
wherein, in an optional cross-section parallel to a travelling direction of a gas that flows above the exposed flow sensing unit, an upper part of the semiconductor chip is partially covered with the resin.

7. The flow sensor according to claim 6,
wherein another semiconductor chip different from the semiconductor chip is further sealed with the sealing body.

8. The flow sensor according to claim 6,
wherein a pair of air current control units clamping the exposed flow sensing unit and having a long shape in a direction parallel to the travelling direction of the gas that flows above the flow sensing unit is integrally formed with the sealing body.

* * * * *